United States Patent
Dmitriev et al.

(10) Patent No.: US 9,798,249 B2
(45) Date of Patent: Oct. 24, 2017

(54) METHOD AND APPARATUS FOR COMPENSATING AT LEAST ONE DEFECT OF AN OPTICAL SYSTEM

(71) Applicants: Carl Zeiss SMS Ltd., Karmiel (IL); Carl Zeiss SMT GmbH, Oberkochen (DE)

(72) Inventors: Vladimir Dmitriev, Karmiel (IL); Ingo Saenger, Heidenheim (DE); Frank Schlesener, Oberkochen (DE); Markus Mengel, Heidenheim (DE); Johannes Ruoff, Aalen (DE)

(73) Assignees: Carl Zeiss SMT GmbH, Oberkochen (DE); Carl Zeiss SMS Ltd., Karmiel (IL)

( * ) Notice: Subject to any disclaimer, the term of this patent is extended or adjusted under 35 U.S.C. 154(b) by 381 days.

(21) Appl. No.: 14/457,712

(22) Filed: Aug. 12, 2014

(65) Prior Publication Data
US 2014/0347646 A1 Nov. 27, 2014

Related U.S. Application Data

(63) Continuation of application No. PCT/EP2012/052909, filed on Feb. 21, 2012.

(51) Int. Cl.
| | | |
|---|---|---|
| G03B 27/54 | (2006.01) | |
| G03F 7/20 | (2006.01) | |
| G02B 27/00 | (2006.01) | |
| G02B 5/30 | (2006.01) | |
| G01M 11/02 | (2006.01) | |

(52) U.S. Cl.
CPC ..... *G03F 7/70591* (2013.01); *G01M 11/0242* (2013.01); *G02B 5/3091* (2013.01); *G02B 27/0043* (2013.01); *G03F 7/70191* (2013.01); *G03F 7/70308* (2013.01); *G03F 7/70566* (2013.01)

(58) Field of Classification Search
CPC .................. G03F 7/70341; G03F 7/70191
USPC ........ 355/30, 52, 53, 55, 67; 359/256, 239.2
See application file for complete search history.

(56) References Cited

U.S. PATENT DOCUMENTS

| | | |
|---|---|---|
| 6,191,880 B1 | 2/2001 | Schuster |
| 6,728,021 B1 | 4/2004 | Kohl et al. |
| 7,245,353 B2 | 7/2007 | Mulkens et al. |

(Continued)

FOREIGN PATENT DOCUMENTS

| | | |
|---|---|---|
| DE | 10 2004 011 733 A1 | 9/2005 |
| EP | 1 879 071 A2 | 1/2008 |

(Continued)

OTHER PUBLICATIONS

M. Totzeck et al., "Polarization influence on imaging", J. Microlith., Microlab., Microsyst., 4(3) (Jul.-Sep. 2005), p. 031108-1-031108-15.

(Continued)

*Primary Examiner* — Hung Henry Nguyen
(74) *Attorney, Agent, or Firm* — Fish & Richardson P.C.

(57) ABSTRACT

The invention relates to a method for compensating at least one defect of an optical system which includes introducing an arrangement of local persistent modifications in at least one optical element of the optical system, which does not have pattern elements on one of its optical surfaces, so that the at least one defect is at least partially compensated.

20 Claims, 44 Drawing Sheets

(56) References Cited

U.S. PATENT DOCUMENTS

| | | | |
|---|---|---|---|
| 7,345,741 B2 | 3/2008 | Shiozawa et al. | |
| 7,397,531 B2* | 7/2008 | Franken | G03F 7/70891 355/30 |
| 7,982,969 B2 | 7/2011 | Schuster et al. | |
| 8,059,337 B2 | 11/2011 | Ono | |
| 2004/0227914 A1* | 11/2004 | Hara | G03F 7/70891 355/30 |
| 2004/0262500 A1 | 12/2004 | Mengel | |
| 2007/0279613 A1 | 12/2007 | Fiolka et al. | |
| 2008/0062397 A1 | 3/2008 | Nam et al. | |
| 2011/0205516 A1* | 8/2011 | De Vries | G03B 27/54 355/67 |
| 2012/0081686 A1 | 4/2012 | Kohl | |
| 2012/0300195 A1* | 11/2012 | Hartjes | G03F 7/70091 356/124 |

FOREIGN PATENT DOCUMENTS

| | | |
|---|---|---|
| JP | 2006-019702 | 1/2006 |
| JP | 2006-114904 | 4/2006 |
| JP | 2009-540586 | 11/2009 |
| WO | WO 2008/126828 | 10/2008 |
| WO | WO 2009/100862 A1 | 8/2009 |

OTHER PUBLICATIONS

U. Neukirch et al., "Laser-induced birefringence in fused silica from polarized lasers," *Proc. of SPIE 5754*, Optical Microlithography XVII, edited by B.W. Smith, (2005), pp. 638-645.

W. de Boeij et al., "Enabling the 45 nm node by hyper-NA polarized lithography", edited by D.G. Flagello, *Proc. of SPIE 6154*, Optical Microlithography XIX, (2006), pp. 61540B-1-61540B-11.

A. Serebriakow et al., "Correction of the phase retardation caused by intrinsic birefringence in deep UV lithography," *Proc. SPIE 5754*, Optical Microlithography XVIII, 1780 (May 12, 2005).

Martynas Beresna et al., "Polarization sensitive elements fabricated by femtosecond laser nanostructuring of glass," Optical Materials Express, vol. 1, No. 4, Jul. 29, 2011, p. 783.

Gottlieb et al., "Correcting ACLV by mask substrate tuning," Microlithography World, Pennwell Corporation, US, vol. 16, No. 1, Feb. 1, 2007., pp. 10-12.

International Search Report for corresponding PCT Appl No. PCT/EP2012/052909, dated Nov. 28, 2012.

Japanese office action, with translation thereof, for corresponding JP Appl. No. 2014-558009, dated Dec. 8, 2015.

* cited by examiner

Fig. 13
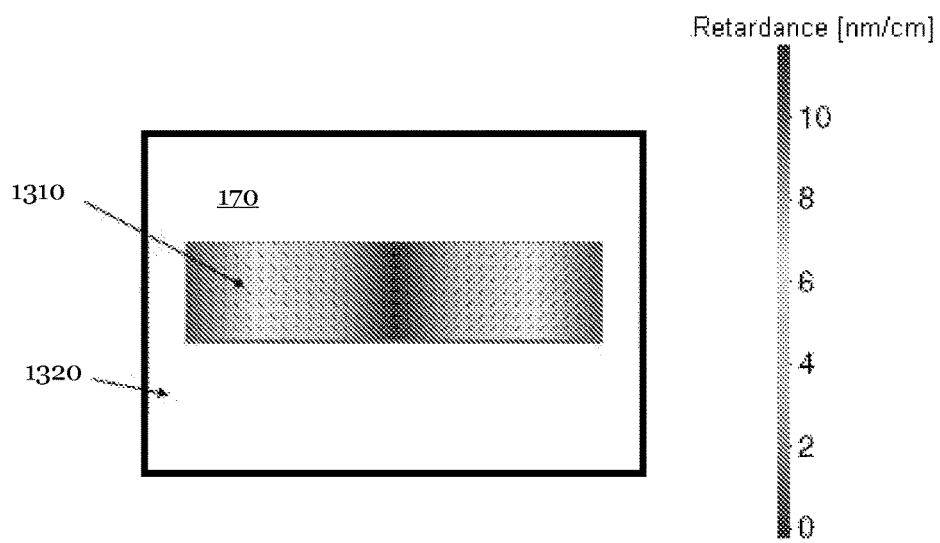
Fig. 14a
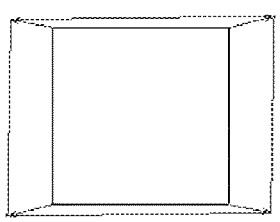
Fig. 14b
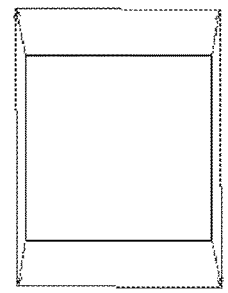
Fig. 15a1
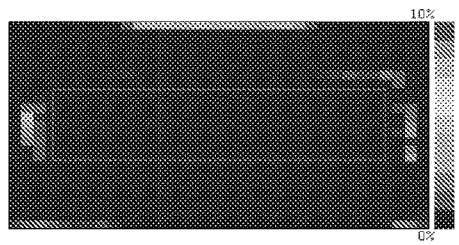
Fig. 15b1
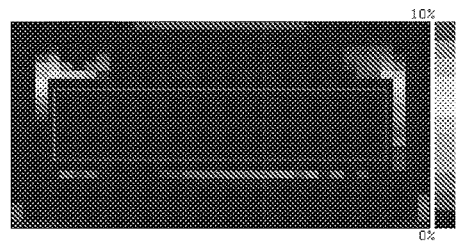

Fig. 15a2
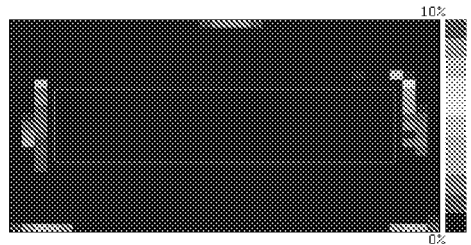
Fig. 15b2
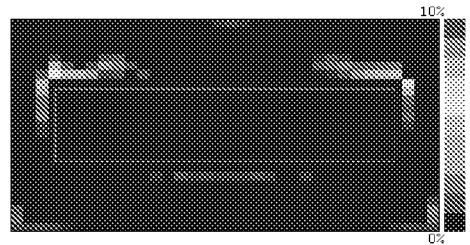
Fig. 15a3
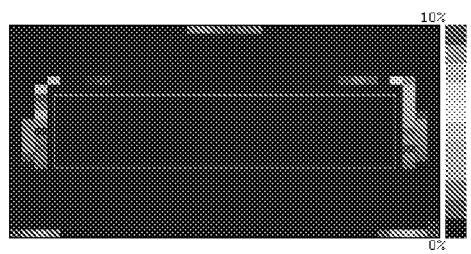
Fig. 15b3
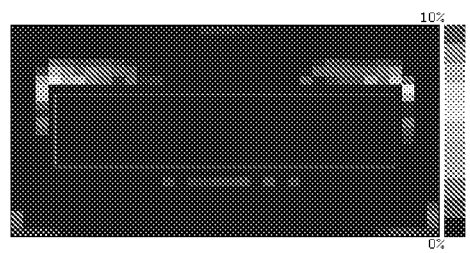
Fig. 15a4
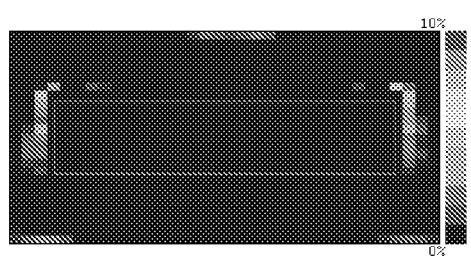
Fig. 15b4
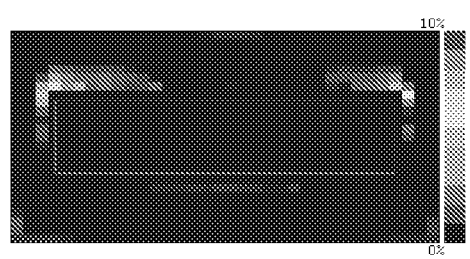
Fig. 15a5
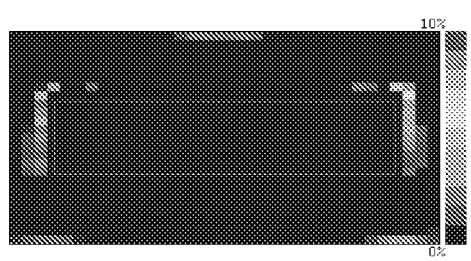
Fig. 15b5
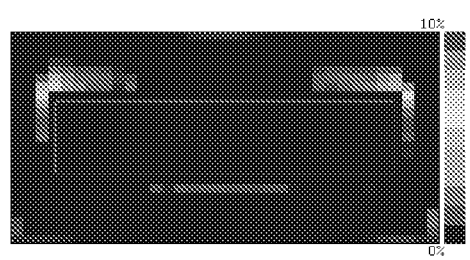

Fig. 16a0
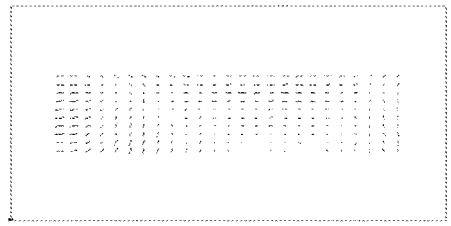
Fig. 16b0
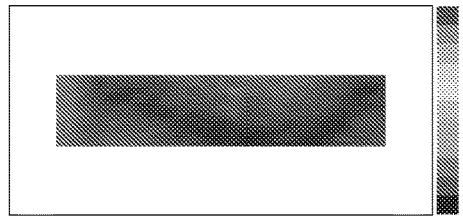
Fig. 16a1
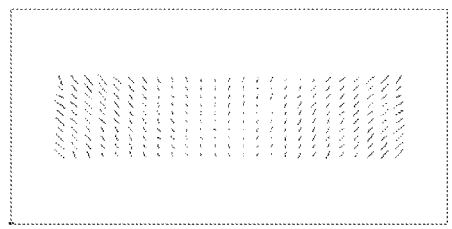
Fig. 16b1
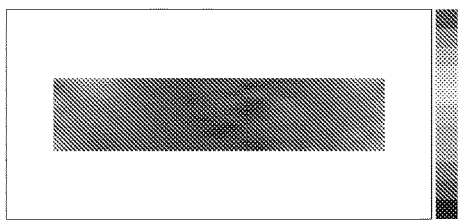
Fig. 16a2
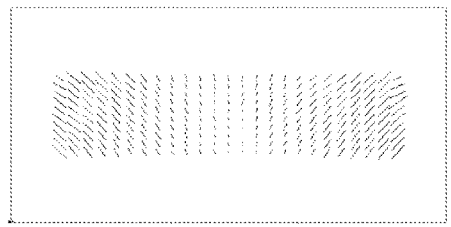
Fig. 16b2
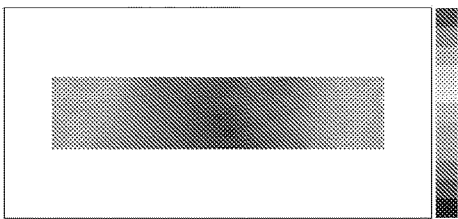
Fig. 16a3
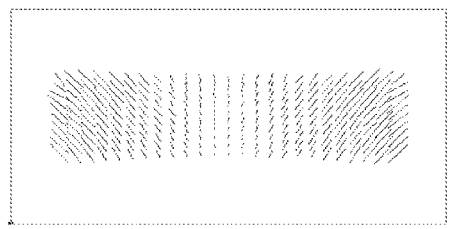
Fig. 16b3
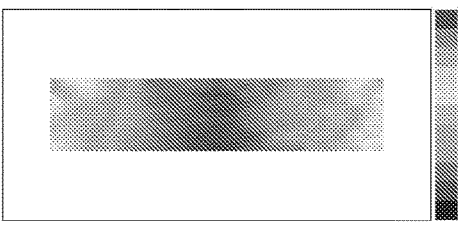

Fig. 16a4
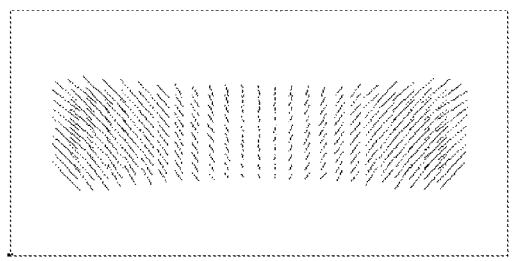
Fig. 16b4
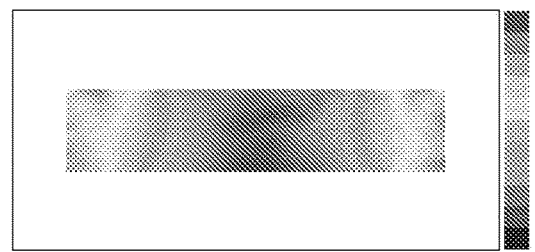
Fig. 16a5
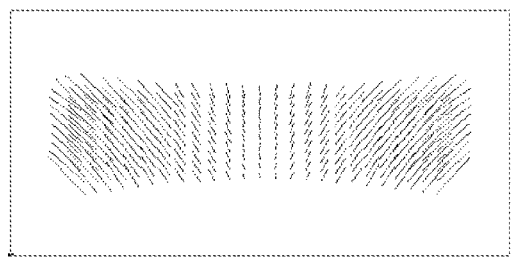
Fig. 16b5
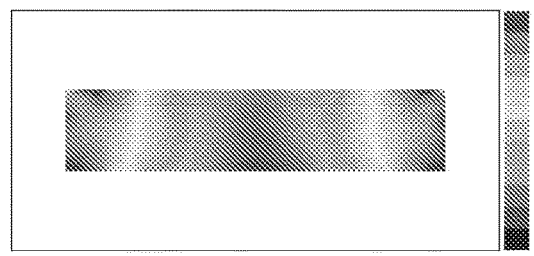

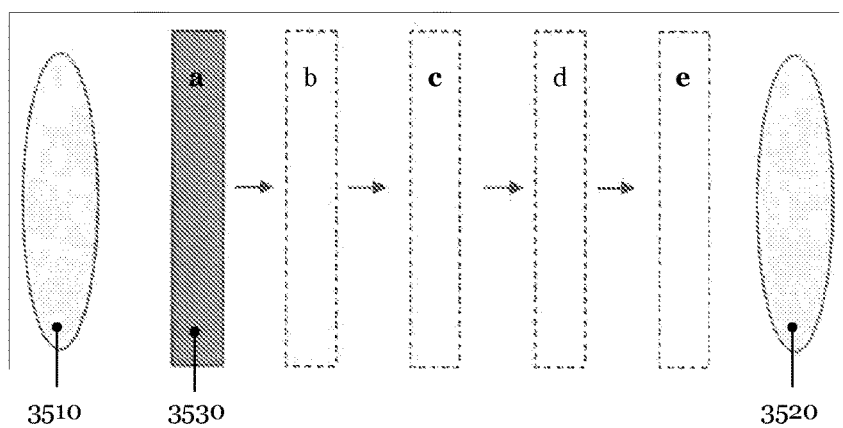
Fig. 35
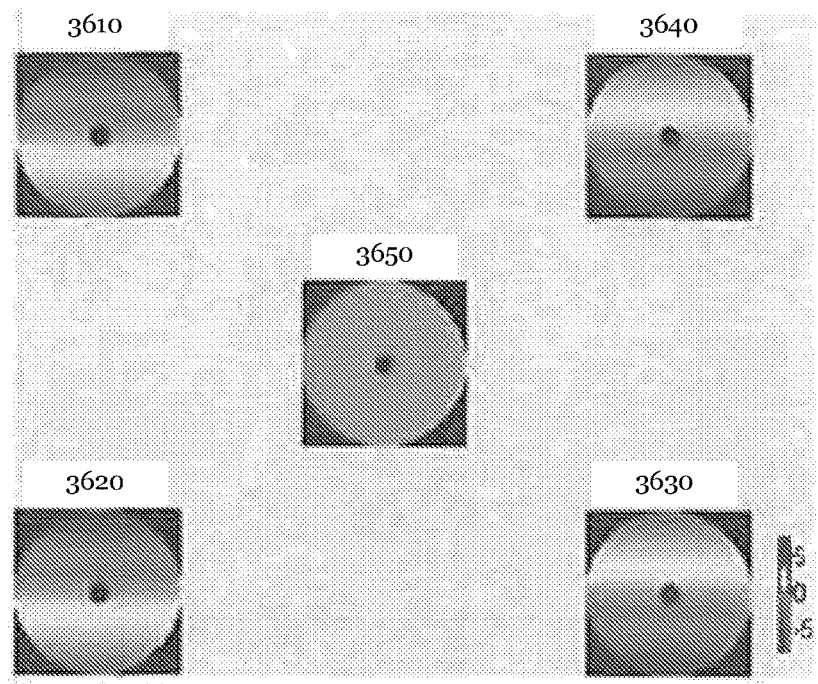
Fig. 36a (at position a of Fig. 35)

Fig. 36b (at position c of Fig. 35)
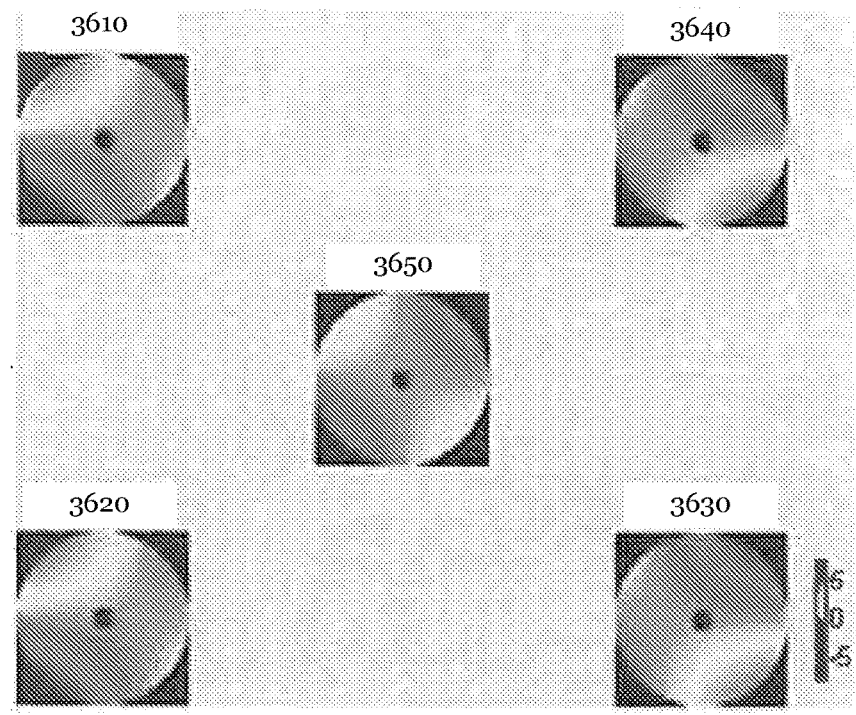
Fig. 36c (at position e of Fig. 35)
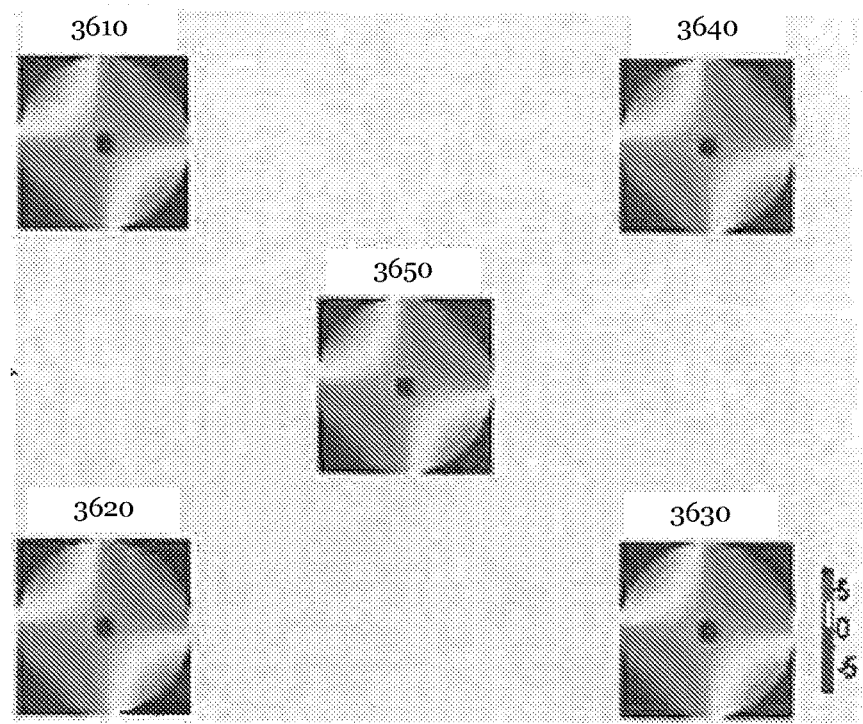

Fig. 37
a:
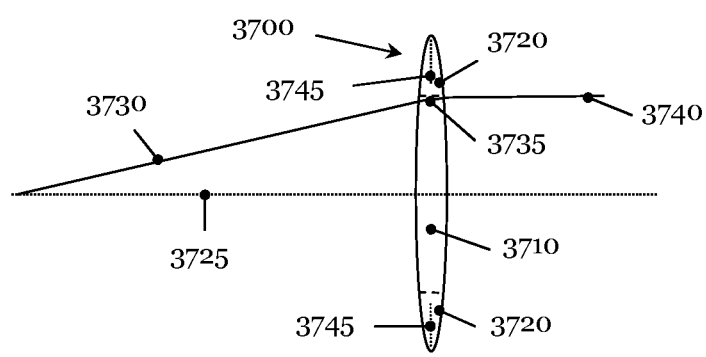
b:
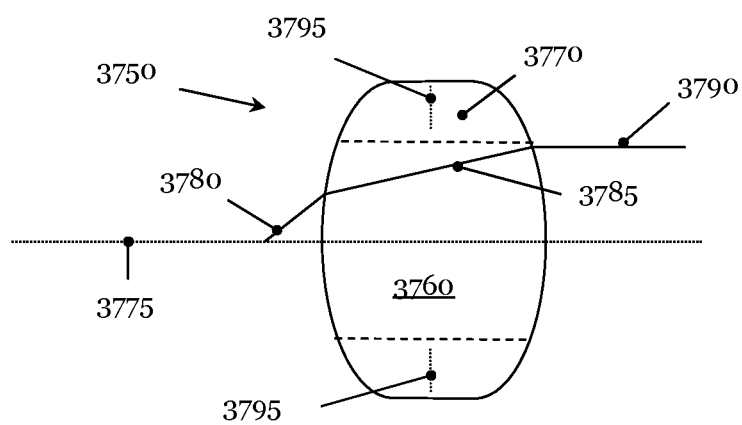

Fig. 38
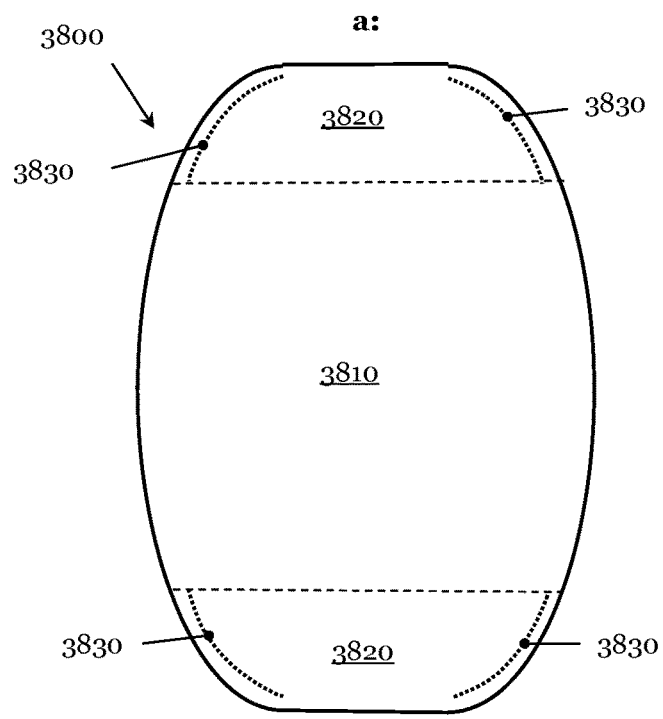
a:
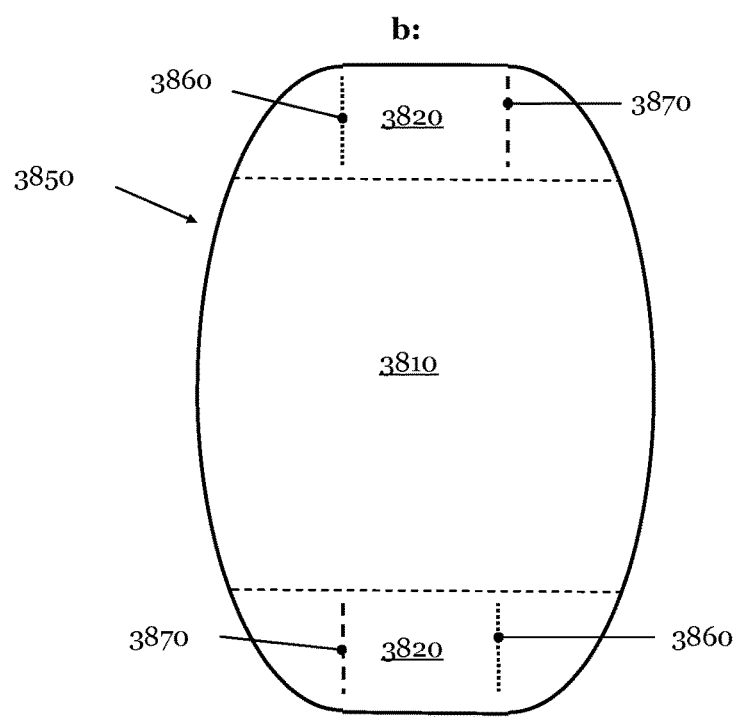
b:

METHOD AND APPARATUS FOR COMPENSATING AT LEAST ONE DEFECT OF AN OPTICAL SYSTEM

CROSS-REFERENCE TO RELATED APPLICATIONS

The present application is a continuation of, and claims benefit under 35 USC 120 to, international application PCT/EP2012/052909, filed Feb. 21, 2012. The entire disclosure of this application is incorporated by reference herein.

1. Field of the Invention

The present invention relates to the field of compensating at least one defect of an optical system.

2. Background of the Invention

Optical systems have to fulfil increasing demands with respect to their performance. For example, the size of optical elements of telescopes steadily increases in order to collect the limited number of photon originating from far distant objects. On the other hand, microscopes have for example to resolve objects having almost no contrast to its surrounding. Moreover, it is requested that projection systems resolve smaller and smaller structures.

In the following, the increasing demand on optical systems is exemplified for projection systems, in particular photolithographic projection exposure systems. These systems are used for the production of micostructured components, in particular semiconducting components such as integrated circuits (ICs). A projection exposure system comprises as essential components a light source, an illumination device or illumination system and a projection objective or projection system. In modern projection exposure systems which use electromagnetic radiation of the deep ultraviolet (DUV) wavelength range, the light source is typically an excimer laser system (a krypton fluoride (KrF) excimer laser for the 248 nm, an argon fluoride (ArF) laser for the 193 nm, and a fluoride ($F_2$) excimer laser for the 157 nm wavelength). The illumination system illuminates a photolithographic mask or simply a mask arranged behind the illumination device with the laser light. The projection objective collects the light transmitted through the mask and focuses it onto a photosensitive layer or photoresist dispensed on a substrate. The substrate is often a semiconducting wafer, as for example a silicon wafer.

As a result of the constantly increasing integration density in the semiconductor industry, photolithographic projection exposure systems have to project smaller and smaller structures onto the photoresist. In order to fulfil this demand, the exposure wavelength of projection exposure system has been shifted from the near ultraviolet across the mean ultraviolet into the deep ultraviolet region of the electromagnetic spectrum. Presently, a wavelength of 193 nm is typically used for the exposure of the photoresist on wafers. As a consequence, the manufacturing of projection exposure systems with increasing resolution is becoming more and more complex, and thus more and more expensive as well. In the future, projection exposure systems will use significantly smaller wavelengths in the extreme ultraviolet (EUV) wavelength range of the electromagnetic spectrum (e.g. in the range of 10 nm-15 nm).

M. Totzeck et al. discuss in the article "Polarization influence on imaging", J. Microlith., Microlab., Microsyst., 4(3) (July-September 2005), p. 031108-1-031108-15) that the polarization of the illumination beam has a significant influence on the resolution of a projection exposure system. Reflection and transmission at interfaces and coatings and/or birefringence are the most important sources for polarization changes in optical components of projection exposure systems.

The U.S. Pat. No. 6,191,880 B1 discloses an optical arrangement which converts an entering light beam into an exiting light having a total cross section of light which is linearly polarized essentially in the radial direction by rotation of the polarization of the exiting light beam. It is important that the arrangement is mounted behind the asymmetric or polarizing component elements of the projection exposure system.

The patent application DE 2004 011 733 A1 describes a transmission filter apparatus which also comprises a polarization filter arrangement.

The US 2004/0262500 A1 discloses an apparatus for the spatially resolved polarimetric examination of an imaging beam pencil generated by an associated radiation source using two photoelastic modulators and a polarization element in the beam path.

The EP 1 879 071 A2 discloses an illumination optic for a microlithographic projection exposure system which allows to rapidly switch between two different polarization settings.

The article "Laser-induced birefringence in fused silica from polarized lasers" by U. Neukirch et al., in Optical Microlithography XVII, edited by B. W. Smith, Proc. of SPIE Vol. 5754 (2005), pp. 638-645, describes that polarized DUV laser pulses may induce birefringence in fused silica often used as substrate material of photolithographic masks.

The authors W. de Boeij et al. report in the publication "Enabling the 45 nm node by hyper-NA polarized lithography", in Optical Microlithography XIX, edited by D. G. Flagello, Proc. of SPIE Vol. 6154 (2006), pp. 61540B-1-61540B-11, that polarized illumination leads to an increase of the contrast and the exposure latitude in the photoresist.

The article "Correction of the phase retardation caused by intrinsic birefringence in deep UV lithography" by A. Serebriakow et al., in Proc. of SPIE, vol. 5754 discusses that the intrinsic birefringence of calcium difluoride ($CaF_2$) and barium difluoride ($BaF_2$) leads to a loss of contrast when using these components in 157 nm lithography systems. The authors propose to use optical components of these materials having different crystal axis orientations and rotating these components relative to each other in order to compensate the intrinsic birefringence of these materials.

The patent application WO 2009/100862 A1 discloses a microlithographic projection exposure system which has at least one polarization state altering device in front of the illumination device to control the polarization of the electromagnetic radiation entering the illumination device.

In photolithography often a polarized illumination is used in order to increase the contrast properties of pattern elements on a mask. Thus, in addition to enabling a certain resolution, projection exposure systems have also to fulfill a predetermined intensity in preferred state (IPS) specification. For this purpose, it is important to control local polarization and intensity changes induced by optical components of the projection exposure system. Further, the control should also not consume optimization degrees of freedom used for other purposes, as for example to compensate aberrations of the optical components forming the projection exposure system. In this context it has to be noted that according to the definition within this application neither the photolithographic mask nor the wafer or the photoresist arranged on the wafer are part of the projection exposure system.

The considerations exemplified above for projection systems, or more precisely for photolithographic projection exposure systems similarly also apply to telescope and/or microscope systems.

It is therefore one object of the present invention to provide a method and an apparatus for compensating at least one defect of an optical system and to avoid at least a portion of the problems of the prior art.

3. SUMMARY OF THE INVENTION

According to a first aspect of the invention, a method for compensating at least one defect of an optical system comprises introducing at least one arrangement of local persistent modifications in at least one optical element of the optical system, which does not have pattern elements on one of its optical surfaces, so that the at least one defect is at least partially compensated.

The inventive method is based on the knowledge how to locally act on an optical element in order to locally generate a predetermined variation of a specific optical property of the optical element. Therefore, an optical property of the optical element can be modified in a controlled manner by the introduction of one or more arrangements of local persistent modifications in the optical element. The modified property of the optical element at least partially compensates the defect of the optical element as well as of further optical elements of the optical system. The process can be controlled so that the introduction of an arrangement of local persistent modifications does not cause any other defect in the optical element.

In a further aspect, the at least one defect comprises a local polarization variation of at least one optical element of the optical system and/or a local intensity variation of at least one optical element of the optical system.

The defined method can compensate several types of defects of optical elements of an optical system. Two exemplary defects are indicated in the previous paragraph.

In still a further aspect, at least one local reflection variation and/or at least one local transmission variation of an optical beam on at least one interface and/or at least one coating of the at least one optical element cause the local intensity variation of an optical beam in the optical system.

These defects may occur due to limited perfection of the manufacturing process of the optical element. They can impair during the operation of the optical element, for example as a consequence of an interaction of an optical beam having a high intensity with particles existent in the ambient air. Moreover, in the example that the optical system is a photolithographic projection exposure system, a local variation of the polarization of an optical beam and/or a variation of the intensity across the optical beam results in a reduction of the intensity in preferred state (IPS) which diminishes the image contrast that feature elements of a photolithographic mask generate in the photoresist on a wafer.

In yet another aspect, a birefringence distribution of the at least one optical element cause the local polarization variation of the optical beam in the optical system.

The defined method can compensate polarization variations arising from various causes. Furthermore, it can compensate polarization variations resulting from an intrinsic or material birefringence of the material of the optical element.

Moreover, the described method allows compensating birefringence induced by strain or stress in the optical element which is caused by the mounting of the optical element. Additionally, the defined method enables the compensation of defects having their origin in gravity forces and/or the aging of the optical element during its life-time.

Another aspect further comprises the step of introducing the at least one arrangement of local persistent modifications in an optically relevant area of the at least one optical element and/or introducing the at least one arrangement of local persistent modifications outside the optically relevant area of the at least one optical element, and/or introducing at least one first arrangement of local persistent modifications in the optically relevant area of the at least one optical element and at least one second arrangement of local persistent modifications outside the optically relevant area of the at least one optical element.

The term optically relevant area means the area of the optical element onto which photons of an optical beam impinge on the optical element. All other area portions of the optical element are the area outside the optically relevant area of the optical element.

By introducing local persistent modifications in an area of an optical element which is not relevant for the transmission and/or for the reflection of the optical beam, the compensation of the defect disturbs the optical path of the beam to a minimum extent.

In another aspect, at least one first optical element comprises at least one first defect and/or at least one second optical element of the optical system comprises the at least one first defect and/or the at least one optical first element comprises at least one second defect and/or the at least one second optical element comprises the at least one second defect.

The above defined method allows the compensation of several types of defects. The arrangement(s) of local persistent modifications can be specifically designed for the respective defect type. By introducing two or more arrangements of local persistent modifications having specific characteristics in a single optical element of the optical system two or more different defect types of the optical system can simultaneously be compensated.

It is an advantage of the defined method that one or several arrangements of local persistent modifications of a single optical element can compensate several types of defects distributed across several optical elements of the overall optical system. Moreover, it is not necessary to insert an additional optical element in the optical system which would increase the complexity of the optical systems.

An arrangement of local persistent modifications can be used to induce a local strain distribution in the optically relevant area of the optical element. Thereby, it is possible to compensate a dependence of the polarization variation across the optically relevant area of the optical element. Moreover, another arrangement of local persistent modifications can be applied to induce a local scattering distribution in the optically relevant area of the optical element. This allows correcting an intensity variation of an optical beam across the optically relevant area of the optical element.

Moreover, as the defined method does not involve two or more optical elements and in particular a change of their relative orientation to compensate the defect, the defined method does not consume optimization degrees of freedom reserved for the compensation of other defects, such as aberrations of the optical elements forming the optical system.

The application of the defined method does not restrict the wavelength of the optical system. The defined method can be applied to optical elements of optical systems covering a wide spectral range reaching from the infrared (IR), across the visible range to the ultraviolet (UV) range of the electromagnetic spectrum.

In another aspect, the step of introducing the at least one arrangement of local persistent modifications comprises applying ultra-short laser pulses to the at least one optical element.

The ultra-short laser pulses preferably comprise laser pulses having pulse lengths in the picosecond and/or femtosecond range. Preferably, laser systems operating in the visible wavelength range or close to it are used for the generation of the ultra-short laser pulses.

Another aspect further comprises the step of applying ultra-short laser pulses with at least one first parameter set to compensate the local polarization variation and/or with at least one second parameter set to compensate the local intensity variation.

After the compensation of the intensity variations of the optical system it may be necessary to increase the optical intensity of a beam passing through the optical system in order to compensate losses occurring as a consequence of the local intensity compensation.

Still a further aspect comprises the step of applying ultra-short laser pulses with the at least one first parameter set to the optically relevant area of the at least one optical element and/or outside the optically relevant area of the at least one optical element and/or applying ultra-short laser pulses with the at least one second parameter set to the optically relevant area of the at least one optical element.

According to another aspect, ultra-short laser pulses having the at least one first parameter set induce a local change of a density of a material of the at least one optical element and/or wherein ultra-short laser pulses having the at least one second parameter set induce a structural change of the material of the at least one optical element.

In a further aspect, ultra-short laser pulses having the at least one first parameter set induce discontinuous local modifications of an area of the least one arrangement of local persistent modifications, wherein a local discontinuous modification is called a pixel, and wherein ultra-short laser pulses having the at least one second parameter set induce a continuous local modification of the area of the at least one arrangement of local persistent modifications.

In the context of this application, an arrangement of local persistent modifications comprises one or more local discontinuous modifications, called pixel(s), or a continuous local modification of the area of the respective arrangement of local persistent modifications or a combination of both kinds of modifications.

A further beneficial aspect comprises the step of selecting the at least one arrangement of local persistent modifications so that a strain induced by the at least one arrangement the local persistent modifications at least partially compensates the local polarization variation of the optical system.

According to a further aspect, the at least one arrangement of local persistent modifications is introduced in the optically relevant area and/or is introduced outside the optically relevant area and/or at least one first arrangement of local persistent modifications is introduced in the optically relevant area of the at least one optical element and at least one second arrangement of local persistent modifications is introduced outside the optically relevant area of the at least one optical element.

The strain distribution results in a local variation of the retardation of the optical beam caused by the strain. By carefully controlling the strain locally induced by the arrangement of local persistent modifications, a variation of the optical polarization is at least partially compensated.

The introduction of local persistent modifications in the area outside of the optically relevant area can also be precisely controlled and does therefore not result in local impairments of the optical properties of the material of the optical element. Additionally, in this case only far reaching strain effects are used for compensating polarization variations in the optically relevant area of the optical element; therefore a modification of other optical properties within the optically relevant area of the optical element can be excluded.

Another aspect further comprises the step of selecting the at least one arrangement of local persistent modifications so that a scattering induced by the at least one arrangement of local persistent modifications at least partially compensates the local intensity variation in the optical system. In a further aspect, the at least one arrangement of local persistent modifications is introduced in the optically relevant area.

A further beneficial aspect further comprises the step of selecting the at least one arrangement of local persistent modifications to simultaneously compensating the local polarization variation and the local intensity variation of the optical system.

Still another aspect further comprises the step of compensating at least one first defect of at least one first optical element and/or the at least one first defect of at least one second optical element of the optical system and/or the at least one second defect of the at least one second optical element of the optical system and/or the at least one second defect of the at least one first optical element with the at least one arrangement of local persistent modifications in the at least one first optical element.

Yet another aspect further comprises the step of determining the at least one arrangement of optical persistent modifications from an intensity variation measurement, a polarization measurement and/or a birefringence measurement of the at least one optical element and/or of an intensity variation measurement, a polarization measurement and/or a birefringence measurement of the optical system.

It is also possible to use the defined method to measure a variation the polarization and/or of the intensity caused by a single optical element. From the measured polarization and/or intensity variation at least one arrangement of local persistent modifications can be calculated which compensates the polarization and the intensity variation to a large extent. In a next step, the determined arrangement(s) of local persistent modifications are then introduced in the optically relevant area and/or in an area outside of the optically relevant area of the optical element. An optical system can be set-up which exclusively comprises individually compensated optical elements.

Alternatively, an optical system can be set-up having one optical element compensating the defect of the overall optical system, i.e. the defects available on one further, some further or all other optical elements of the optical system. It is also possible to use an approach between the two discussed alternatives, i.e. compensating a portion of the defect of the optical system with a first arrangement of local persistent modifications in a first optical element and compensating a second portion of the defect of the optical system with a second arrangement of local persistent modifications in a second optical element of the optical system.

Another aspect further comprises the step of introducing at least one first arrangement of local persistent modifications in at least one first layer and at least one second arrangement of local persistent modifications in at least one second layer of the at least one optical element.

Such an arrangement of the local persistent modifications in the optical element increases the flexibility in the introduction of the local persistent modifications. On the one hand, it conveniently allows introducing arrangement(s) of local persistent modifications for the correction or compensation of different defects. On the other hand, it enables to perform a predetermined significant modification of an optical property of the optical element without running the risk to damage the optical element with the ultra-short laser pulses.

According to still another aspect, the first layer and the second layer are arranged around a plane which is located in a centre between two opposite optical surfaces of the optical element.

This kind of arranging the local persistent modifications induces no or almost no bending forces in the optical element.

According to still another aspect local persistent modifications can be located around the symmetry plane of the optical element and even close to the surface of the optical element if they are located symmetrically to the geometric centre of the optical element. Or according to a further aspect, local persistent modifications can be arranged in a way that all bending forces are balanced or compensated to avoid a bending of the optical element.

In yet another aspect, the at least one arrangement of local persistent modifications comprises at least two different types of local persistent modifications.

In still a further aspect, ultra-short laser pulses having the at least one first parameter set introduce at least one first type of local persistent modifications in the at least one optical element and ultra-short laser pulses having the at least one second parameter set introduce at least one second type of local persistent modifications in the at least one optical element.

This feature allows a simultaneous correction or compensation of two different types of defects of the optical system in a single optical element of the optical system.

In yet another aspect, the following table introduces the range of laser beam parameters which is useful for the generation of the local persistent modifications influencing optical and mechanical properties of the material of the optical element.

TABLE 1

Numerical values of selected laser beam parameters
Overview

| Parameter | Numerical value | Unit |
|---|---|---|
| Pulse energy | 0.01-5 | µJ |
| Pulse length | 0.05-100 | ps |
| Repetition rate | 1-10 000 | kHz |
| Pulse density | 1 000-10 000 000 | $mm^{-2}$ |
| NA | 0.1-0.9 | |
| Wavelength | 350-1500 | nm |

In a further aspect, table 2 specifies a first set laser beam parameters (called Standard PW (process window)) which provides the capability of writing local persistent modifications for an effective control of the material strain of the optical element.

TABLE 2

Numerical values of selected laser beam parameters
for a Nd-YAG laser system for a standard process window
Std PW (standard process window)

| Parameter | Numerical value | Unit |
|---|---|---|
| Pulse energy | 0.45 | µJ |
| Pulse length | 8 | ps |
| Pulse density | 1 000-100 000 | $mm^{-2}$ |
| NA | 0.3 | |
| Wavelength | 532 | nm |

In still a further aspect, table 3 defines a second set of laser beam parameters (named Low Reg PW) for writing of persistent local modifications for an effective control of the material transmittance of the optical element without inducing significant strain in the material.

TABLE 3

Numerical values of selected laser beam parameters for a Nd-YAG
laser system for a low registration process window (Low Reg PW)
Low Reg PW (low registration process window)

| Parameter | Numerical value | Unit |
|---|---|---|
| Pulse energy | 0.32 | µJ |
| Pulse length | 8 | ps |
| Repetition rate | 50 000 | kHz |
| Pulse density | 5 000-500 000 | $mm^{-2}$ |
| NA | 0.3 | |
| Wavelength | 532 | nm |

Yet another aspect specifies in table 4 a third set of laser beam parameters (called Pixelless PW) for writing of persistent local modifications for a contraction of the material of the optical element without inducing a significant light attenuation and/or light scattering.

TABLE 4

Numerical values of selected laser beam parameters for a
Nd-YAG laser system for a material contraction (Pixelless PW)
Pixelless writing

| Parameter | Numerical value | Unit |
|---|---|---|
| Pulse energy | 0.o1-0.10 | µJ |
| Pulse length | 0.05 | ps |
| Pulse density | 5 000 000-100 000 000 000 | $mm^{-2}$ |
| NA | 0.3 | |
| Wavelength | 532 | nm |

The combination of the pixel writings using the parameter sets of the laser beam indicated in tables 2 and 3 results in a clear approach for the correction of different types of errors and even for the combination of different types of errors.

The above specified sets of laser beam parameters can be tuned or combined in order to achieve a specific or an optimal corrective action.

Another beneficial aspect further comprises the step of selecting the optical element of the optical system for introducing the at least one arrangement of local persistent modifications which compensates the at least one defect to a maximum extent.

Along the optical beam in the optical system there may be optical elements which are better suited for compensating the defect than other ones. This means that they can compensate the defect with an arrangement of local persistent modifications inducing less strain and or less local scattering in the optically relevant area than other optical elements.

The described method allows the selection of the optical element for the introduction of the arrangement of local persistent modifications which is best suited for this purpose.

Another aspect further comprises the step of selecting at least two optical elements of the optical system for introducing of at least one arrangement of local persistent modifications in each of the at least two optical elements.

In this case, the arrangements of local persistent modifications are selected so that their combined effect compensates the at least one defect of the overall optical system.

Another aspect further comprises the step of introducing the at least one arrangement of local persistent modifications in an optical element of an illumination system of a photolithographic projection exposure system arranged next a field plane of the illumination system and/or introducing the at least one arrangement of local persistent modifications in an optical element of an illumination system arranged between the field plane and a pupil plane of the illumination system.

Yet another aspect further comprises the step of inserting at least one additional optical element into the optical system having at least one arrangement of local persistent modifications at a position at which it compensates the defect to the maximum extent.

This approach does not require modifying an optical element of the optical system. One or several positions can be intended in the optical system at which one or several additional optical elements can be inserted when required.

Another aspect further comprises the step of introducing the at least one arrangement of local persistent modifications in at least one retardation compensation component, wherein the at least one retardation compensation component being additionally inserted in the optical system.

In a further aspect, at least one polarization compensation component is arranged at a position in the optical system having a maximum defect compensation effect.

By using a separate polarization compensation component for the compensation of the defect of the optical system, the polarization compensation component can be arranged at a position of the optical system where it can best compensate the defect(s) and has on the other hand minimum effect on the path of the optical beam. This approach allows for a flexible compensation of a defect which may vary during the operation of the optical system by providing various polarization compensation components for different operating conditions which can be easily exchanged.

According to a further aspect, the optical system comprises a telescope system, a microscope system and/or a projection system. In another aspect, the microscope system comprises a phase contrast microscope and/or the projection system comprises a photolithographic projection exposure system.

The application of the inventive method is not restricted in the wavelength of the illumination radiation of a photolithographic projection exposure system. Preferably it can be applied to projection exposure systems which use electromagnetic radiation in the ultraviolet (UV) wavelength range, in particular in the DUV range.

In a further aspect, the polarization compensation component is arranged at a position in the photolithographic projection exposure system having the maximum effect on the intensity in preferred state (IPS) of the photolithographic projection exposure system.

In a further aspect, the arrangement of local persistent modifications is introduced in a neutral density filter used for an intensity variation compensation of the optical system.

For example, typically, the illumination system of the projection exposure system has close to the imaging plane, which is the field plane of the illumination system, a specific optical element dedicated for the compensation of a non-uniformity of the illumination across the optical beam of the scanner used to illuminate the photolithographic mask. This element is a neutral density filter and is also called grey filter. This optical element is a perfect candidate for the compensation of retardation variations by introducing an arrangement of local persistent modifications. Consequently, the grey filter can simultaneously perform both tasks in parallel: compensation of an intensity and of a retardation variation across the optical beam.

In another aspect, at least one first arrangement of local persistent modifications is introduced in the optically relevant area of an optical element acting as a neutral density filter for the intensity variation compensation of the optical system and at least one second arrangement of local persistent modifications is introduced outside the optically relevant area of the optical element.

In still a further aspect, the optical system comprises an illumination system of the photolithographic projection exposure system.

Another aspect further comprises the step of applying an adjustable strain to the at least one optical element using at least one actuator. Still another aspect comprises introducing at least one arrangement of local persistent modifications and applying an adjustable strain in the at least one optical element using the at least one actuator. In yet a further aspect the actuator comprises a piezo element.

By attaching one or several actuators to the optical element comprising the arrangement of local persistent modifications, it is possible to additionally apply an adjustable strain to the optical element. The actuator can be used to compensate polarization variations which are for example caused by temperature drifts or humidity changes of the projection exposure system. Moreover, the additional temporal strain applied by the actuator can be used to compensate aging elements of optical elements of the projection exposure system.

According to another aspect, the arrangement of local persistent modifications comprises generically compensating the at least one defect of the optical system.

This approach can for example be used to compensate intrinsic or material birefringence of materials used for the fabrication of optical elements for the DUV wavelength range. Since the IPS (intensity in preferred state) loss is proportional to the square of a retardation of the optical beam in the optical element of the optical system or in the projection exposure system, a major portion of the polarization variation induced by material birefringence of an optical element or of a group of optical elements can be compensated without in detail analysing the effect of the intrinsic birefringence on an individual optical element. Therefore, the induced polarization variation of a specific type of optical system can at least partially be compensated without the need to analyse the effect of material birefringence of each individual optical system.

Another aspect further comprises the step of compensating each optical element of the optical system.

This approach allows the set-up of optical systems only containing essentially defect-free optical elements or components. This means for example that photolithographic projection exposure systems only comprise birefringence compensated optical elements. Furthermore, birefringence induced by gravitational effects in dependence of the installation position can also be compensated.

Still a different aspect further comprises the step of measuring each optical element of the optical system. In still another aspect, the optical element comprises a lens.

Another aspect comprises compensating the at least one defect of the optical element by applying a strain to the optical element. In a further aspect, applying the strain comprises applying a time-independent strain and/or applying a time-dependent strain to the optical element. Still a further aspect comprises applying the time-independent strain by introducing at least one arrangement of local persistent modifications. Yet another aspect comprises applying the time-dependent strain in the at least one optical element by using the at least one actuator.

In still a further aspect measuring of the at least one defect of the optical element and compensating the at least one defect of the optical element occurs in a combined apparatus. In another beneficial aspect, the combined apparatus comprises a polarimeter and a laser source for the generation of ultra-short light pulses.

For modern optical systems, it is typically necessary to analyse or to control each optical element of an optical system prior to its insertion in the optical system. Consequently, the measurement of the optical defect can be combined with the control of the optical element without excessively increasing the analysis effort. In particular, if the measurement of the defect and its compensation are combined in a single device or apparatus the defect compensation can be optimized.

In still another aspect compensating the at least one defect of the at least one optical element comprises introducing at least one arrangement of local persistent modifications and applying a strain to the at least one optical element with an actuator.

According to another aspect, the at least one defect of the at least one optical element is compensated at the fabrication site of the at least one optical element at the end of the fabrication process of the at least one optical element.

At least at the end of the fabrication process of the optical element has to be controlled whether it meets its predetermined specification. The specification may also comprise a strain induced birefringence. The numerical value of the strain induced birefringence may be supplied by the customer, who inserts the optical element in his optical system. Thus, the manufacturer of the optical element determines a strain distribution which is necessary to compensate the strain induced birefringence of his optical element and applies the respective strain distribution to the optical element.

In a beneficial aspect, the at least one optical element and/or the at least one additional optical element comprises at least one arrangement of local persistent modifications which is not rotationally symmetric around a beam propagation direction within the optical system.

Another advantageous aspect further comprises the step of compensating the least one optical defect by rotating the at least one optical element and/or the at least one additional optical element around the beam propagation direction so that the defect compensation is maximized.

This approach introduces a further degree of freedom in the defect compensation procedure as the compensation effect of the optical element can be adjusted to the defect.

In a further aspect, the at least one optical element and/or the at least one additional optical element comprise at least two defect compensation areas having different arrangements of local persistent modifications which are distributed in a plane perpendicular to a beam propagation direction of the at least one optical element and/or the at least one additional optical element.

By preparing an optical element or an additional optical element for the compensation of various defects or of one defect type having different strengths, the defect compensation process can be optimized as only the best orientation of the optical element has to be determined.

Still another aspect further comprises the step of rotating the least one optical element and/or the at least one additional optical element around the beam propagation direction so that the defect compensation area of the at least one optical element and/or the at least one additional optical element is aligned with a clear aperture of the optical system.

The clear aperture of an illumination system of a photolithographic projection exposure system is typically of an elliptical shape and the area of the clear aperture is smaller than the optically relevant area of the optical element or of the additional optical element. This circumstance allows the fabrication optical elements and/or additional optical elements which carry various defect compensation areas.

According to another aspect, the at least two defect compensation areas of the at least one optical element and/or the at least one additional optical element are arranged at a predetermined rotation angle around the beam propagation direction.

In still another aspect, the at least two defect compensation areas comprise arrangements of local persistent modifications compensating one type of defect having different defect strengths. In yet another aspect, the at least two defect compensation areas comprise arrangements of local persistent modifications compensating two different types of defects. According to another beneficial aspect, the at least two defect compensation areas comprise arrangements of local persistent modifications compensating different types of defects having different defect strengths.

Still another aspect comprises the step of rotating the at least one optical element and/or the at least one additional optical element during an operation of the optical system.

In a further aspect, the at least one optical element comprises a lens of an illumination system of a photolithographic projection exposure system and the at least one additional optical element comprises a defect compensation plate.

As already mentioned, an illumination system of a scanner of a photolithographic exposure projection system typically only uses a portion of the optically relevant area of an optical element and/or of an additional optical element, wherein the used portion typically has an elliptical form. This portion is called clear aperture. Thus, one single optical element may have two or more defect compensation areas which can be are used in order to compensate different types of optical defects and/or to compensate a single defect resulting in various defect strengths. By rotating the optical element and/or the additional optical element around the beam propagation direction the defect compensation effect of the optical element and/or the additional optical element can be optimized.

A beneficial aspect further comprises the step of shifting the at least one optical element and/or the at least one additional optical element along a beam propagation direction in the optical system so that at least one defect is compensated to a maximum extent. Another aspect comprises shifting of the at least one optical element and/or the at least one additional optical element between a field plane and a pupil plane of photolithographic projection exposure system. In a further aspect, shifting of the at least one optical element and/or the at least one additional optical element comprise shifting between a field plane and a pupil plane of an illumination system of the photolithographic projection exposure system. According to still another aspect, the illumination system comprises a reticle masking objective.

In illumination systems the strain induced birefringence typically shows a field dependence as well as a pupil dependence. By shifting the optical element and/or the additional optical element used for the compensation of the strain induced birefringence, the defect compensation effect can be adjusted to dependence of the defect on the field as well as of the pupil. This procedure maximizes the defect compensation effect for the optical system.

In still a further aspect, the at least one optical element and/or the at least one additional optical element comprise a birefringence distribution.

Another aspect further comprises the step of introducing the at least one arrangement of local persistent modifications in a constant depth relative to a surface contour of the at least one optical element.

Still a further aspect comprises the step of introducing at least two different arrangements of local persistent modifications in various depths of the at least one optical element.

In optically "thick" optical elements a portion of the rays does not pass the optical element parallel to the optical axis of the optical element. When introducing a homogeneous pixel arrangement in the thick optical element the rays traversing the optical element having a non zero angle with respect to the optical axis "see" a component of the fast axis of the strain induced birefringence. By introducing the pixel arrangement(s) in the optical element so that they follow a surface contour of the optical element at a constant depth the fast axis of the induced birefringence distribution gets a vector component parallel to the optical axis which compensates the component of the strain induced birefringence which is parallel to the optical axis. The introduction of the different pixel arrangements in various depths of the optical element can also compensate a component of the strain induced birefringence of a "thick" optical component parallel to the optical axis.

In another aspect, shifting of the at least one optical element and/or the at least one additional optical element along the beam propagation direction varies a compensation of the birefringence distribution of the optical system by the at least optical element and/or the at least one optical element.

According to a further aspect, an optical element for compensating at least one defect of an optical system, which does not have pattern elements on one of its optical surfaces, comprises at least one arrangement of local persistent modifications, which at least partially compensates the at least one defect.

In another aspect, an optically relevant the area of the optical element comprises the at least one arrangement of local persistent modifications and/or wherein the area outside the optically relevant area comprises the at least one arrangement of local persistent modifications and/or wherein the optically relevant area comprises at least one first arrangement of local persistent modifications and the area outside the optically relevant area comprises at least one second arrangement of local persistent modifications In a further aspect, the optical element is an additional optical element which is additionally inserted in the optical system. In another aspect, the additional optical element does not comprise imaging properties.

According to a further aspect, at least one first optical element comprises the at least one first defect and/or at least one second optical element of the optical system comprises the at least one first defect and/or the at least one second optical element comprises the at least one first defect and/or the at least one second optical element comprises the at least one second defect.

According to another aspect, the optical element and/or the additional optical element is arranged in the optical system at a position at which it compensates the at least one defect to a maximum extent.

In a further aspect, the optical element and/or the additional optical element is arranged at a position within a photolithographic exposure projection system having a maximum effect on an intensity in preferred state (IPS) of a photolithographic projection exposure system.

According another aspect, the optical element and/or the additional optical element comprise a retardation compensation element which is arranged at the position in the photolithographic projection exposure system at which it has the maximum effect on the intensity in preferred state (IPS) of the photolithographic projection exposure system.

In still another aspect, the optical element and/or the additional optical element comprise a polarization compensation component.

In still a further aspect, the additional optical element comprises a retardation compensation element.

In yet another aspect, the retardation compensation element is arranged in a pupil plane and/or in a field plane of an illumination system of the photolithographic projection exposure system.

In yet another aspect, the optical element further comprises a neutral density filter used for an intensity variation compensation of an illumination system of the photolithographic projection exposure system.

In still a further aspect, the optical element and/or the additional optical element are further adapted to perform a method according to any of the above aspects.

In another aspect, an apparatus for compensating at least one defect of an optical system, comprises: (a) a measuring unit adapted to determine the at least one defect of the optical system, (b) an arithmetic unit adapted to determine at least one arrangement of local persistent modifications from the at least one defect of the optical system, and (c) a light source adapted to introduce the at least one arrangement of local persistent modifications into at least one optical element of the optical system, wherein the at least one optical element does not have pattern elements on one of its surfaces.

In a further aspect, the measuring unit comprises a polarimeter.

A polarimeter or an automation polarimeter is typically used to determine a strain induced birefringence distribution of an optical element or of a group of optical elements forming an optical system.

According to a beneficial aspect, the measuring unit and the light source are combined in a single device.

In another aspect, the combined device comprising the measuring unit and the light source further comprises the arithmetic unit. In still another aspect, the light source comprises a laser source adapted to generate ultra-short laser pulses. Finally, in still another aspect, the arithmetic unit further controls the combined device comprising the measuring unit and the light source.

4. DESCRIPTION OF THE DRAWINGS

In order to better understand the present invention and to appreciate its practical applications, the following figures are provided and referenced hereafter. It should be noted that the figures are given as examples only and in no way limit the scope of the invention.

FIG. 1 schematically presents essential components of a photolithographic projection exposure system;

FIG. 2 shows a distribution of a retardation of an illumination system of a DUV projection exposure system of a linearly polarized optical beam analysed in the plane of the photolithographic mask, FIG. 2a gives for a left portion, FIG. 2b presents for a centre portion, and FIG. 2c indicates for a right portion of the field or view of the focus plane of the illumination system;

FIG. 3 schematically represents a block diagram of an apparatus for introducing an arrangement of local persistent modifications in an optical element;

FIG. 4 schematically represents a material birefringence of an optical element; FIG. 4a shows the orientation of the fast axis across the optical element and FIG. 4b presents the magnitude of the retardation of the optical element;

Figure 1:
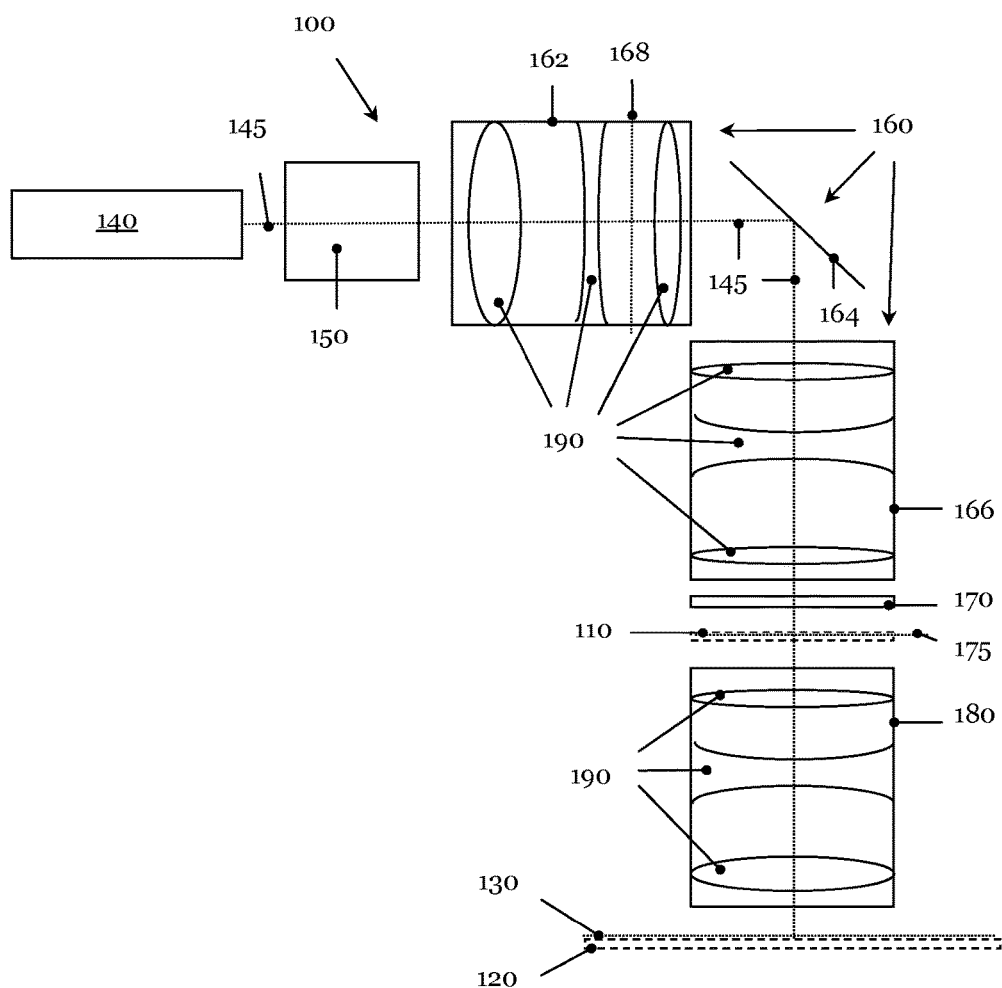
Figure 4A:
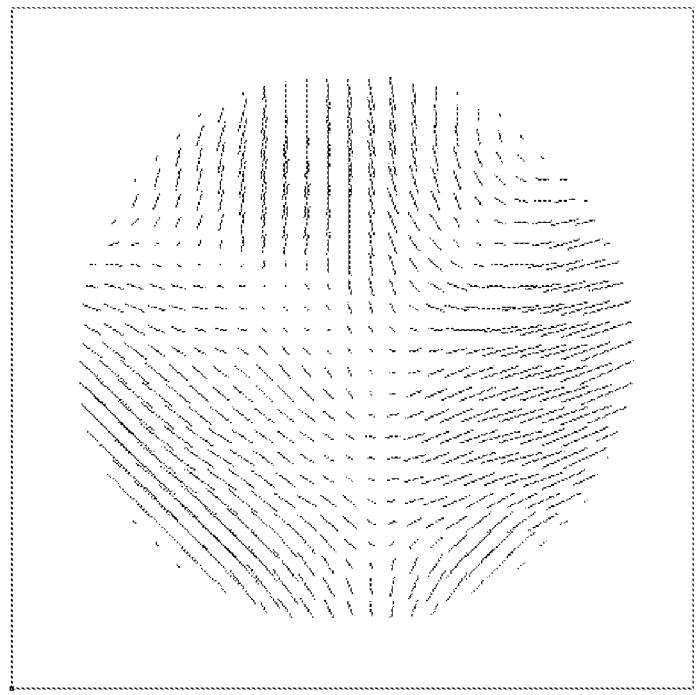
Figure 4B:
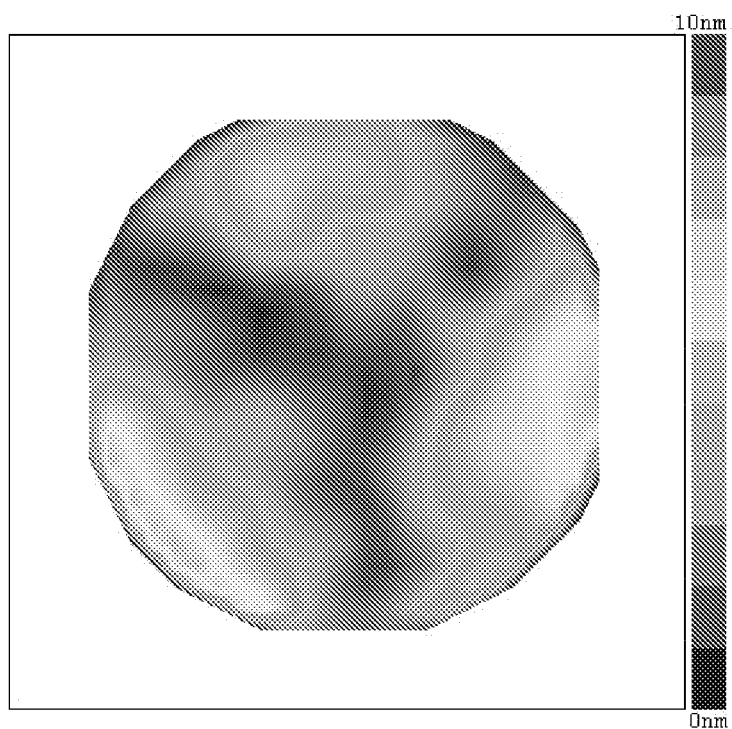
Figure 17A:
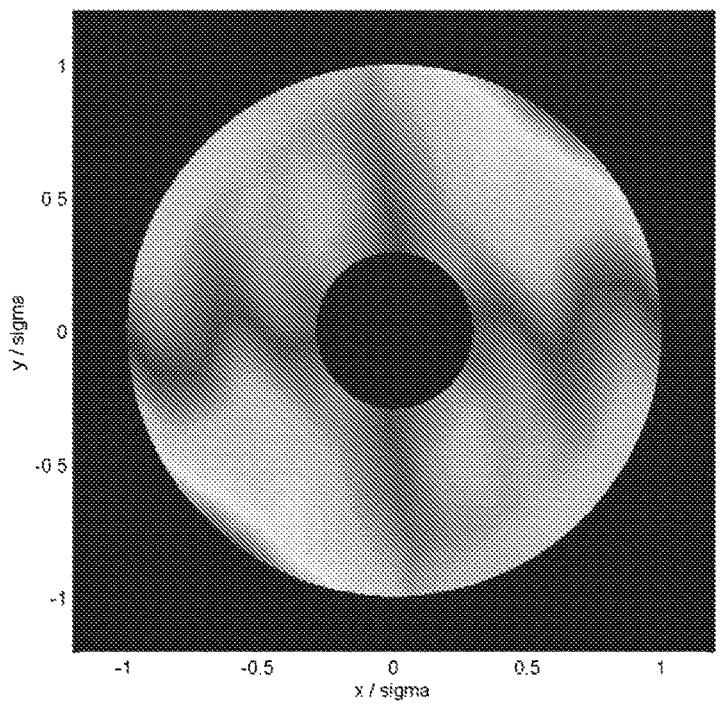
Figure 17B:
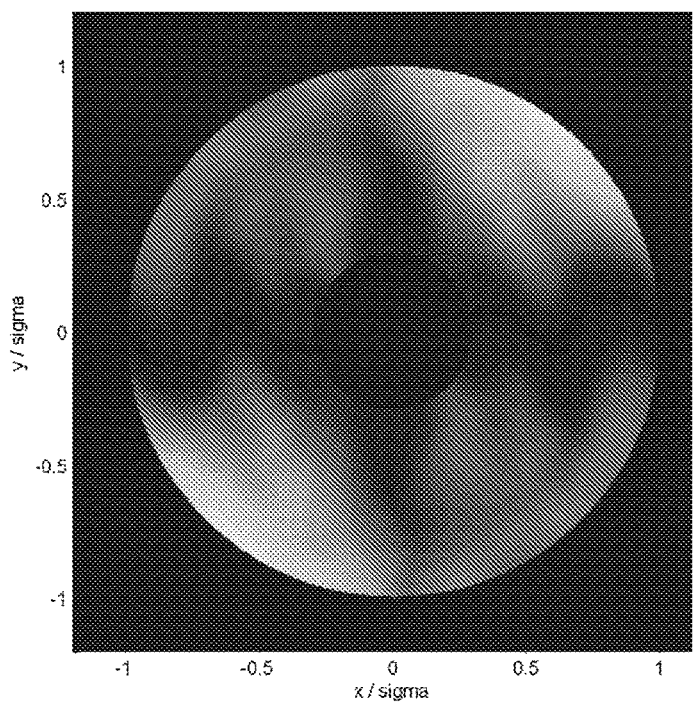
Figure 17C:
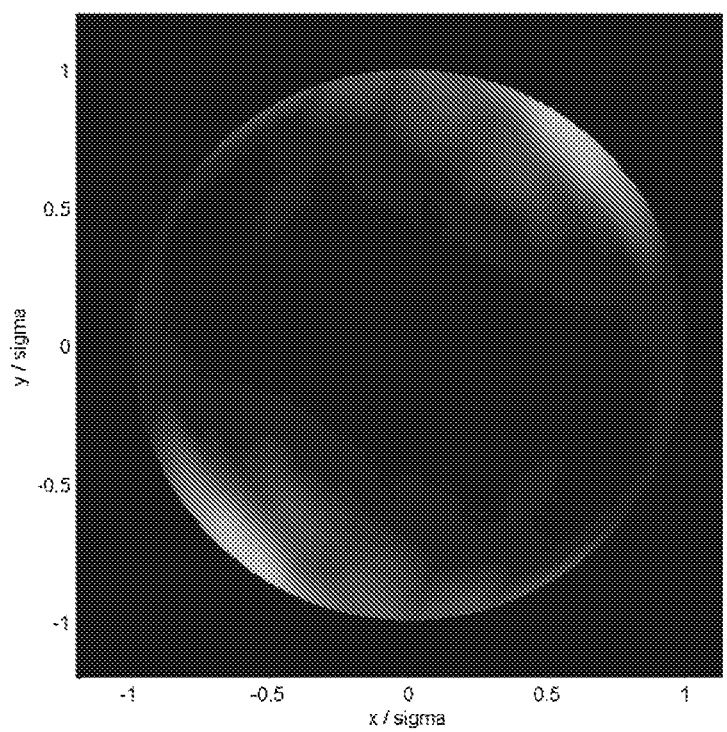

FIG. 8 (a) presents the residual distribution of the fast axis shown in FIG. 4a after combining the birefringence induced by the pixels of the first and the second writing mode, and (b) depicts the residual distribution of the magnitude of the retardation of FIG. 4b after combining the birefringence induced by the first and second writing mode;

FIG. 9 (a) represents the fast axis distribution of the intrinsic birefringence of a quartz plate, (b) shows a cut-out of the centre portion of the quartz plate, and (c) depicts the distribution of the retardation magnitude in the centre region;

FIG. 10 (a) shows the mode signature of the first writing mode, (b) presents the simulated variation of the optical transmission outside of the optically relevant area, (c) depicts the simulated distribution of the fast axis of the induced birefringence, and (d) represents the simulated distribution of the magnitude of the induced birefringence;

FIG. 11 (a) shows the mode signature of the second writing mode, (b) presents the simulated variation of the optical transmission outside of the optically relevant area, (c) depicts the simulated distribution of the fast axis of the induced birefringence, and (d) represents the simulated distribution of the magnitude of the induced birefringence;

FIG. 12 (a) presents the residual distribution of the fast axis shown in FIG. 4a after combining the birefringence induced by the pixels of the first and the second writing mode, and (b) depicts the residual distribution of the magnitude of the retardation of FIG. 4b after combining the birefringence induced by the first and second writing mode;

FIG. 13 depicts a top view of a neutral density filter used for the compensation of the material birefringence of the projection exposure system of FIG. 1;

FIGS. 14a-14b represent the mode signatures of the two writing modes used for introducing arrangements local persistent modifications in the optically not relevant area of the neutral density filter of FIG. 13;

FIGS. 15a1-15a5 and 15b1-15b5 schematically show the variation of the optical transmission by subsequent arrangements of local persistent modifications in the neutral density filter of FIG. 13 using the mode signatures of the writing modes of FIG. 14;

FIGS. 16a0-16a5 and 16b0-16b5 (a) schematically depicts the set-up of the fast axis and (b) of the amount of the retardation caused by the subsequent arrangements of local persistent modifications illustrated in FIG. 15;

FIG. 17a represents the magnitude of the mode signature as a function of the clipping level realized by a slit, wherein the slit is parallel to the beam polarization;

FIG. 17b depicts the magnitude of the mode signature as a function of the clipping level realized by a slit, wherein the slit is perpendicular to the beam polarization;

FIG. 17c illustrates the IPS improvement by a neutral density filter processed as indicated in FIG. 13.

Figure 18:
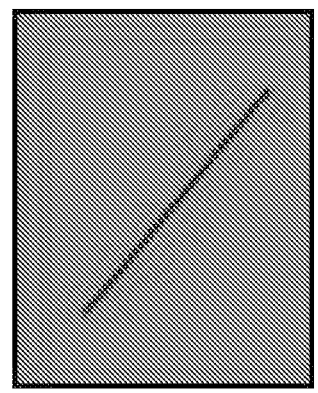
Figure 19A:
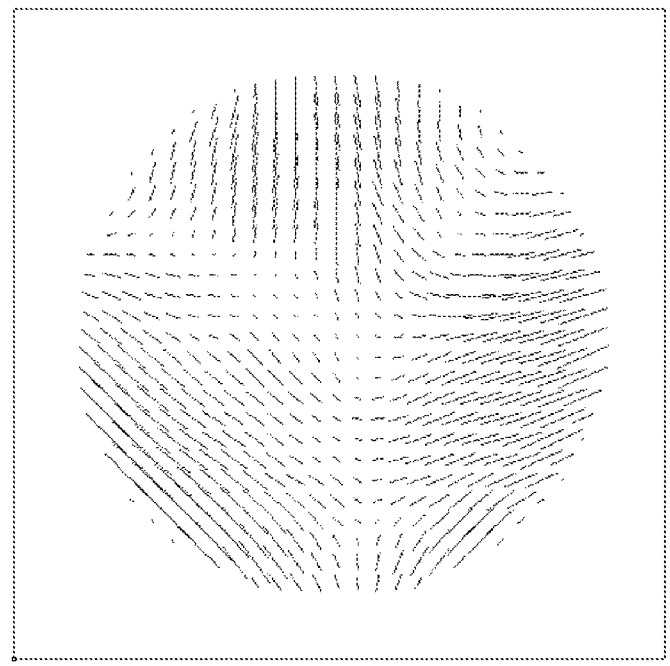
Figure 19B:
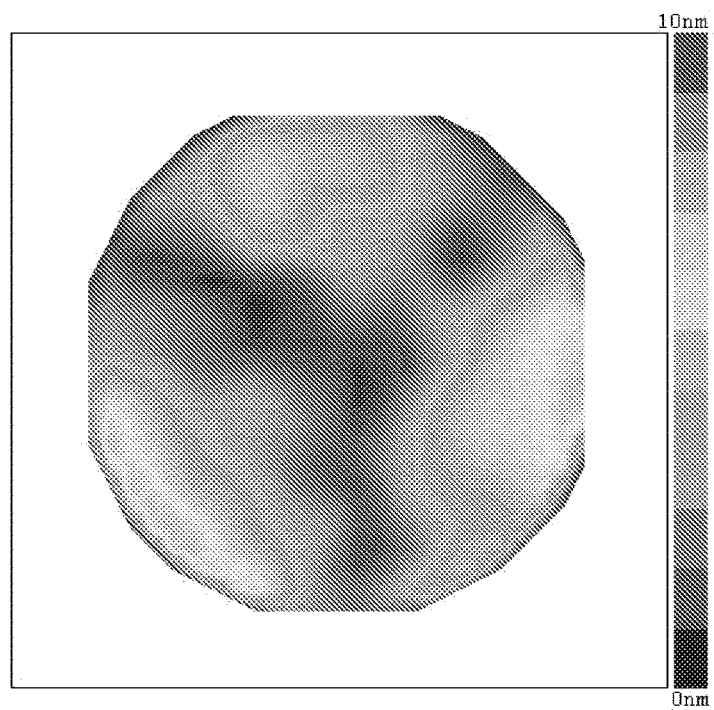
Figure 22A:
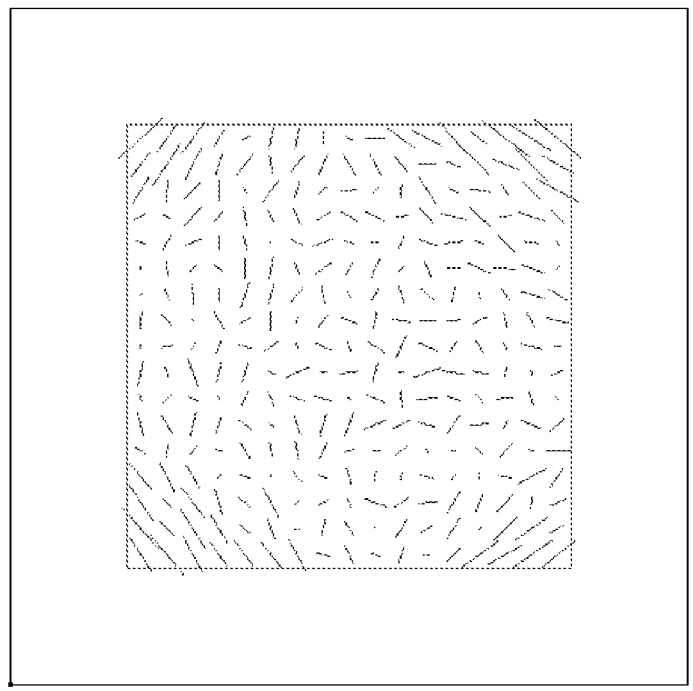
Figure 22B:
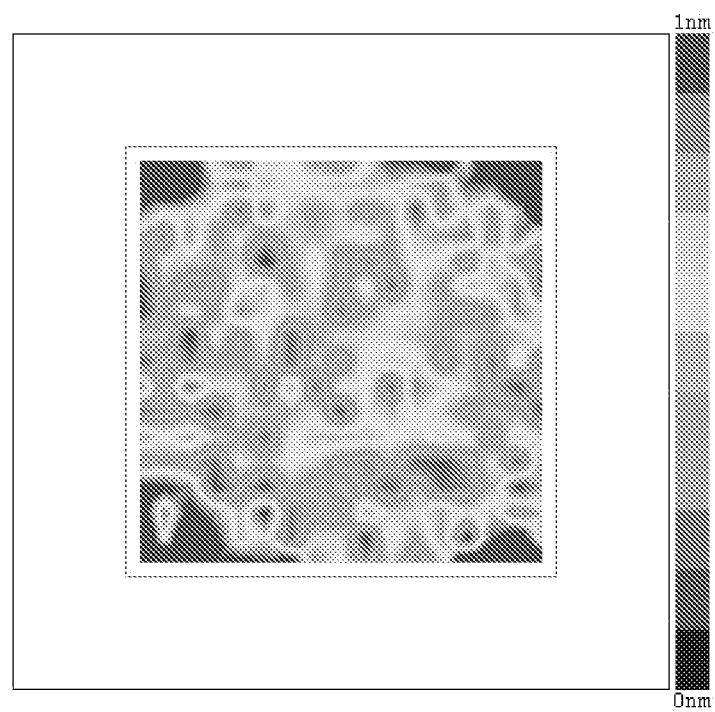
Figure 23:
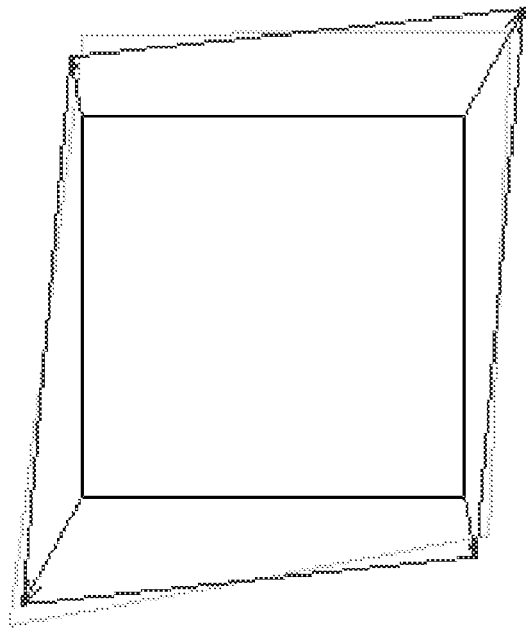
Figure 24:
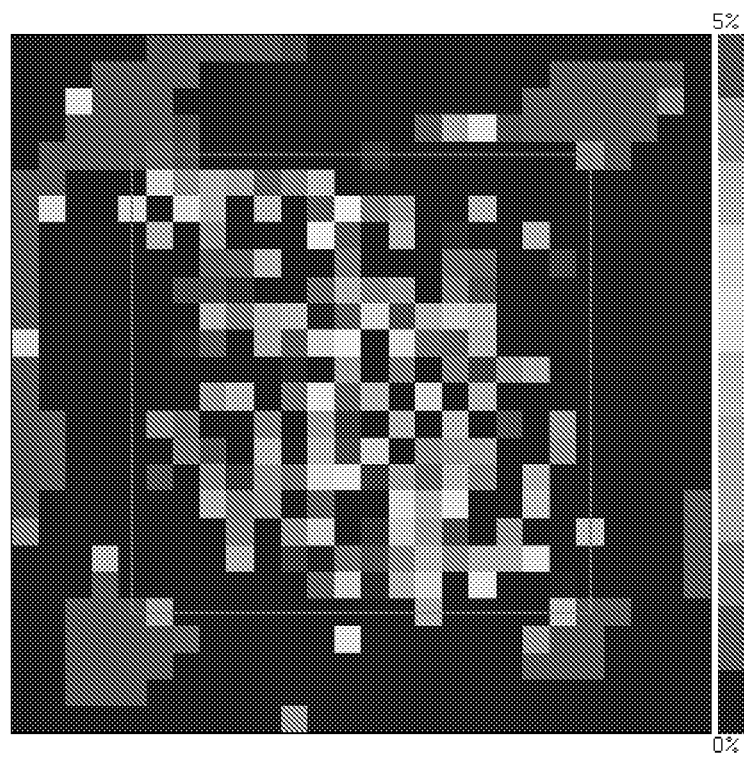
Figure 25A:
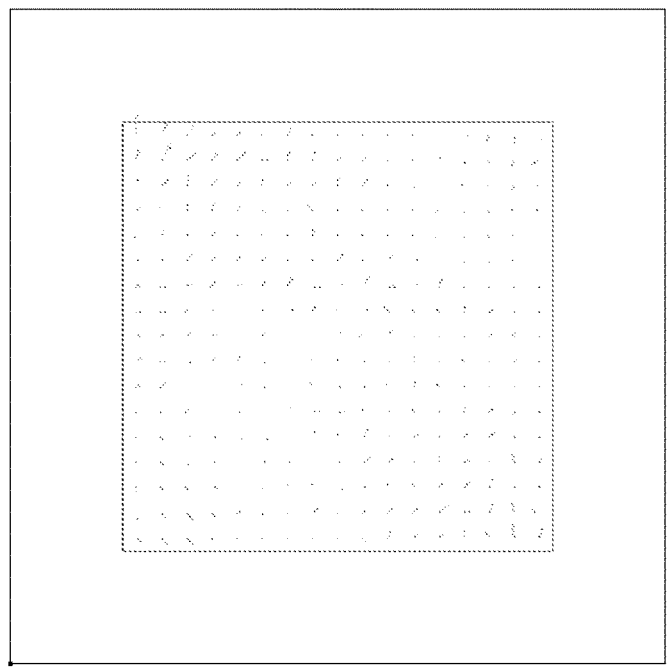
Figure 25B:
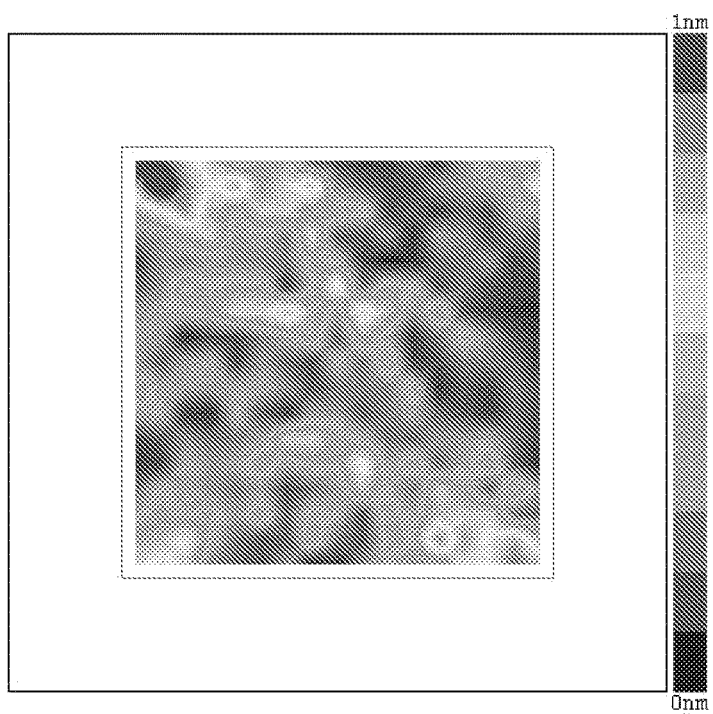
Figure 26A:
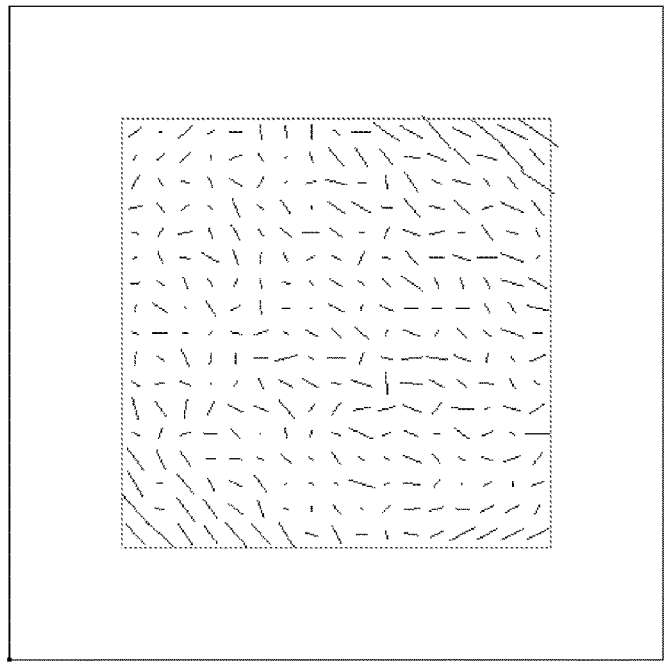
Figure 26B:
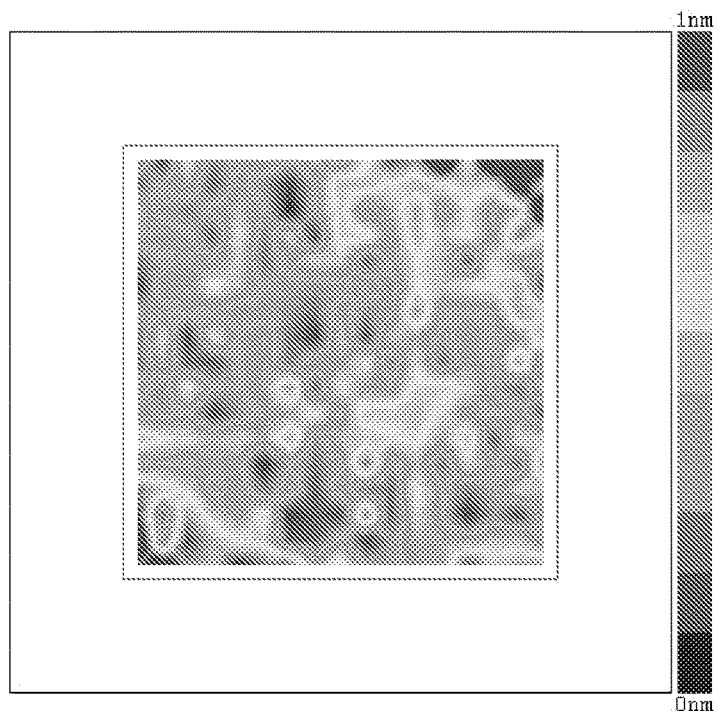
Figure 27A:
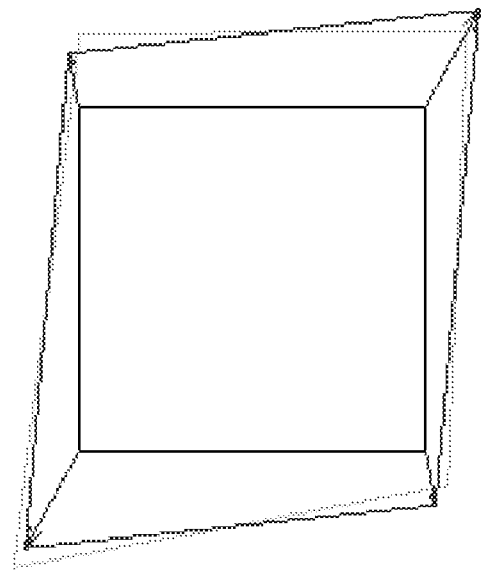
Figure 27B:
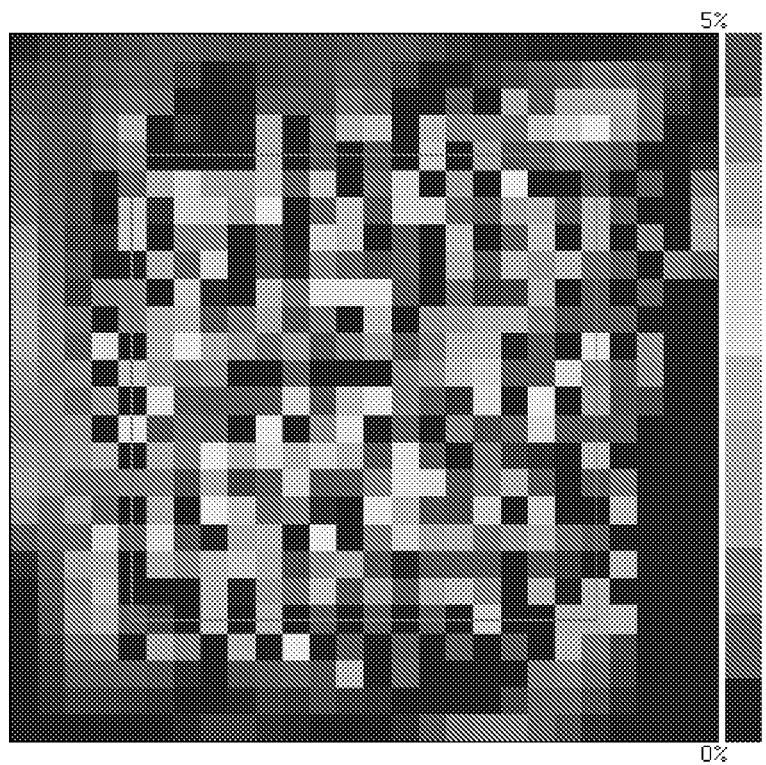
Figure 27C:
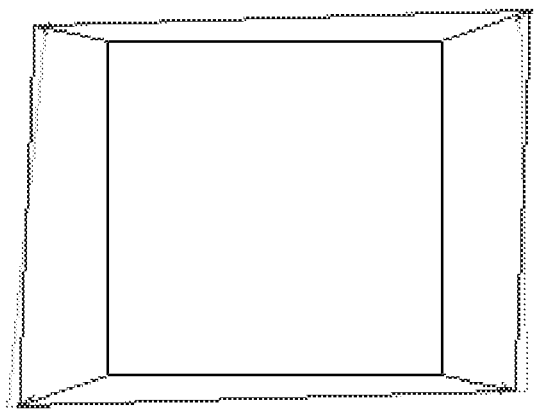
Figure 27D:
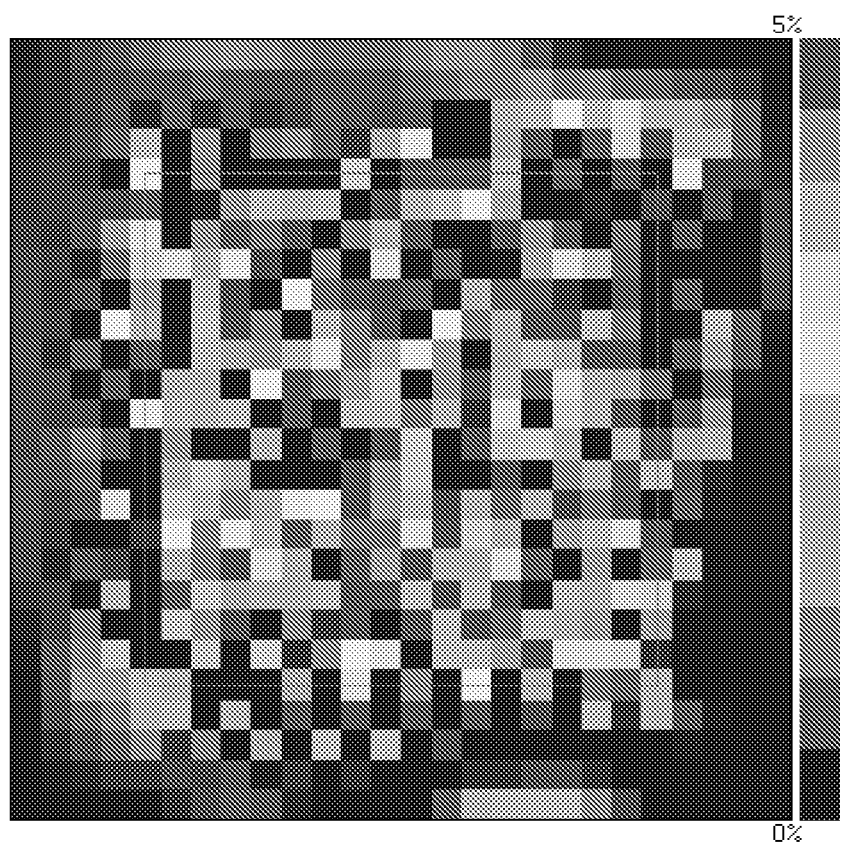
Figure 27E:
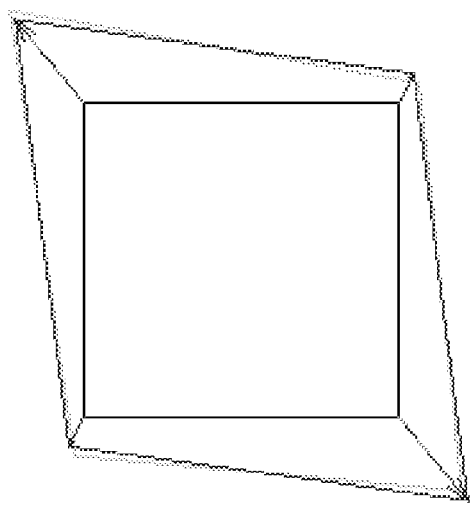
Figure 27F:
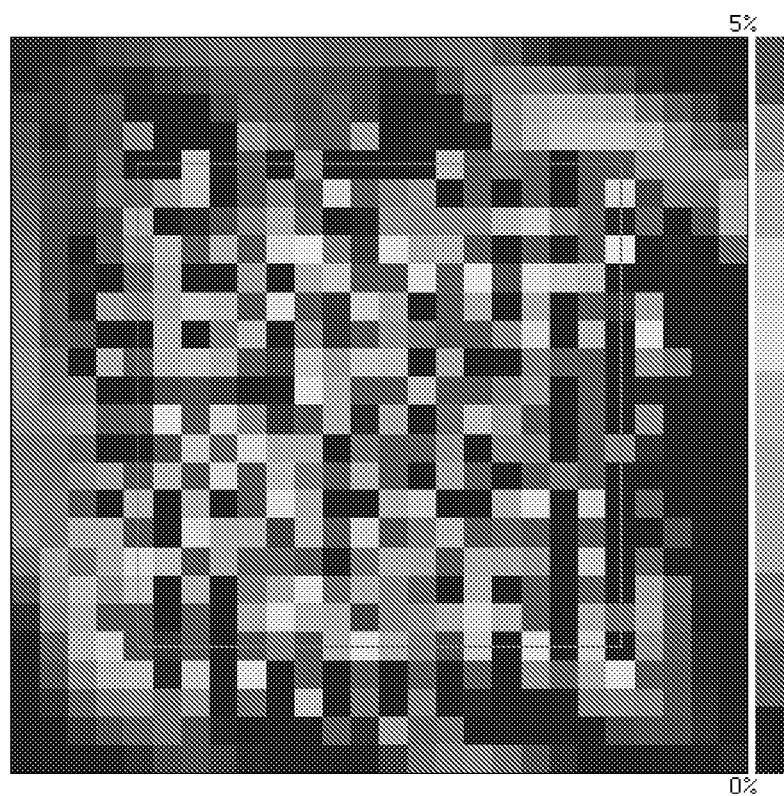
Figure 28:
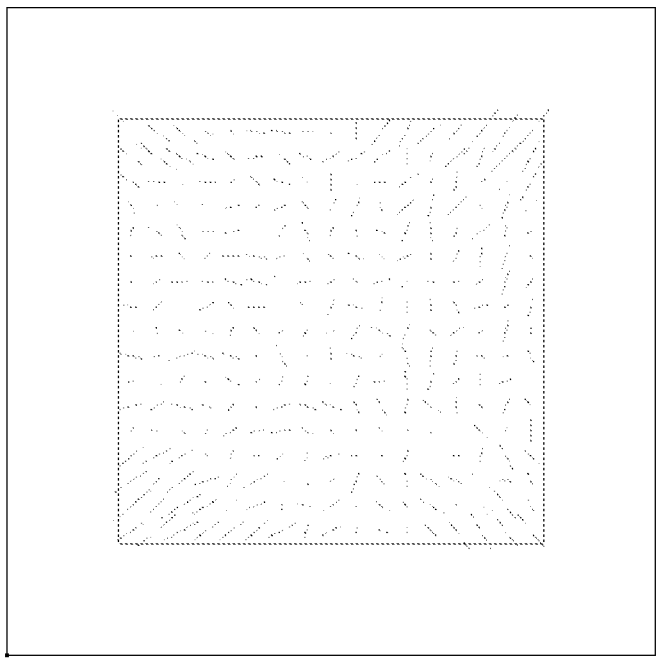
Figure 29A:
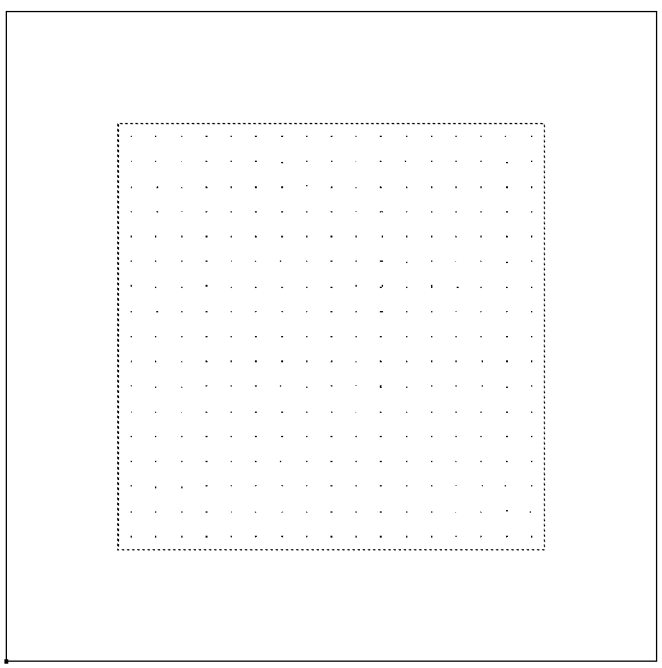
Figure 29B:
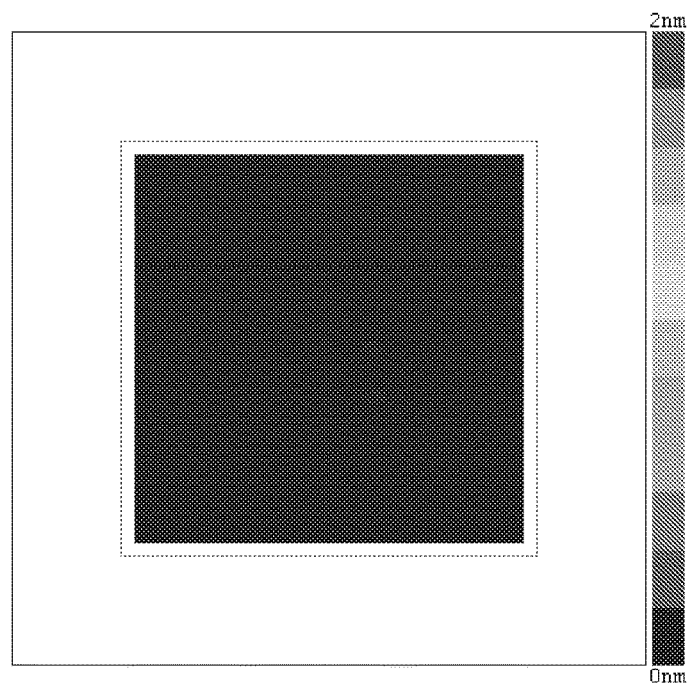
Figure 30:
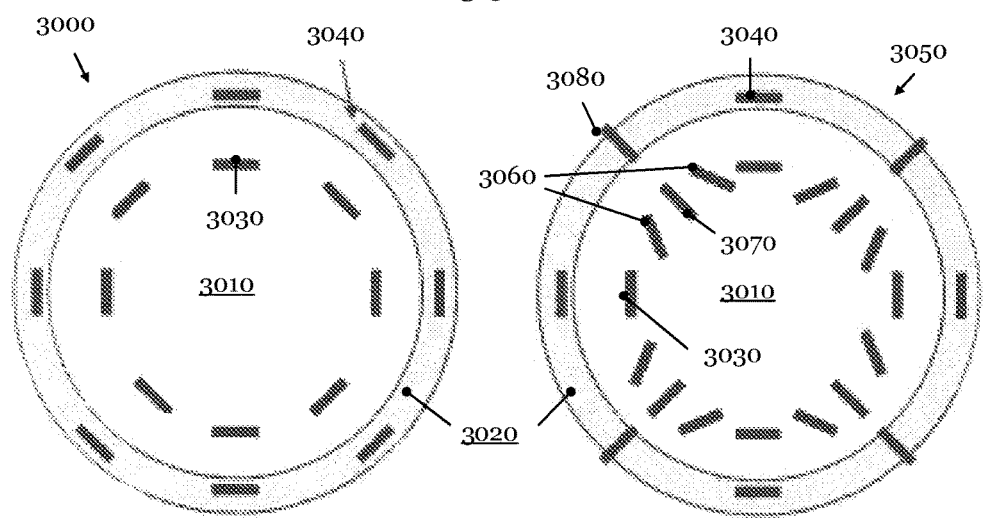
Figure 31:
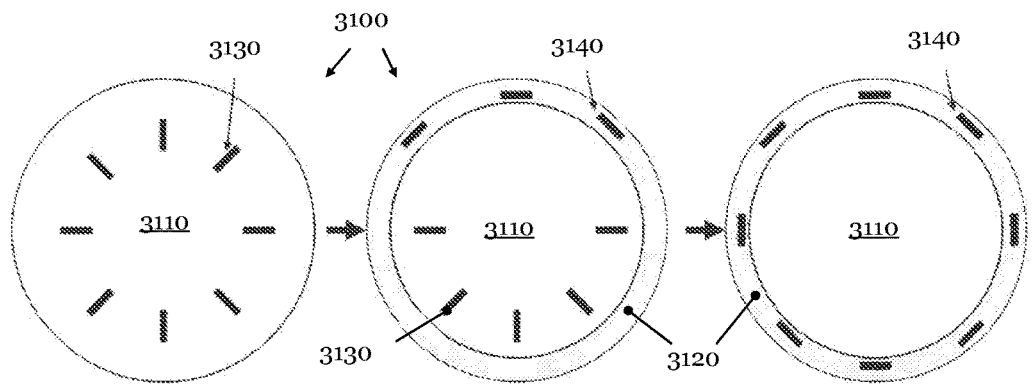
Figure 32:
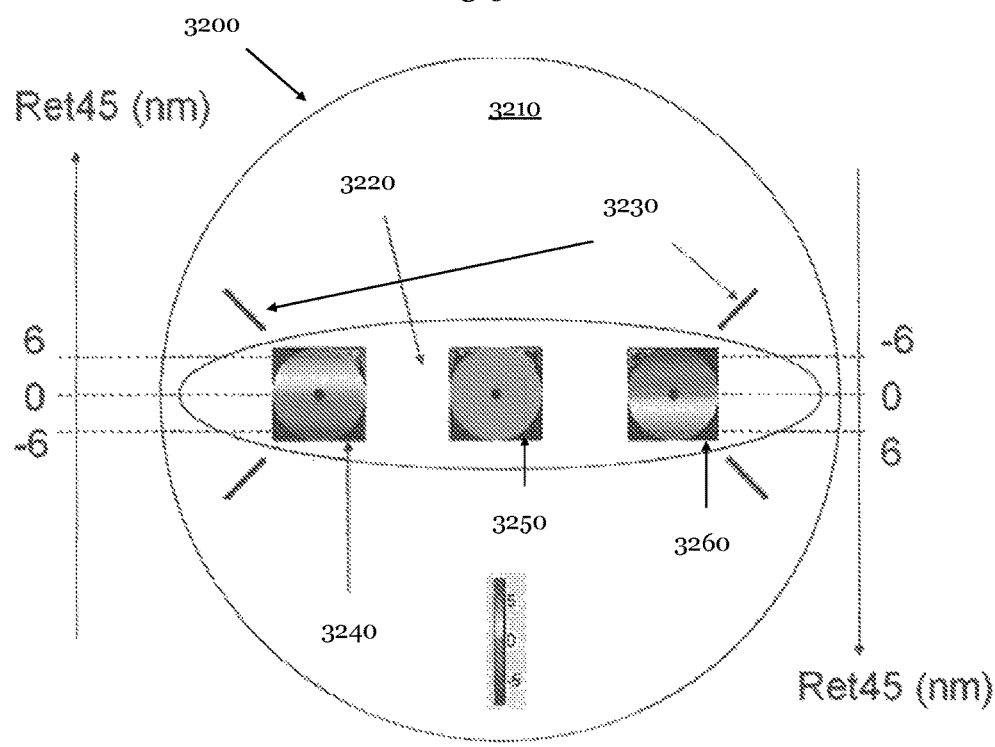
Figure 33:
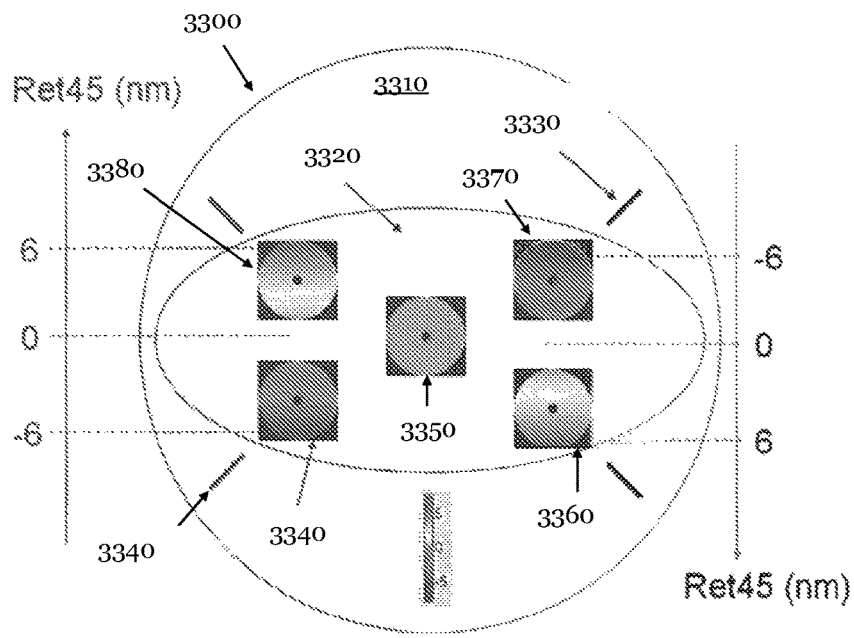
Figure 34:
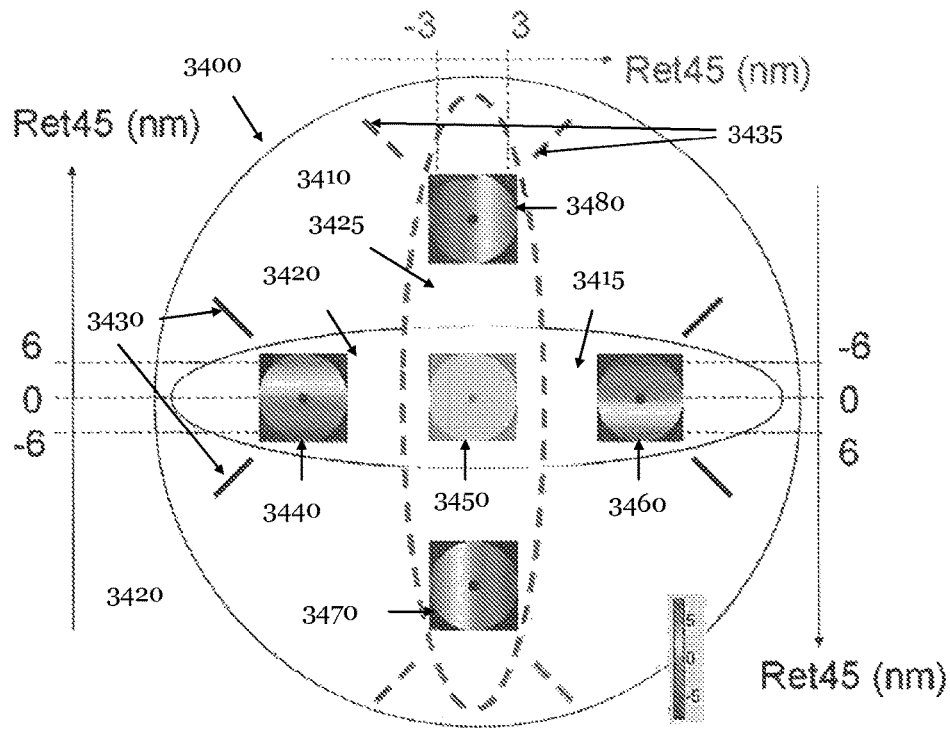

FIG. 18 depicts the distribution of the fast axis orientation of 60° for a writing beam having a polarization of 0° with respect to the x-axis;

FIG. 19a presents the distribution of fast axis orientation of a measured birefringence problem;

FIG. 19b presents the retardation magnitude distribution of the measured birefringence problem of FIG. 19a;

FIG. 20 shows a writing map which compensates the birefringence problem of FIG. 20 with respect to the distribution of the polarization angle (a) and with respect to the distribution of the retardation amount (b);

FIG. 21 depicts the writing maps with respect to the polarization angle distributions (a, c) and the retardation magnitude distributions (b, d) for the compensation of the birefringence problem of FIG. 20 by writing pixel arrangements in two different layers;

FIG. 22 shows a synthetic birefringence problem, (a) the fast axis orientation distribution and (b) the retardation magnitude distribution;

FIG. 23 presents the mode signature of the only mode of the laser beam to correct the birefringence problem of FIG. 22;

FIG. 24 illustrates the writing map used for the compensation of the birefringence problem of FIG. 22;

FIG. 25a depicts the orientations of the fast axis distribution of the birefringence induced by the writing map of FIG. 24;

FIG. 25b represents the retardation magnitude distribution of the birefringence induced by the writing map of FIG. 24;

FIGS. 26a-26b show the residual birefringence problem of FIG. 22 after subtracting the birefringence induced by the writing map of FIG. 24;

FIG. 27a, c, and e present three mode signatures for the compensation of the birefringence problem of FIG. 22, and b, d, and f show the respective writing maps;

FIG. 28 presents the fast axis orientation distribution of the birefringence induced by the writing maps of FIG. 27;

FIGS. 29a-29b show the residual birefringence problem of FIG. 22 after the application of the three writing maps of FIG. 27;

FIG. 30 schematically depicts a birefringence distribution in the optically relevant area of an optical lens (inner black dashes) and an induced strain distribution applied to the optically not relevant area (outer black dashes) which extends toward the optically relevant area and compensates the birefringence in the optically relevant area of the optical element, on the left for a tangential birefringence distribution and on the right for a tangential radial distribution;

FIG. 31 schematically illustrates the process of a birefringence compensation in the optically active area of an optical element, left part: an optical element having a radial birefringence distribution, middle part: a portion of the birefringence distribution is compensated by a strain induced birefringence in the optically not relevant part of the optical element, right part: the strain distribution induced in the outer optically not relevant area of the optical element compensates the birefringence in the optically relevant area of the optical element;

FIG. 32 schematically represents an optical element having a birefringence distribution induced by arrangements of local persistent modifications which compensate a field dependent Zernike Z3 pupil behaviour of the optical system, the optical element is arranged close to the field plane of a reticle masking (REMA) objective of a photolithographic exposure system;

FIG. 33 schematically shows an optical element having a birefringence distribution induced by arrangements of local persistent modifications, the optical element is arranged between the pupil plane and the field plane of the REMA objective and which compensate a field dependent Zernike Z3 pupil behaviour and simultaneously generate a pupil dependent and field independent Z1 contribution;

FIG. 34 schematically depicts an optical element having two birefringence distributions oriented perpendicular to each other induced by arrangements of local persistent modifications which compensate a field dependent Zernike Z3 pupil behaviour of the optical system of various defect strength, wherein the optical element is arranged close to the field plane of a REMA objective;

FIG. 35 schematically represents a sequential a shift of an additional optical element from (a) close the field plane to (f) close to the pupil plane of a REMA objective;

FIGS. 36a-c schematically show the variation of a retardation of the strained induced birefringence of the additional optical element across the clear aperture as a function of the shift indicated in FIG. 35 at positions a, c and e of FIG. 35;

FIG. 37 schematically illustrates a ray in a thin lens (a) and in a thick lens (b); and FIGS. 38a-38b schematically depicts arrangements of local persistent modifications in a thick lens compensating a component of the fast axis parallel to the optical axis of a strain induced birefringence distribution.

5. DETAILED DESCRIPTION OF PREFERRED EMBODIMENTS

In the following, the present invention will be more fully described hereinafter with reference to the accompanying figures, in which exemplary embodiments of the invention are illustrated. However, the present invention may be embodied in different forms and should not be construed as limited to the embodiments set forth herein. Rather, these embodiments are provided so that this disclosure will be thorough and will convey the scope of the invention to persons skilled in the art.

The present invention is in the following discussed with respect to a projection system, in particular to a photolithographic projection exposure system. It is however appreciated that this is just an example for the application of the inventive principle, but does not restrict the invention photolithographic projection exposure systems.

FIG. 1 shows essential components of a projection exposure system 100. A laser source 140 emits linearly polarized electromagnetic radiation 145 into a beam expansion unit 150. The beam expansion unit 150 increases the diameter of the laser beam 145 from the millimeter to the centimeter range. In modern DUV projection exposure systems excimer laser systems are used as light sources. The polarization direction is typically horizontally oriented, i.e. along the x direction, or vertically oriented, i.e. along the y direction. The beam 145 propagates in the z direction. Typically, the laser source 140 emits light or laser pulses having a pulse duration in the nanosecond range.

In the exemplary embodiment of FIG. 1, the illumination system 160 comprises a first group of optical elements 162, a deflection mirror 164, and second group of optical elements 166. A neutral density filter 170 which is also called grey filter is arranged at the exit of the illumination system 160 in order to remove the intensity variations across the beam slit of the scanner (not indicated in FIG. 1). The light beam 145 exiting the neutral density filter 170 passes through the photolithographic mask 110 which has the feature elements to be projected onto the wafer. The light traversed the mask 110 is collected by the projection objective 180 and is focussed onto a photosensitive layer 130 arranged on a substrate 120 which is often a silicon wafer. It has to be stressed that the mask 110 and the substrate 120 are not part of the projection exposure system 100.

The photolithographic mask 110 is arranged in the field plane 175 of the illumination system 160. The dotted line 168 schematically shows the pupil plane 168 of the illumination system 160.

In the exemplary embodiment of FIG. 1, the optical elements 190 in the illumination system 160 and of the projection system 180 are lenses. Furthermore, the illumination system 160 comprises at least one mirror 164. The optical elements 190 of the projection exposure system 100 can also comprise for example filter elements and/or diffracting optical elements (DOE) (not shown in FIG. 1).

At a given wavelength the resolution of a projection exposure system 100 for structures on the photolithographic mask 110 is essentially determined by the maximum propagation angle the projection objective 180 can focus onto the photoresist 130 dispensed on the substrate 120. The theoretical propagation angle $\theta_{max}$ is obtained from the numerical aperture (NA) of the projection objective 180 or projection system and the photoresist refractive index $n_R$ according to the equation (M. Totzeck et al., "Polarization influence on imaging", J. Microlith., Microlab., Microsyst., 4(3) (July-September 2005), p. 031108-1-031108-15):

$$\theta_{max} = \arcsin \frac{NA}{n_R}. \tag{1}$$

In order to maximize the resolution of the projection exposure system 100 the NA of the projection system 180 has to be augmented. This can be done by using immersion lithography which enables the use of optics with numerical apertures exceeding 1.0 (hyper NA). On the other hand, this means that the vector nature of the electromagnetic radiation 145 used in the projection exposure system 100 becomes important for the imaging of the structures on the mask 110 in the photoresist 130 by the projection exposure system 100, because only identically polarized components of electromagnetic waves interfere. Therefore, it is not only the wave front quality which determines the image contrast of the feature structures of the mask 110 in the photoresist 130 on the wafer 120. The polarization has also a significant influence in DUV projection exposure systems and determines the image quality of hyper NA immersion lithography systems.

Reflection and transmission at interfaces and coatings and/or birefringence are the most important sources for polarization changes in the optical elements 190 of projection exposure systems 100. Without restriction of the generality, the following discussion focuses on the effect of the birefringence of the optical elements 190 on the polarization of the laser beam 145 on its path through the projection exposure system 100.

Figure 2A:
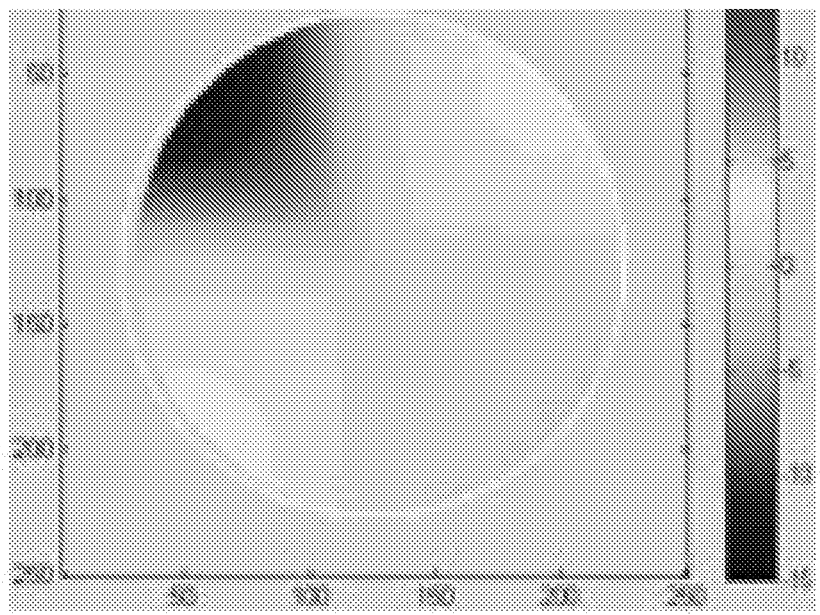
Figure 2B:
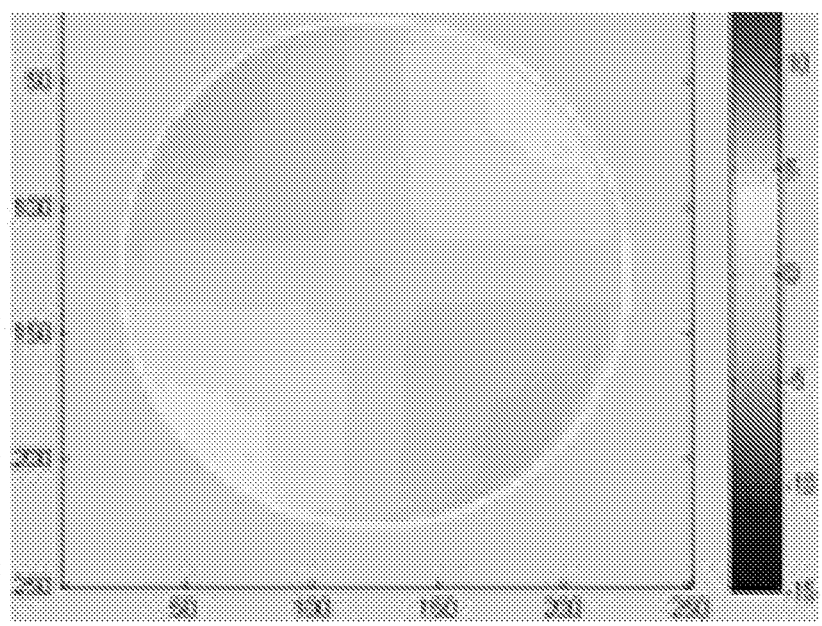
Figure 2C:
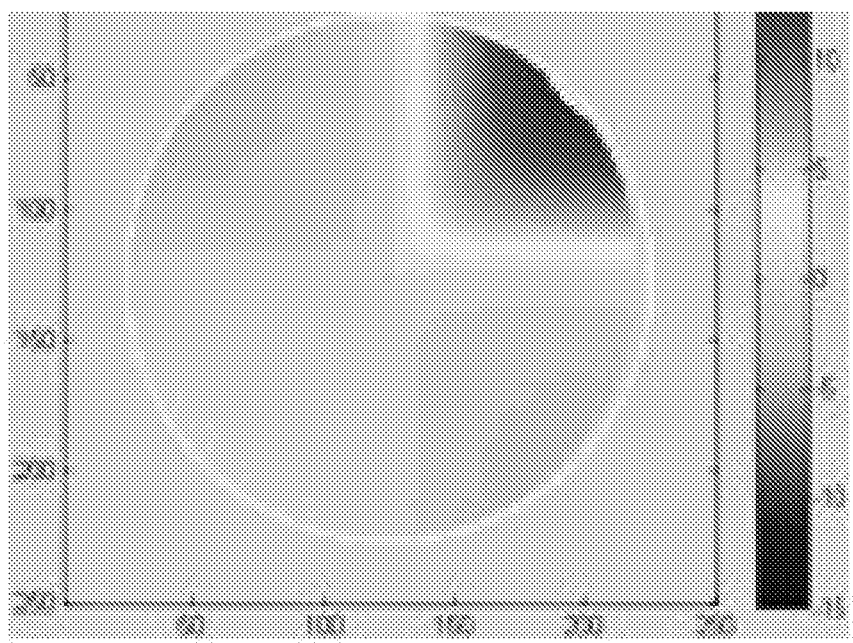

FIG. 2 schematically depicts the effect of intrinsic or material birefringence of the optical elements 190 of the illumination system 160 of the projection exposure system 100 in the plane of the mask 110 or the reticle 110. As already mentioned at the discussion of FIG. 1, the output beam 145 of the laser source 140 is essentially linearly polarized. In the example shown in FIG. 2, the beam 145 is polarized in the horizontal direction. FIG. 2 presents an exemplary illustration of the scalar birefringence component Ret45 which illustrates the projection of the vector retardation onto the 45° axis, wherein the angle is measured with respect to the x-axis. FIGS. 2a-2c clearly indicate that the retardation increases strongly toward the lens edge of the illumination system 160. Further, FIGS. 2a-2c also indicate that the retardation also strongly increases toward the pupil edge. This means that the material birefringence of the optical elements 170, 190 of the illumination system 160 has both a strong field and pupil dependence.

The retardation $\Delta$ of an optical element 170, 190 having a material birefringence is determined by the thickness d of the optical element 170, 190 and the refractive indices of its fast $n_F$ and slow axis $n_S$ according to the equation:

$$\Delta = d \cdot (n_S - n_F) = d \cdot \Delta n = d \cdot \delta \quad (2)$$

where $\delta$ is called birefringence.

The retardation $\Delta$ caused by the material birefringence of the optical elements 170, 190 results in a variation of the polarization of the laser beam 145 across the illumination field of the mask 110. As a result, the polarization exemplarily dispersed in FIG. 2 by the material birefringence of the optical components 170, 190 leads to a reduction of the intensity in preferred state (IPS). As the IPS specification is an important characteristic for the customer of projection exposure systems 100, the IPS loss has to be compensated so that the projection exposure system 100 fulfils a predetermined IPS threshold. Presently, typical IPS specifications vary between 96% and 98.5% dependent on the illumination setting.

This high IPS specification threshold results in a retardation budget of the overall projection exposure system 100 including also all external contribution in the range of approximately 10 nm. Thus, the IPS specification sets new birefringence requirements to every optical element 170, 190 of the illumination system 160 and projection system 180 of the projection exposure system 100. Furthermore, it also makes high demands on the polarization variations induced by the mask 110, the photoresist 130 and the pellicle of the mask 110 (not shown in FIG. 1). The influence of the last components which are not part of the projection exposure system 100 is not addressed in the present invention.

Figure 3:
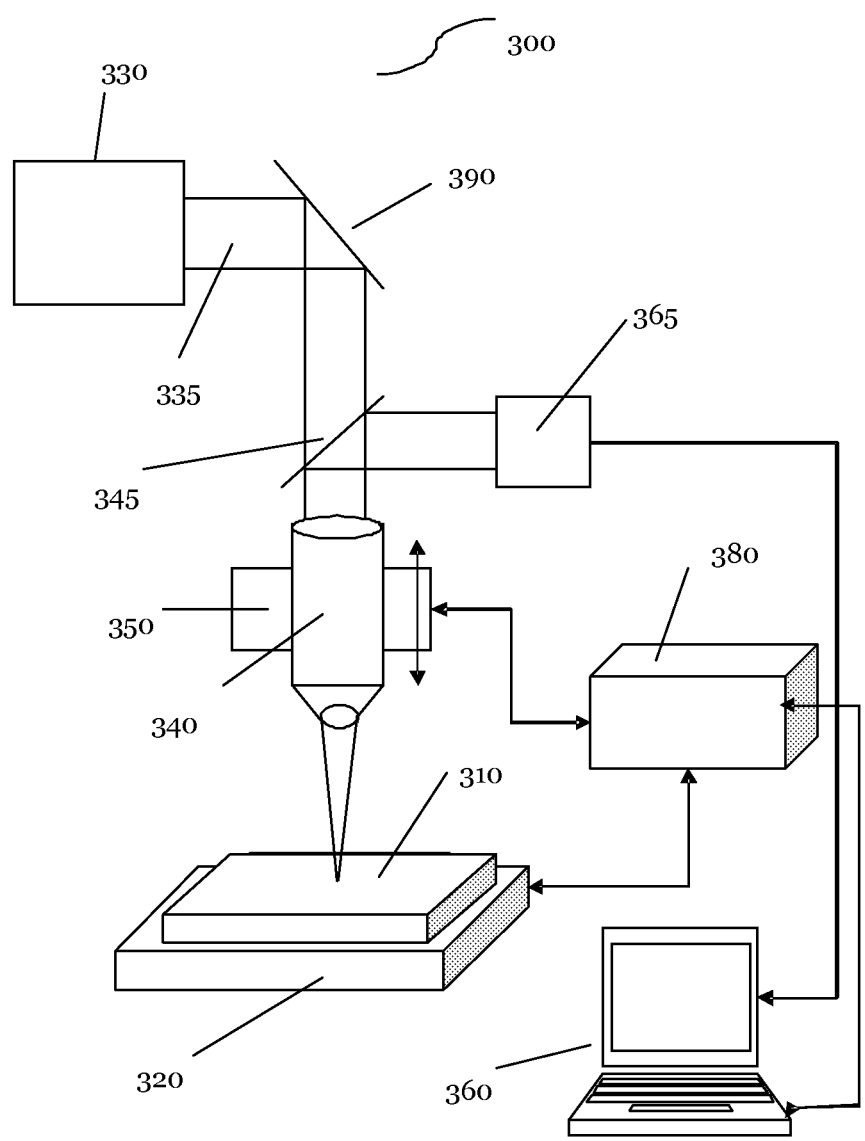

FIG. 3 depicts a schematic block diagram of an apparatus 400 which can be used to introduce an arrangement of local persistent modifications in an optical element 170, 190 to compensate the effect of the material birefringence of the optical elements 170, 190 of the projection exposure system 100. The apparatus 300 comprises a chuck 320 which may be movable in three dimensions. An optical element 310 may be fixed to the chuck 320 by using various techniques as for example clamping. The optical element 310 may be one of the optical elements 170, 190 of FIG. 1.

The apparatus 300 includes a pulse laser source 330 which produces a beam or a light beam 335 of pulses or laser pulses. The laser source 330 generates light pulses or laser pulses of a variable duration. The pulse duration may be as low as 10 fs but may also be continuously increased up to 100 ps. The pulse energy of the light pulses generated by the pulsed laser source 330 can also be adjusted across a huge range reaching from 0.01 µJ per pulse up to 10 mJ per pulse. Further, the repetition rate of the laser pulses comprises the range from 1 Hz to 100 MHz. In a preferred embodiment the light pulses may be generated by a Ti: Sapphire laser operating at a wavelength of 800 nm. However, the methods described in the following are not limited to this laser type, principally all laser types may be used having a photon energy which is smaller than the band gap to the material of the optical element 310 and which are able to generate pulses with durations in the femtosecond range. Therefore, for example Nd-YAG laser or dye laser systems may also be applied.

The apparatus 300 may also comprise more than one pulse laser sources 330 (not shown in FIG. 3).

The tables 2 and 3 (of section 3) represent an overview of laser beam parameters of a frequency-doubled Nd-YAG laser system which is used in one aspect for introducing an arrangement of local persistent modifications in an optical element 310. A single local persistent modification locally modifies a density of the optical element 310. The locally modified density of the optical element 310 is discontinuously modified within at least one small volume of the optical element 310, wherein the at least one small volume is called a pixel. Furthermore, the locally modified density of a single local persistent modification induces a strain distribution around the local persistent modification of the induced pixel. By introducing or writing many pixels in a dedicated arrangement in the material of the optical element 310 a desired strain distribution can be generated.

It is known that the induced change in the impermeability $\Delta\beta_{ij}$ linearly depends on the strain induced in the material, wherein the impermeability $\beta$ and the permittivity $\epsilon$ are linked by:

$$\varepsilon = \frac{1}{\beta}. \quad (3)$$

This dependence can be expressed with the aid of the components of the stress optic matrix:

$$\Delta\beta_{ij} = \sum_{k=1,l=1}^{3,3} q_{ijkl}\sigma_{kl} \quad (4)$$

Therefore, the strain induced in the material of the optical element 170, 190 by introducing or writing pixels in the optical element 170, 190 is directly linked to the retardation $\Delta$ of an optical beam in the material and is given by the equation:

$$\Delta = d \cdot n_0^3 \cdot \sqrt{\left(\frac{\beta_{11} - \beta_{22}}{2}\right)^2 + \beta_{12}^2} \quad (5)$$

where d is again the thickness of the optical element 170, 190, $n_0$ is the refractive index of the isotropic material of the optical element 170, 190 and $\beta_{ij}$ are the components of the impermeability matrix of the material of the optical element 170, 190. Equation 5 describes the retardation in a two-dimensional deformation model perpendicular to the thickness of the optical element.

In the following, one set of laser beam parameters characterizing a specific laser pulse is also called a writing mode, as the laser beam is focussed into the optical element 170, 190 and laser pulses are "written" into the material of the optical element 310. Each set of laser beam or laser pulse parameters or each writing mode induces a local deformation in the optical element 170, 190 which is characteristic or specific for this parameter set. In other words, each parameter set for a laser pulse or each writing mode generates its specific deformation in the material of the optical element 310.

The effect of a laser pulse on the optical element 170, 190 is in the following described in form of a parameter called mode signature (MS). In this concept, the area of the optical element 170, 190 is divided into small elementary areas, preferably small rectangles or squares. The mode signature describes the distortion or deformation of an elementary area due to the action of a laser pulse or a sum of laser pulses.

Tables 1 to 4 of the third section summarize different sets of laser beam parameters for arrangements of local persistent modifications which differently influence properties of the material of the optical element 170, 190, 310 like an induced strain distribution and/or a light scattering attenuation.

With respect to the set of laser beam parameters introduced above in table 1, it is noted that every specific range of laser beam parameters corresponds to a specific mode signature (MS) due to a specifically induced persistent modification.

The range of the set of laser beam parameters presented above in table 2 results in a large expansion compared to the induced light attenuation/scattering and is useful for a strain control.

Further, the range of the set of laser beam parameters indicated in table 3 provides a tiny expansion relative to the induced light attenuation/scattering. This process window (PW) with a small magnitude of the MS is useful for controlling the light attenuation/scattering without observable deformation of the material of the optical element 170, 190.

In addition, it is noted that the range of laser beam parameters indicated above in table 4 that corresponds to pixelless writing induces a contraction of the material of the optical element 170, 190, and hence has a negative magnitude of the MS. Pixelless writing is useful for a material deformation when the properties of the optical element does not even tolerate minor scattering of the light impinge on the optical element.

The combination of standard writing (table 2), Low Reg (table 3) and Pixelless writing (table 4) provides a complete set for controlling the induced deformation and/or light attenuation caused by the induced deformation.

The steering mirror or steering system 390 directs the pulsed laser beam 335 into the focusing objective 340. The objective 340 focuses the pulsed laser beam 335 into the optical element 310. The NA (numerical aperture) of the applied objective 340 depends on the predetermined spot size of the focal point and the position of the focal point within the material of the optical element 310. As indicated in table 1, the NA of the objective 340 may be up to 0.9 which results in a focal point spot diameter of essentially 1 μm and a maximum intensity of essentially $10^{20}$ W/cm$^2$.

The apparatus 300 also includes a controller 380 and an arithmetic unit 360 which manage the translations of the two-axis positioning stage of the sample holder 320 in the plane of the x and the y direction. The controller 380 and the arithmetic unit 360 also control the translation of the objective 340 perpendicular to the plane of the chuck 320 (z direction) via the one-axis positioning stage 350 to which the objective 340 is fixed. It should be noted that in other embodiments of the apparatus 300 the chuck 320 may be equipped with a three-axis positioning system in order to move the optical element 310 to the target location and the objective 340 may be fixed, or the chuck 320 may be fixed and the objective 340 may be moveable in three dimensions. It should be further noted that a manual positioning stages can also be used for the movement of the optical element 310 to the target location of the pulsed laser beam 335 in the x, the y and the z direction and/or the objective 340 may have manual positioning stages for a movement in three dimensions.

The arithmetic unit 360 may be a microprocessor, a general purpose processor, a special purpose processor, a CPU (central processing unit), a GPU (graphic processing unit), or the like. It may be arranged in the controller 380, or may be a separate unit such as a PC (personal computer), a workstation, a mainframe, etc. The arithmetic unit 360 may further comprise I/O (input/output) units like a keyboard, a touchpad, a mouse, a video/graphic display, a printer, etc. In addition, the arithmetic unit 360 may also comprise a volatile and/or a non-volatile memory. The arithmetic unit 360 may be realized in hardware, software, firmware, or any combination thereof. Moreover, the arithmetic unit 360 may control the laser source 330 (not indicated in FIG. 3).

Further, the apparatus 300 may also provide a viewing system including a CCD (charge-coupled device) camera 365 which receives light from an illumination source arranged to the chuck 320 via the dichroic mirror 345. The viewing system facilitates navigation of the optical element 310 with respect to the target position. Further, the viewing system may also be used to observe the formation of the pixel arrangement in the optical element 310 by the pulse laser beam 335 of the light source 330.

FIG. 4 shows a measurement of the material birefringence of one of the optical elements 170, 190. This example is in the following used to demonstrate the effect of an arrangement of local persistent modifications or pixels on the material birefringence of an optical element 170, 190. Two crossed polarization filters are used to analyse the material birefringence of the optical element 170, 190. The lines in FIG. 4a depict the orientation of the fast axis across the diameter of the optically relevant area of the optical element 170, 190 and the length of the lines indicates the local strength of the material birefringence. FIG. 4b shows the magnitude or the amount of the local retardation Δ induced by the material birefringence. It is scaled to a maximum magnitude of the retardation of 10 nm. The mean square amount of the retardation amounts to 2.6 nm.

Figure 5:
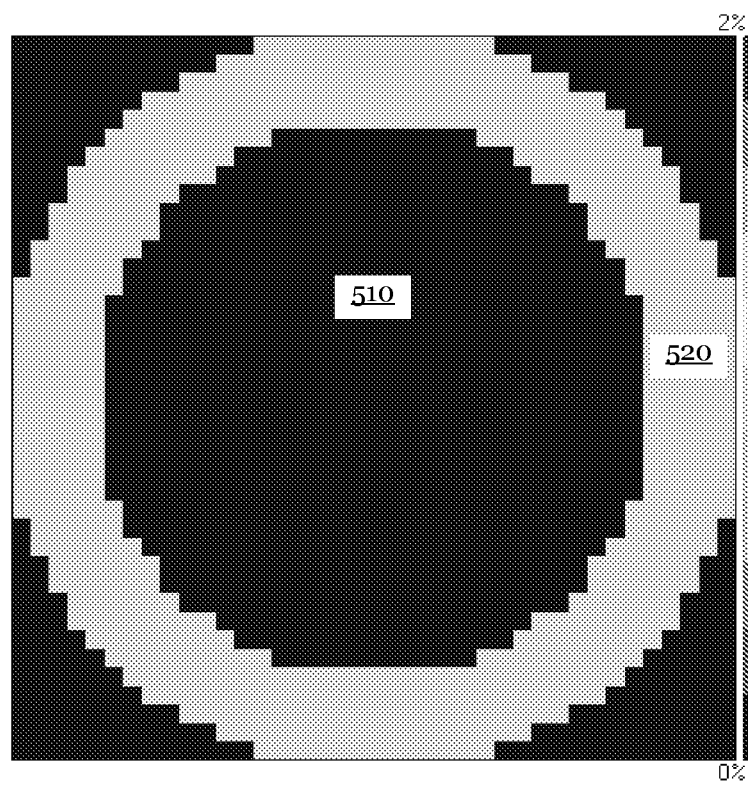
FIG. 5 illustrates the optically relevant area of the optical element of FIG. 4 (inner black area) and the area used for the introduction of an arrangement of local persistent modifications (grey area)

FIG. 5 illustrates for the optical element 170, 190 of FIG. 4 the area into which the arrangement of local persistent modifications is introduced or into which the pixels are written. The inner black area is the optically relevant area 510 through which photons of the light beam 145 passes through the optical element 170, 190. Around the optically relevant area 510, FIG. 5 indicates an area 520 of the optical element 170, 190 in grey which is not relevant for performing its optical function. In the example of FIG. 5, the area 520 used for the writing of an arrangement of pixels has a diameter of 15 mm.

As already mentioned above, the laser beam 335 of the laser system 330 is used to locally deform the optical element 170, 190 outside 520 of the optically relevant area 510. The local persistent modifications locally modify the density of the material of the optical element 170, 190. The introduction of the small local deformations by writing an arrangement of pixels in the area 520 of the optical element 170, 190 is used to compensate the material birefringence of the material of the optical element 170, 190. Therefore, it is essential to know which writing mode or which set of laser beam parameter generates which type of pixel.

As already explained, the laser pulses are in the following exclusively written in the area 520, whereas the action of the laser pulses is predominantly analyzed in the area 510.

In order to analyze the compensation of the material birefringence in the optically relevant area 510 of the optical element 170, 190 by the writing of an arrangement of pixels in the area 520, the compensation effect of the material birefringence of the optical element 170, 190 of FIG. 4 is simulated.

Figure 6A:
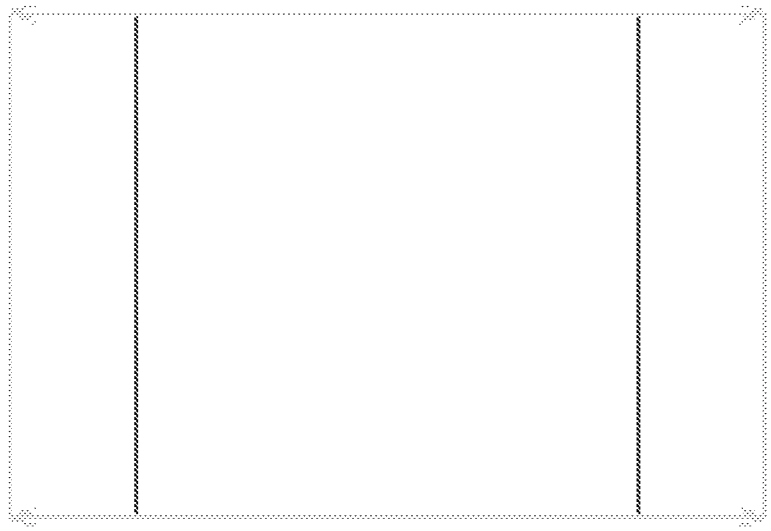
FIG. 6 (a) shows the mode signature of the first writing mode, (b) presents the simulated variation of the optical transmission outside of the optically relevant area, (c) depicts the simulated distribution of the fast axis of the induced birefringence, and (d) represents the simulated distribution of the magnitude of the induced birefringence.

For the compensation of the material birefringence of the optical element 170, 190 of FIG. 4, pixels of two different writing modes are introduced in a simulation process in the area 520 of the optical element 170, 190. FIGS. 6 and 7 present the effect of the pixel arrangements of a respective writing mode. FIG. 6a shows the mode signature of the first mode and FIG. 7a illustrates the writing signature of the second writing mode. The black square presents an elementary area in the partial area 520 prior to the application of a laser pulse. The grey rectangle presents to deformation of the elementary area under the action of a laser pulse. FIG. 6a shows a deformation of the elementary area essentially in the horizontal direction or along the x direction, whereas FIG. 7a depicts a deformation of the elementary area essentially in the vertical direction or along the y direction. Thus, the mode signature determines the type of the expansion of the area 520, and therefore also determines the efficiency of the compensation process.

Figure 6B:
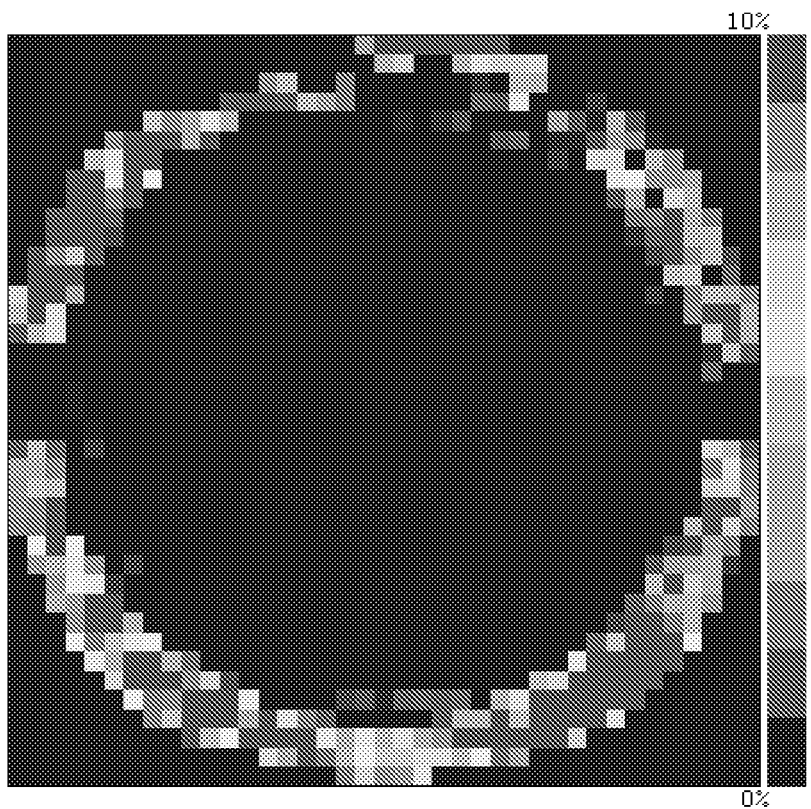
Figure 7A:
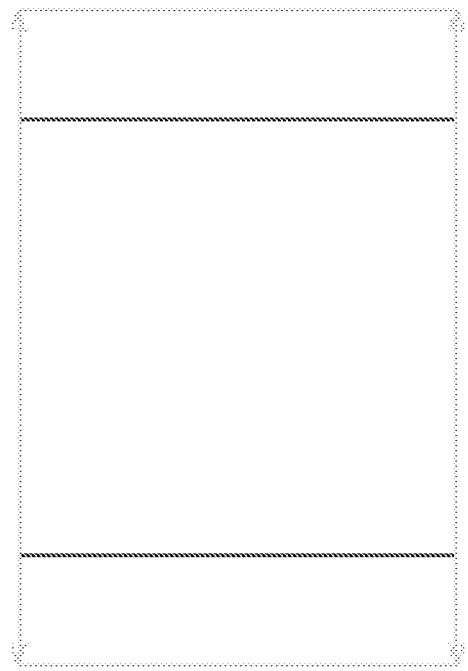
FIG. 7 (a) shows the mode signature of the second writing mode, (b) presents the simulated variation of the optical transmission outside of the optically relevant area, (c) depicts the simulated distribution of the fast axis of the induced birefringence, and (d) represents the simulated distribution of the magnitude of the induced birefringence.
Figure 7B:
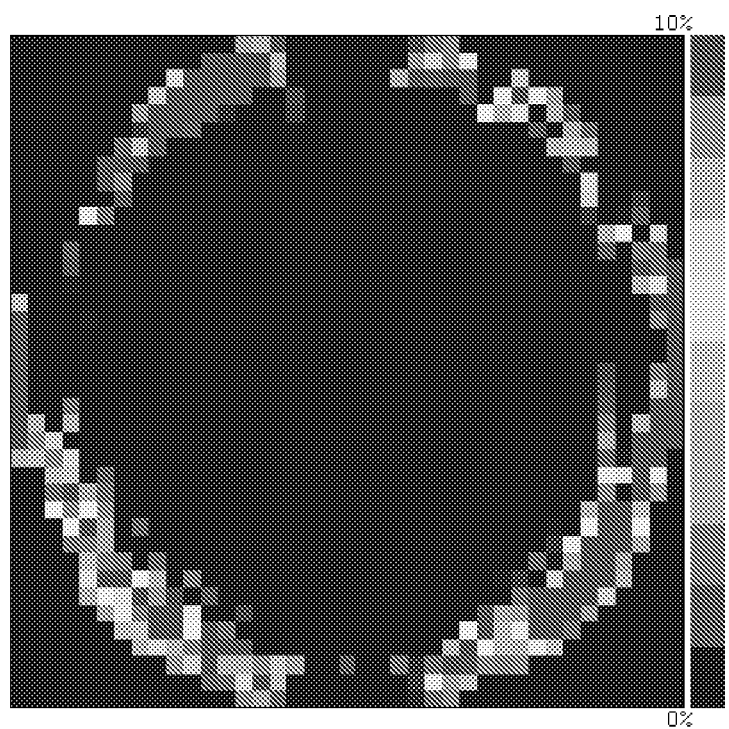

FIG. 6b and FIG. 7b indicate the computed optical pixel density in the area 520 of the optical element 170, 190 that has to be written in order to induce the required local persistent modification in the area 520. The optical pixel density is proportional to the local pixel density and is used to monitor the writing process. The applied laser pulses have a parameter set according to the standard process window (cf. table 2). The required pixel distributions or the required arrangements of local persistent modifications needed to compensate the material birefringence are determined from the measured birefringence distribution of FIG. 4. In order to obtain the required mode signature property, the applied laser beam had parameter values according to table 2 (std PW). Moreover, for the present case the laser beam was additionally shaped, i.e. in the specific case an astigmatism was introduced.

Figure 6C:
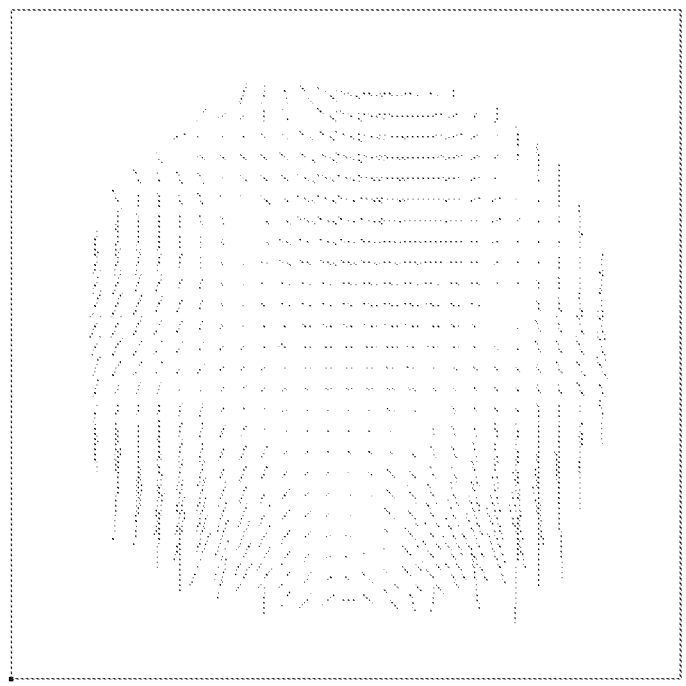
Figure 6D:
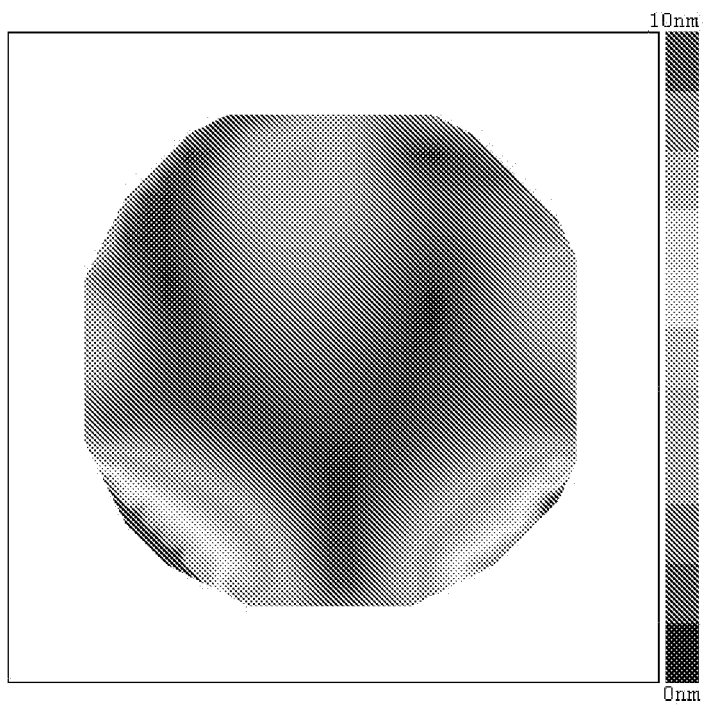
Figure 7C:
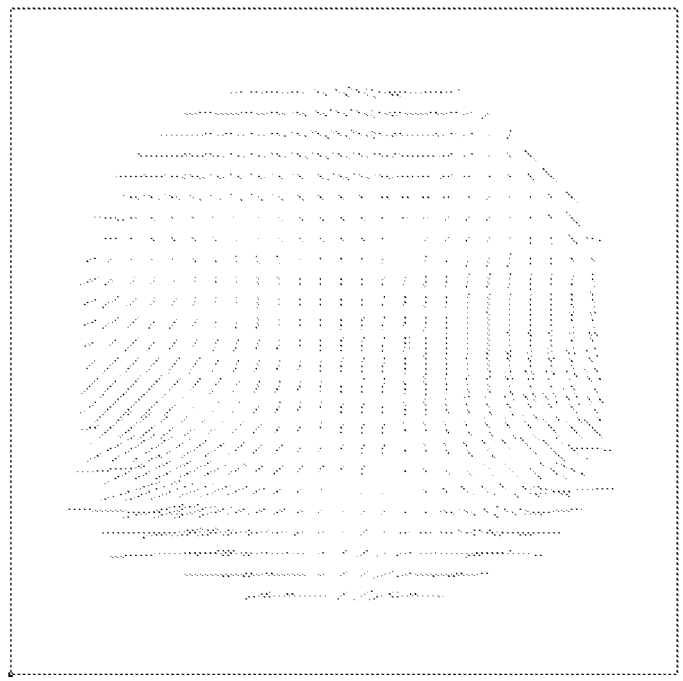
Figure 7D:
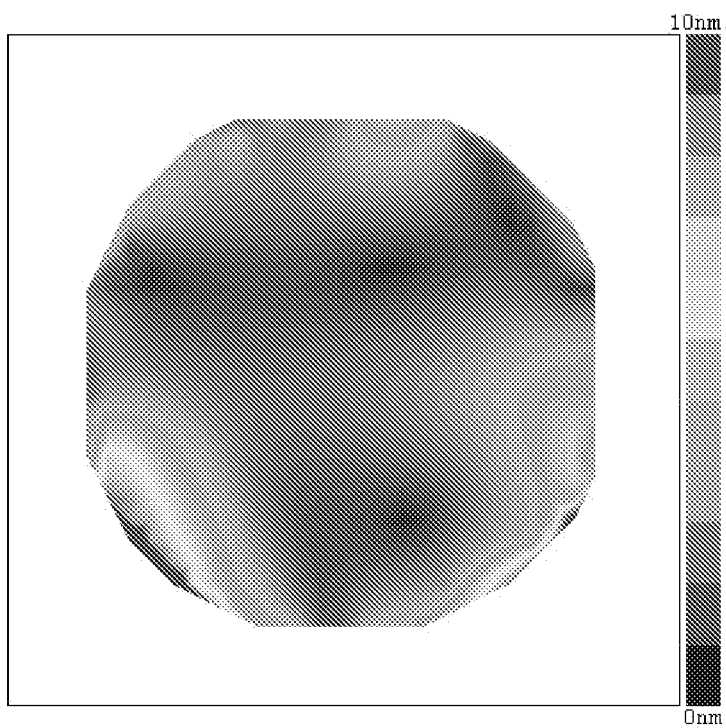

FIG. 6c and FIG. 7c show the simulated distribution of the fast axis of the birefringence originating from the far reaching strain caused by the pixel arrangements in the area 520 of FIGS. 6b and 7b. FIG. 6d and FIG. 7d depict the local distribution of the magnitude of the retardation Δ in the active area 510 induced by the strain which is caused by the arrangements of pixels in the area 520.

Figure 8A:
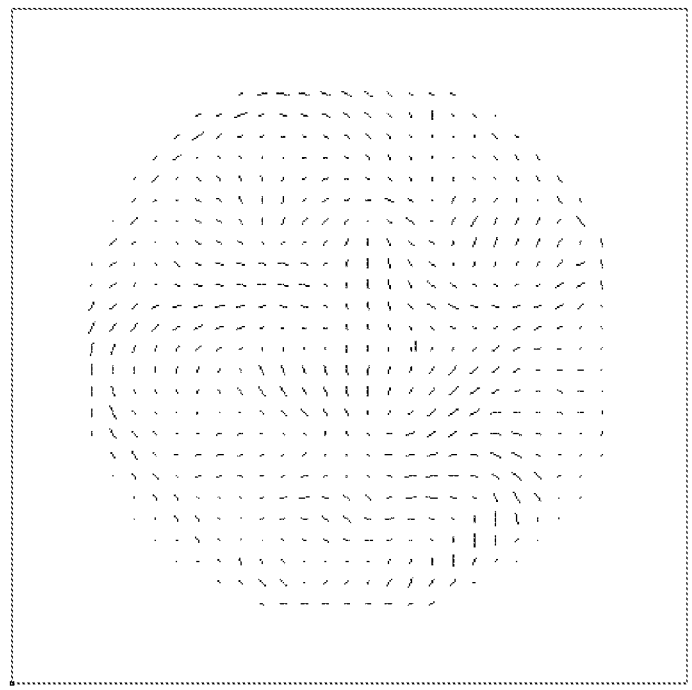
Figure 8B:
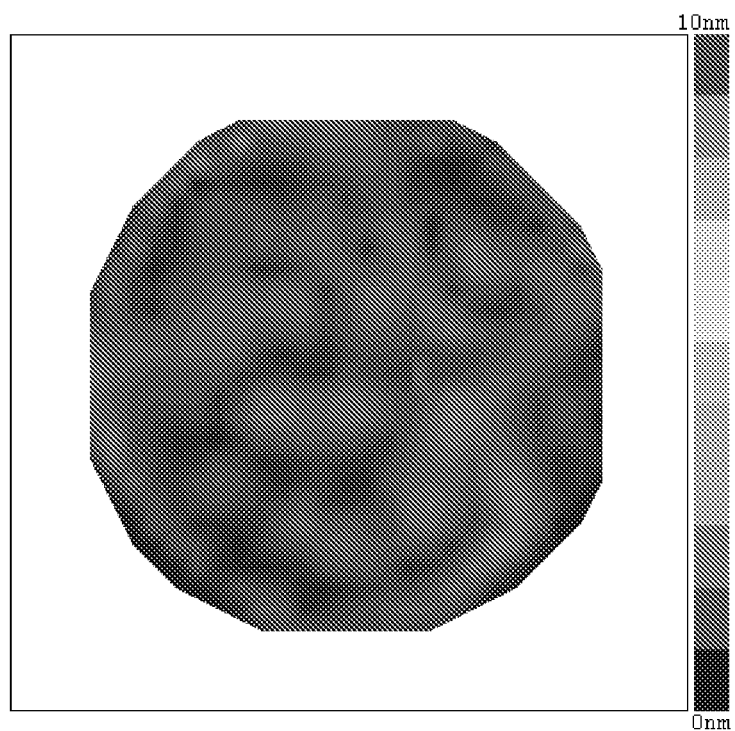

FIG. 8a presents the distribution of the fast axis across the optically relevant area 510 of the optical element 170, 190 of FIG. 4 after the arrangements of pixels of FIG. 6b and FIG. 7b of the first writing mode (FIG. 6a) and the second writing mode (FIG. 7a) are applied in a simulation to the material birefringence of the optical element 170, 190. Similarly, FIG. 8b depicts the residual distribution of the retardation amount. The mean square magnitude of FIG. 8b amounts 0.56 nm.

This results in an improvement of 78% of the retardation with respect to the measured retardation in FIG. 4b, which is 2.6 nm. The presented example shows a remarkable improvement of the material birefringence of FIG. 4. The result is partially a consequence of the considered problem which has a large birefringence at the edge portions of the optical element 170, 190, whereas the birefringence is low in the centre portion. However, the considered problem is very typical for optical elements 170, 190, as is illustrated in FIG. 2. Therefore, the described method is very well suited to compensate polarization variations across the optically relevant area 510, in particular if these polarization changes are caused by material birefringence of optical elements 170, 190.

Figure 9A:
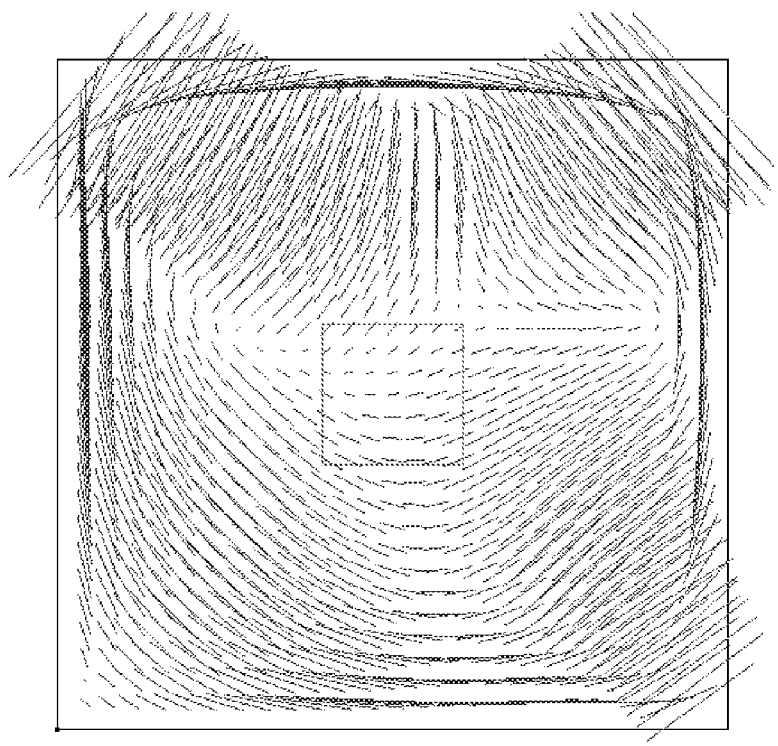
Figure 9B:
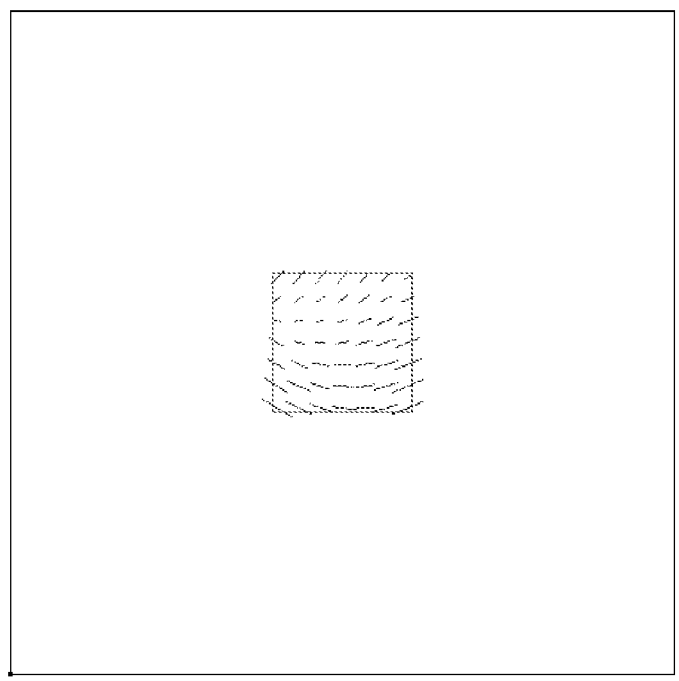
Figure 9C:
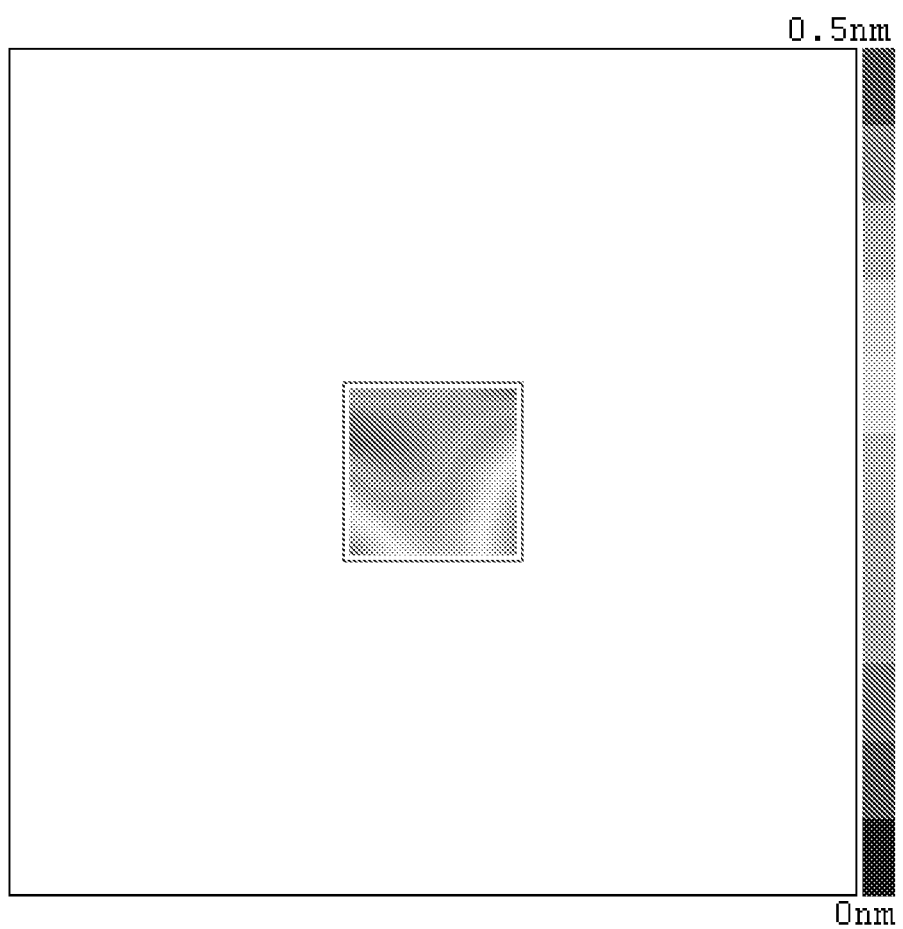

In the following, the method is tested by compensating a small intrinsic birefringence of a central portion of a quartz plate. For this purpose, FIG. 9 presents the measured birefringence profile of a quartz plate. In detail, FIG. 9a shows the distribution of the fast axis of the intrinsic or material birefringence across the quartz plate, and FIG. 9b depicts a cut-out of the centre region of the plate. FIG. 9c illustrates the amount of the retardation. Similar to FIGS. 2 and 4, in FIG. 9, the intrinsic birefringence is also rather weak in the centre region which has a mean square amount of only 0.18 nm.

Nevertheless, it is the target to compensate the birefringence problem in the plate centre. The optically relevant or optically active area is a square having a side length of 35 mm. The arrangements of pixels are written in a 10 mm broad area around the optically relevant square.

Figure 10A:
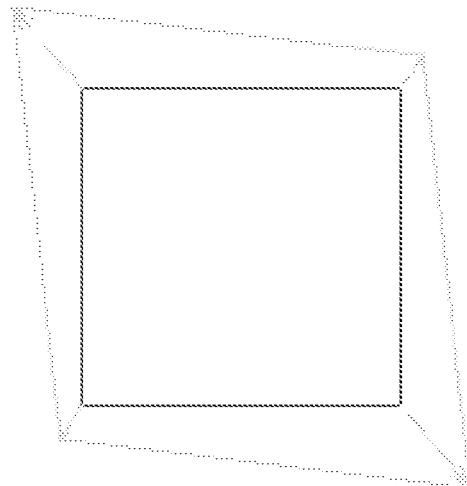
Figure 11A:
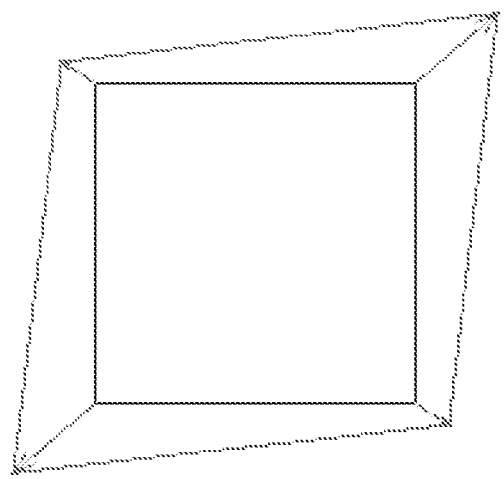

FIG. 10a shows the mode signature of the first mode and FIG. 11a illustrated the mode signature of the second writing mode. Again, the black square presents an elementary area in the area around the central square prior to the application of a laser pulse. The grey rectangle presents the deformation of the elementary area under the action of a laser pulse. FIG. 10a shows a deformation of the elementary area which is asymmetric wherein the larger deformation is parallel to an axis having an angle 0f −45° with respect to the x direction. FIG. 11a indicates that the deformation or the mode signature of the second writing mode is essentially rotated by about 90° with regard to the mode signature of FIG. 10a. Similar to the first example, the writing modes comprise sets of laser beam parameter of the standard process window.

Figure 10B:
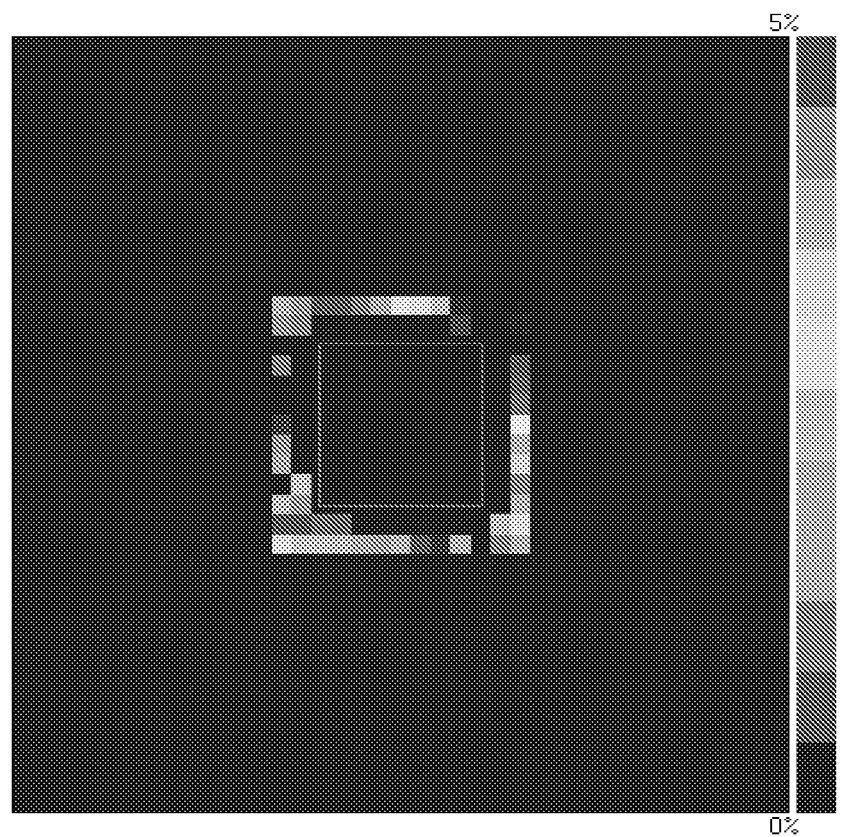
Figure 11B:
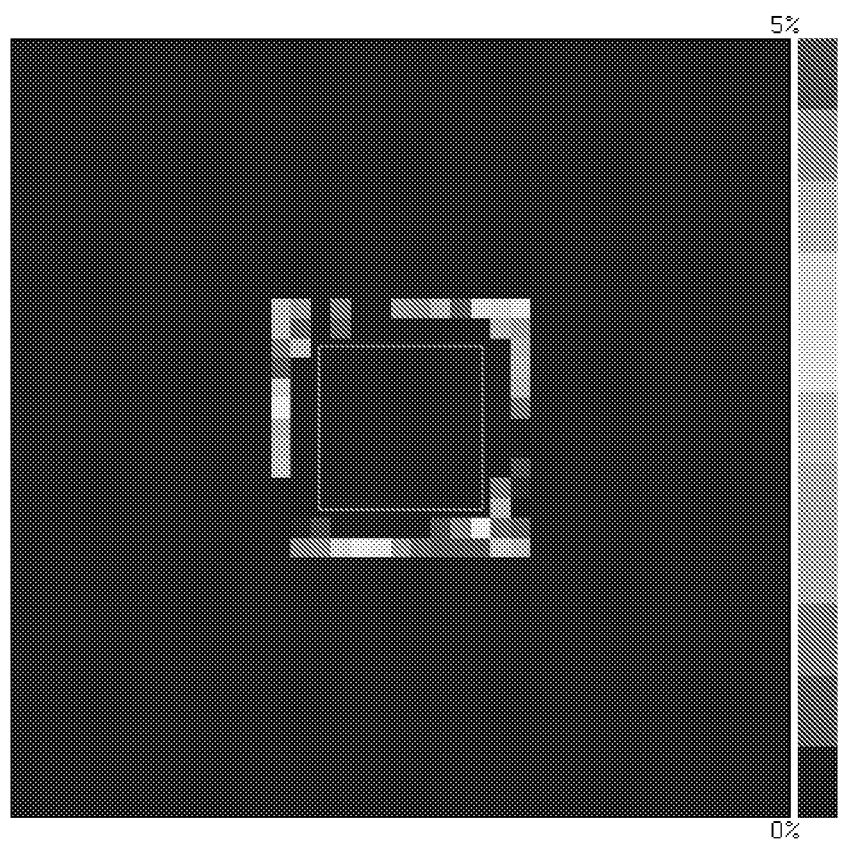

FIG. 10b and FIG. 11b indicate the calculated optical pixel density in the area around the center square that has to be written to induce the required local deformation in this area. The variation of the optical transmission is 5% at maximum, whereas in FIGS. 6b and 7b it is 10% at maximum. Similar to the example discussed above, the pixel distributions needed for the compensation of the material birefringence are determined from the measured birefringence profile depicted in FIG. 9.

Figure 10C:
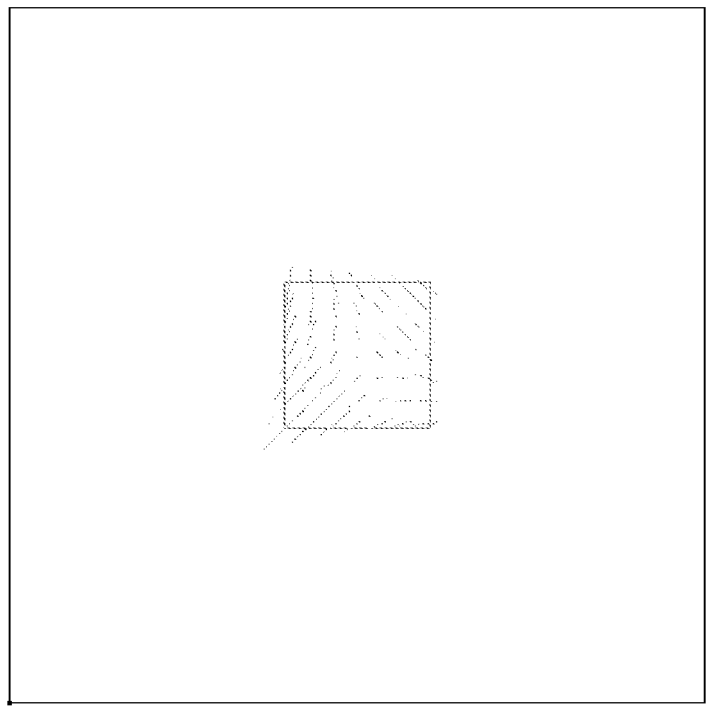
Figure 10D:
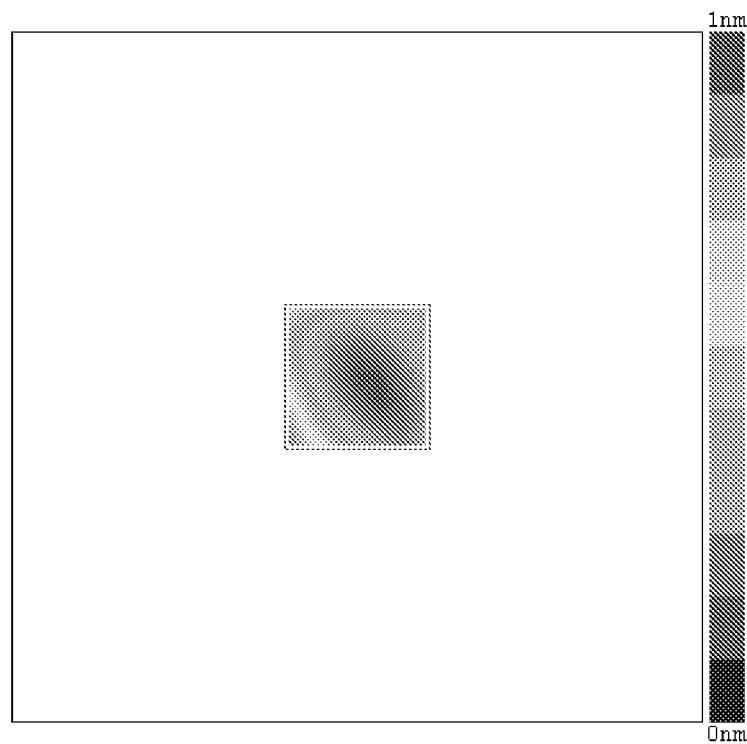
Figure 11C:
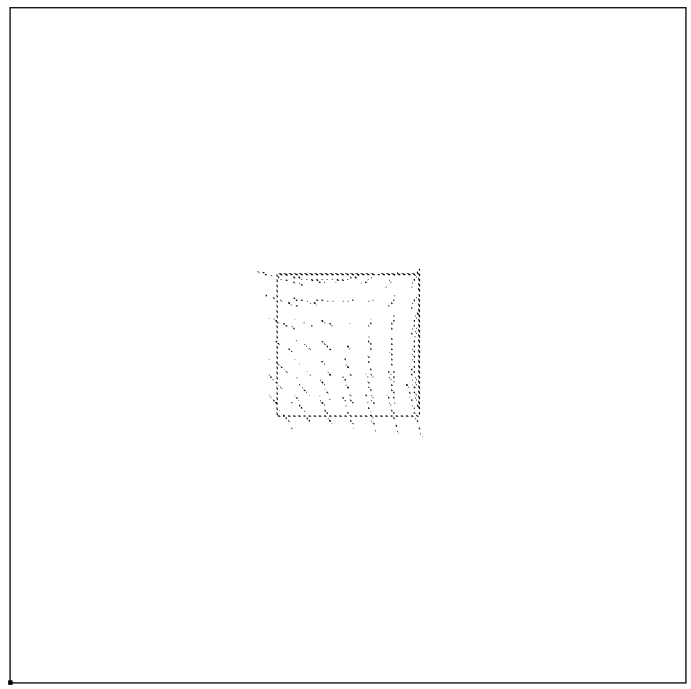
Figure 11D:
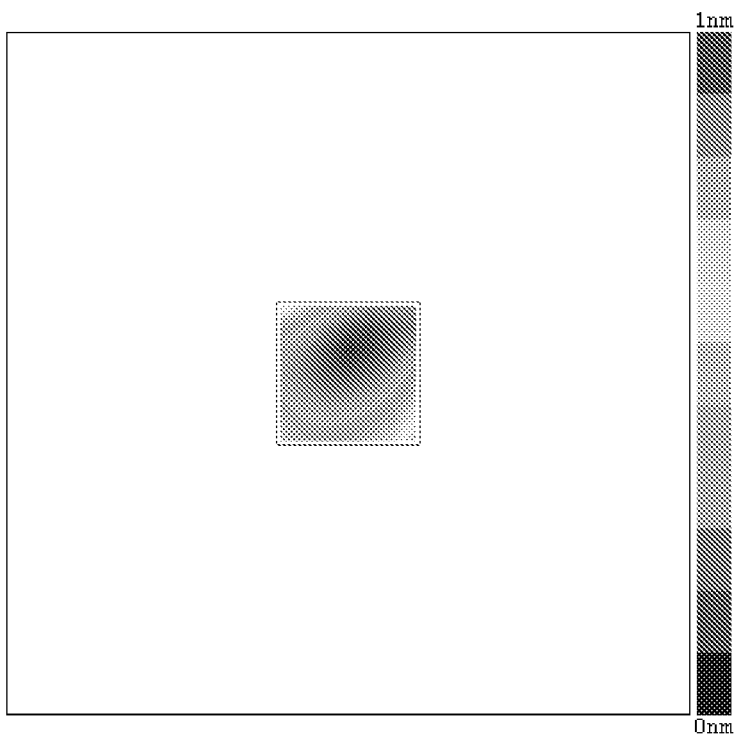

FIG. 10c and FIG. 11c show the simulated distribution of the fast axis of the birefringence originating from the far reaching strain caused by the pixel arrangements in the area around the center square of FIGS. 10b and 11b. FIG. 10d and FIG. 11d depict the local distributions of the amount of the retardation Δ in the active area (center square) induced by the strain which is caused by the pixel arrangements in a 10 mm broad ribbon around the center square.

Figure 12A:
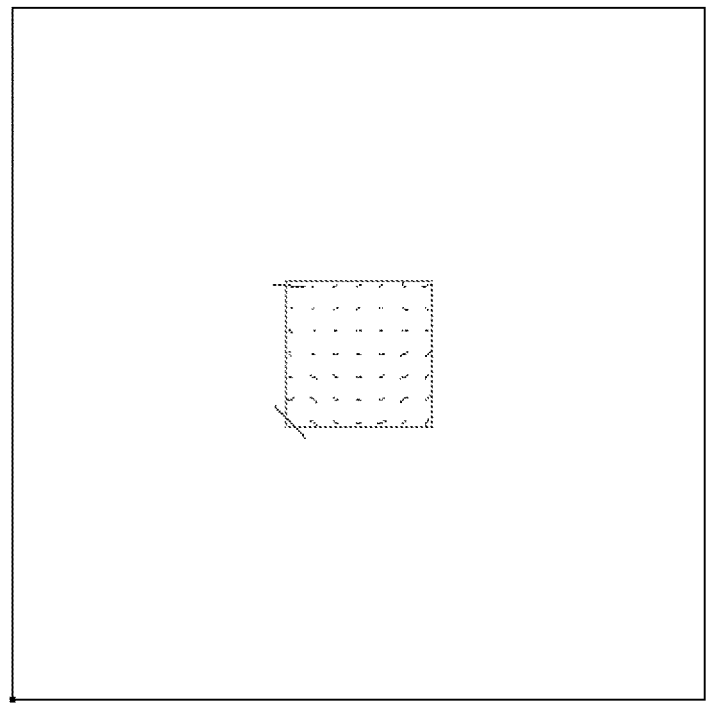
Figure 12B:
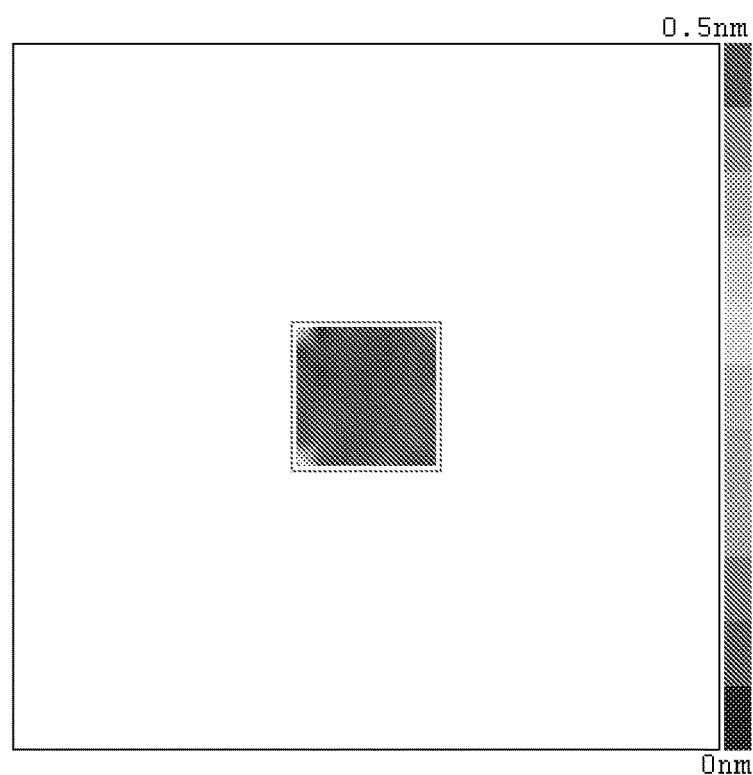

From the simulation results an improvement of 88% is expected with respect to the retardation of FIG. 9. FIG. 12a presents the measured distribution of the fast axis across the optically relevant centre square area of the quartz plate of FIG. 9 after the arrangements of pixels of FIG. 10b and FIG. 11b of the first writing mode (FIG. 10a) and the second writing mode (FIG. 11a) are written in a 10 mm broad ribbon around the centre region of the quartz plate. FIG. 12b depicts the measured residual distribution of the retardation. The mean square magnitude of the retardation of FIG. 12b is 0.06 nm.

This results in an improvement of 75% of the retardation with respect to the measured retardation of 0.18 nm in FIG. 9b. The presented example demonstrates a remarkable improvement of the material birefringence of the centre portion of the quartz plate of FIG. 9. However, the measured retardation improvement is less than the one expected from the simulated data (88%). From FIG. 12 it can be seen that the major portion of the residual birefringence is located in the corners of the optically relevant area. The major portion of the difference between the simulation forecast and the measured data results from the two-dimensional approximation of the applied deformation model. The use of a three-dimensional deformation model can bring the simulated and the measured data in better agreement. On the other hand, the discrepancy between the forecast of the present deformation model and the measured data can significantly be improved by introducing a small gap between the optically relevant area and the ribbon around the area into which pixels are written.

The discussed method is now applied to a specific optical element of a projection exposure system 100 in order to compensate polarization variations of the optical elements 170, 190 forming the overall system. In the exemplary embodiment described in the following, this is the neutral density filter 170 of the projection exposure system 100. However, it is appreciated that this is just an example, and that the compensation method can be applied to any of the optical elements 190 of the projection exposure system 100.

As can be seen from FIG. 1, the neutral density filter 170 or the grey filter 170 is arranged near the imaging plane of the illumination system 160. As already mentioned above, the exemplary grey filter 170 is used to compensate illumination nonuniformities across the light beam 145. FIG. 13 depicts a top view of the grey filter 170. Its overall area amounts approximately 150 mm×75 mm, wherein the optically relevant area 1310 is about 120 mm×28 mm. The thickness d of the grey filter 170 is 3 mm.

The area 1320 around the active filter area 1310 is not transparent to DUV photons and can therefore be used for introducing arrangements of local persistent modifications. The distribution of the retardation across the active area 1310 of the pupil of the grey filter 170 required for the compensation of the material birefringence of the optical elements 170, 190 of the projection exposure system 100 is calculated as an average across the active area 1310 of the illumination pupil. This approach avoids the analysis of the material birefringence of the optical elements 170, 190 of each individual projection exposure system 100.

The area 1310 shows a calculated linearly varying retardation in the long axis of the grey filter 170, wherein the amount of the retardation increases from the centre to the left and right edge. As indicated in FIG. 13, the fast axis has on the right portion of the grey filter 170 an orientation of 45° with respect to the x axis. In the left portion, the orientation of the fast axis is −45° again with respect to the x axis. The scale on the right side of FIG. 13 indicates that the retardation is essentially zero in the centre of the grey filter 170. At the edges, the induced retardation is approximately 10 nm/cm, which results in a retardation of the optical beam at the edges of the grey filter 170 (if the light has a horizontal or a vertical polarization) of about 3 nm.

Two writing modes are again applied for the construction of the calculated retardation distribution depicted in FIG. 13. FIG. 14a and FIG. 14b present the mode signature of the two writing modes used of the generation of the desired retardation distribution or profile of the neutral density filter 170. The writing mode of FIG. 14a induces essentially a deformation of an elementary area of the grey filter 170 in the horizontal direction, whereas the writing mode of FIG. 14b induces essentially a deformation of an elementary area in the vertical direction. Both writing modes comprise parameter sets of the laser beam from the standard process window. As already mentioned above, the optical is additionally shaped with a cylindrical lens.

It is a specific feature of the calculated retardation distribution of FIG. 13 that the amount of the required retardation is rather high as the distance between the strain source (the area into which pixels are written) and the area the induced strain compensates birefringence can be large. It is therefore not possible to achieve it with one arrangement of local persistent modifications or by writing a single layer of pixels of each writing mode in the optically not relevant area 1320. Therefore, the overall process is split in five subsequent steps. FIG. 15a shows the calculated five pixel arrangements of the first writing mode of FIG. 14a, and FIG. 15b presents the calculated five pixel arrangements of the second writing mode FIG. 14b, wherein the pixel arrangements of the two writing modes are written in a single layer of the grey filter 170. The pixel arrangements of the five steps are introduced in five different layers arranged in different depths in the grey filter 170.

After each writing step the amount of retardation achieved by the respective arrangement of local persistent modifications in the specific layer is analyzed in order to fine tune the next writing step in view of the overall target. FIG. 16 presents the development of the induced birefringence in the active area 1310 of the grey filter 170. FIG. 16a depicts the set-up of the fast axis starting from the initial state in FIG. 16a0 where no pixels are written in the area 1320 of the grey filter 170. FIG. 16b represents the development of the amount of the retardation again starting from the initial state of the grey filter 170 where no arrangement of local persistent modifications is introduced in the area 1320 of the grey filter 170.

FIG. 16 clearly demonstrates that the strain introduced by the pixel arrangements of the five writing modes are additive. This results in a large dynamic range for the generation of controlled inductive strain in the area 1320 of the grey filter 170 to compensate material birefringence of the optical components 170, 190 of the projection exposure system 100.

During the overall process the writing tool which is the laser system 330 of FIG. 3 shows some instability in the generation of the calculated mode signature as indicated in FIG. 14. It can be noticed in FIG. 16 that there is an observable deviation of the achieved results of some intermediate steps, as for example in steps 2 and 3. But due to the corrective actions performed prior to the next writing step, the final result shows a good matching with the calculated target indicated in FIG. 13.

In order to verify the effect of the birefringence distribution induced by the introduction of the arrangements of local persistent modifications located in various layers of the area 1320 of the grey filter 170, the processed grey filter 170 is installed in the illumination system 160 of the projection exposure system 100. The resulting IPS of the polarized pupil is indicated in FIG. 17.

To check the orientation of the processed grey filter 170, it is introduced in two different orientations in the beam path 170 flipped around the x axis which is the horizontal axis of the grey filter 145 in FIG. 13. FIG. 17b shows the distribution of the retardation amount of the optical beam in the imaging plane of the illumination system 160 of the projection exposure system 100 without the processed grey filter 170 being inserted in the illumination system 160. The IPS loss amounts 2.7%. FIG. 17a depicts the situation where the processed grey filter 170 is arranged in the laser beam 145 but having the wrong orientation. Therefore, the IPS loss is impaired from 2.7% to 4.1%. When using the processed grey filter 170 in the correct orientation it diminishes the IPS loss from 2.7% to 1.6%. This is a relative reduction of the IPS loss by 41%.

The improvement is based on a generic compensation of the optical elements 190 of the illumination system 160 of the projection exposure system 100. The reduction of the IPS loss can be increased when analyzing the retardation distribution of the individual illumination system 160 and then writing pixel arrangements into the area 1320 of the grey filter 170 specifically designed to the particular birefringence problem of the specific illumination system 160.

Another possibility to obtain a better compensation for a generic compensation of the birefringence of the optical element 170, 190 for the projection exposure system 100 is to use a dedicated compensation element which is arranged in another plane of the projection exposure system 100 such as for example close to the pupil plane. Such an approach significantly increases the correction degree of freedom and makes the compensation more flexible. In an ideal approach, a problem is formulated which uses the overall variation space of a process for the generation of induced birefringence in order to optimize the resulting induced birefringence according to a specification target which can typically be the highest tolerable amount of the IPS loss.

The discussed examples clearly demonstrate that an arrangement of local persistent modifications located outside the optically relevant area of the optical element is well suited to compensate polarization variations in the optical elements of an optical system.

In the following example it is demonstrated that defects of optical elements 170, 190 of optical systems can also be compensated by introducing arrangements(s) of persistent changes in the optically relevant area 510 of an optical element 170, 190. In a first mode, a laser beam 335 having a parameter set as indicated in table 4 is used for the compensation of a birefringence distribution of an optical element 170, 190. By writing persistent changes with a parameter set of the laser beam according to table 4 only a minor strain is introduce in the material of the optical element 170, 190. It is ignored in this particular example described in the following. The morphological change of the material of the optical element 170, 190 caused by pixelless writing results in a polarization dependent retardation. The effect of the introduced persistent change arrangement(s) can be controlled by the density of the persistent changes written in the respective arrangement of persistent changes and by the angle of the laser beam polarization with respect to the x-axis. Here the term pixel is not used because a single pulse induces a hardly observable modification. The desired effect is reached by multiple pulses having a spatial pitch which is less than the diameter of the focused laser beam. To emphasize this aspect of the laser beam writing, the pulse density is here specified instead of the pixel density.

As indicated in FIG. 18, it is assumed for the following example that a polarization angle of 0° of the laser beam 335 and a pulse density within an arrangement of persistent changes of $10^5$ pixels/mm$^2$ result in retardation of 1 nm with a fast axis having an angle of 60°. In this example, the angle difference of 60° between fast axis and laser beam polarization is used in order to show that the angle difference might depend on other system parameters. It should be noted that it is possible to induce or write any required retardation profile into an optical element 170, 190 of an optical system. However, it is the purpose of this example to demonstrate that the existing degrees of freedom can be used to accomplish other objectives, as for example to simultaneously compensate intensity variations of the optical beam across the optically relevant area of the optical element 170, 190.

FIG. 19 presents an example of a measured birefringence distribution of an optical element 170, 190 arranged in the imaging plane of the photolithographic projection exposure system 100 depicted in FIG. 1. FIG. 19a represents the distribution of the orientation of the fast axis and FIG. 19b shows the distribution of the absolute value or the distribution of the magnitude of the retardation of the measured birefringence problem. The mean square magnitude of FIG. 19b is 2.6 nm.

Figure 20A:
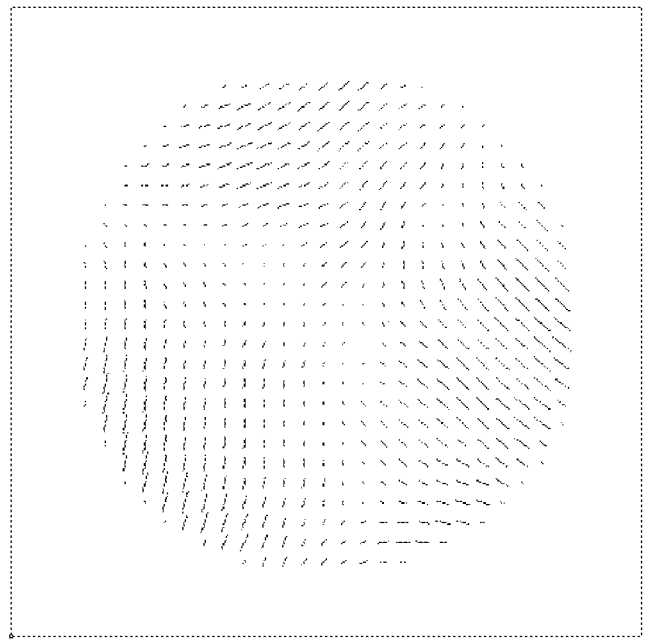
Figure 20B:
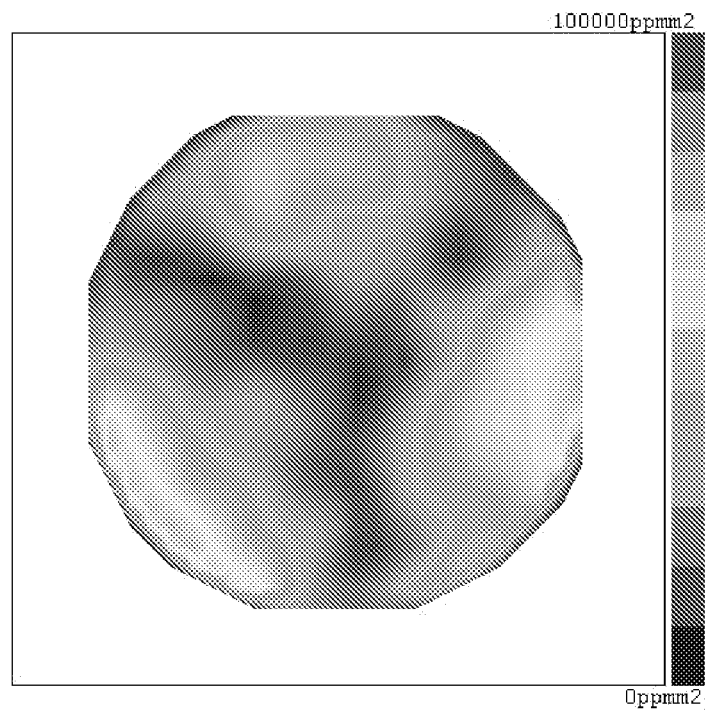

FIG. 20a represents the distribution of the polarization angle and FIG. 20b indicates the writing density which will compensate the birefringence problem of FIG. 20 to a large extent. However, the laser beam 335 having the laser beam parameter of table 3 will destroy the phase front of the optical beam passing through the optical element 170, 190 which has the arrangement of persistent changes of FIG. 20. A laser beam 335 having the parameter of table 3 will change the refractive index of the material of the optical element 170, 190.

Therefore, the approach presented in the following is used for the compensation of the birefringence distribution problem of FIG. 19. The persistent change arrangement of FIG. 20 is separated in two arrangements of persistent changes which are introduced in two different layers of the optical element 170, 190. The two layers have a different distance to an optical surface of the optical element 170, 190.

Figure 21A:
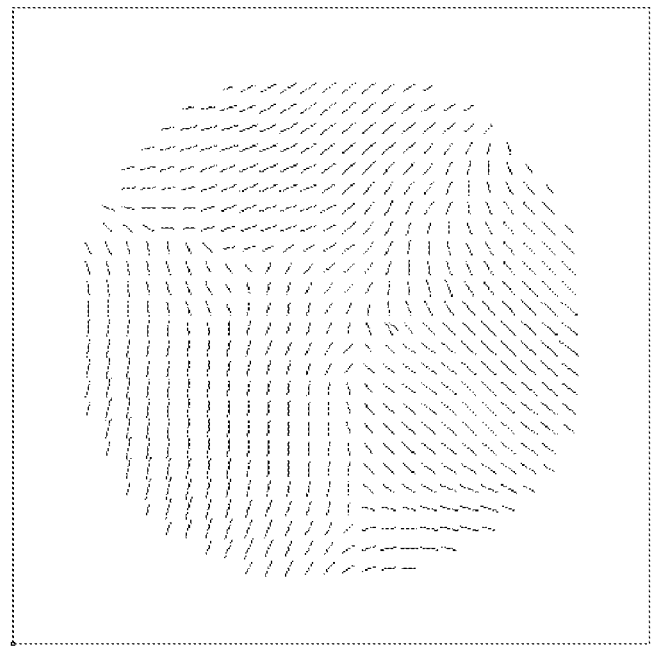
Figure 21B:
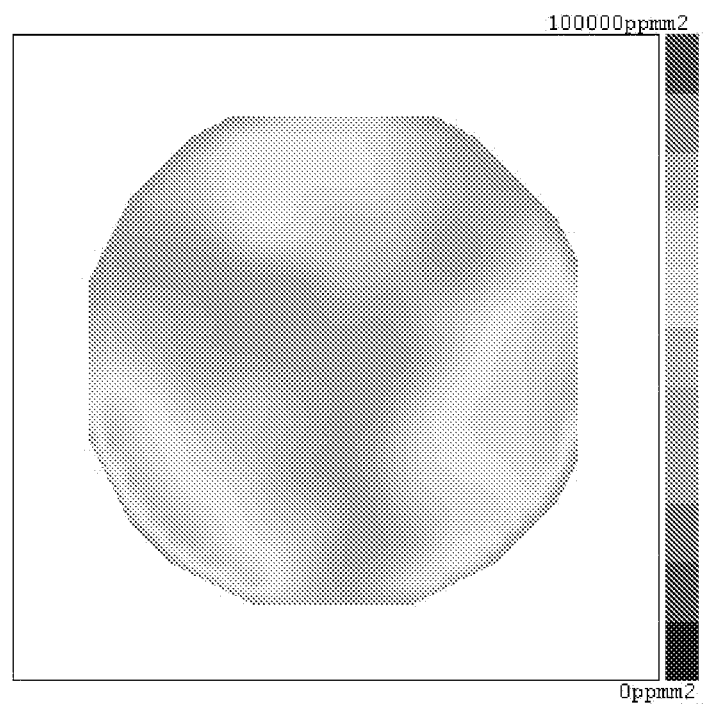
Figure 21C:
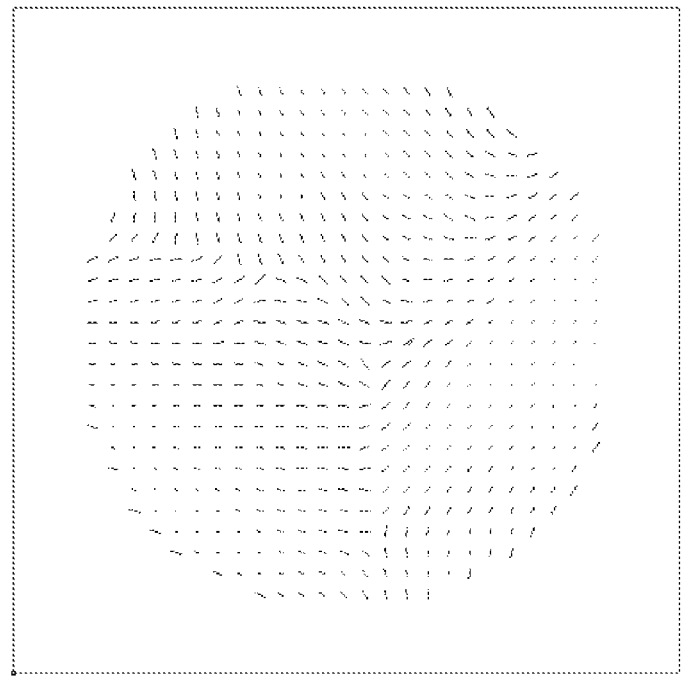
Figure 21D:
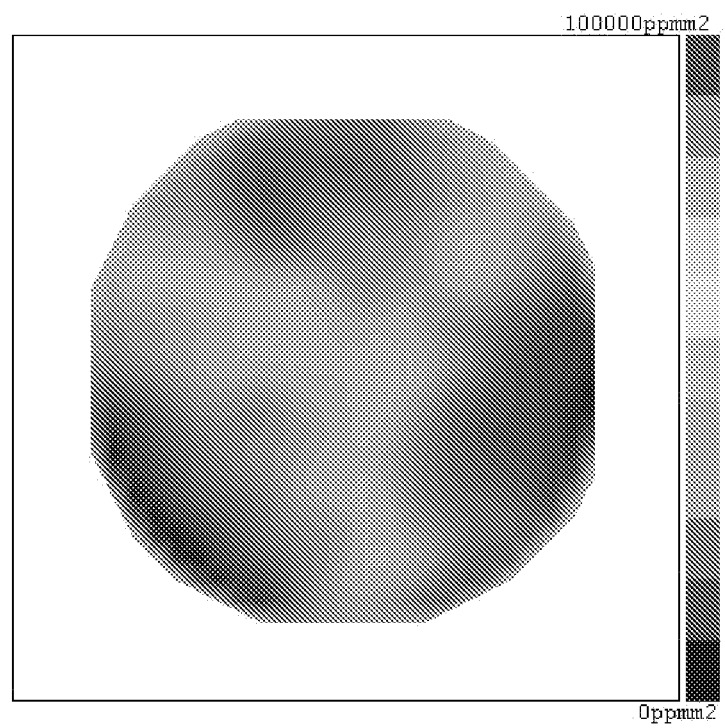

FIGS. 21a and 21c represent the polarization distributions of the laser beam 335 used in the two layers, and FIGS. 21b and 21d depict the distribution of the writing densities of the arrangements of persistent changes for the first and the second layer. The total writing density is kept constant in every point of the optically relevant area 510 of the optical element 170, 190. Therefore, the phase change is also kept constant at the generation of the required retardation difference.

A similar solution can also be obtained with a set of fixed polarization angles for the laser beam 335 with the constraint that the accumulated writing density is constant and that the resulting sum of the induced retardation distributions of the two layers results in the distribution of the fast axis orientation and the distribution of the magnitude required for the compensation of the birefringence distribution of FIG. 19.

By introducing two or more arrangements of persistent changes in the optically relevant area of the optical element 170, 190 any required birefringence distributions or profiles can be generated. It is an advantage of the application of several arrangements of persistent changes in several layers of the optical element 170, 190 that only a moderate amount of the pulse writing density is necessary. Furthermore, it is possible to combine the birefringence compensation with the compensation of phase defects. The introduction of one or several arrangements of persistent modifications in the optically relevant area 510 of the optical element 170, 190 may induce some concomitant absorption in the UV band.

In the previous example, the pixel arrangements are written exclusively in the optically relevant area 510 of the optical element 170, 190. In the following example pixel arrangements are introduced in the optically relevant area 510 as well as in the area 520 outside the optically relevant area 510 of the optical element 170, 190. In the following example, the term pixel is again used since a kind of writing of pixels is performed which induces a deformation in the material of the optical element 170, 190. The mode signature (MS) specifies the amount of deformation induced per unit of the laser beam writing. For the purpose of this example, a synthetic problem is considered which presents an intrinsic birefringence distribution of a quartz plate with the addition of some artificial white noise.

FIG. 22 presents the selected synthetic problem, wherein FIG. 22a shows the distribution of the orientation of the fast axis and FIG. 22b indicates the respective distribution of the retardation magnitude. The mean square magnitude amounts to 0.5 nm. It is typically found in optical elements 170, 190 that the birefringence defect increases from the center to the edges of the optical element 170, 190. The problem defined in FIG. 22 takes this experimental behavior into account.

FIG. 23 illustrates the mode signature used for the only pixel writing mode used for the compensation of the problem of FIG. 22. As can be seen from FIG. 23, the induced pixel expands an elementary area of the material of the optical element 170, 190 within 510 and outside 520 of the optically relevant are 510 of the optical element 170, 190.

FIG. 24 shows the calculated writing map for the compensation of the birefringence problem indicated in FIG. 22. FIG. 24 reveals that the highest writing density is outside 510 of the optically relevant area 520, which is indicated by the inner square in FIG. 24. This is a consequence of the symmetry of the birefringence problem defined in FIG. 22.

FIG. 25a presents the simulated distribution of the orientation of the fast axis and FIG. 25b depicts the simulated distribution of the magnitude of the birefringence induced in the areas 510, 520 of the optical element 170, 190 by a pixel arrangement having the mode signature indicated in FIG. 23.

FIG. 26 shows the remaining birefringence problem of FIG. 22 after the calculated pixel writing map has been applied to the birefringence problem of FIG. 22. The mean square magnitude of FIG. 26b amounts to 0.38 nm, compared to 0.50 nm of FIG. 22b. This results in a decrease of the retardation amount or of the retardation magnitude of 23%.

The limited birefringence compensation of FIG. 26 is mainly due to the limitation of the pixel writing process to just one mode signature. In case that the pixel arrangement which are written or are introduced in the area 510, 520 of the optical element 170, 190 comprises two mode signatures or two writing modes, the birefringence compensation of FIG. 22 can be increased to 87%.

In the following, it is demonstrated that the application of three different mode signatures or writing modes provides the basis for a full solution of the birefringence problem presented in FIG. 22.

FIG. 27 presents in the partial Figures a, c and e the mode signatures of three writing modes which are rotated by 120° relative to each other. FIGS. 27b, 27d, and 27f show the writing maps of the respective modes signatures. The writing density of the writing maps of FIG. 27 is more homogeneously distributed across the area of the optical element 170, 190. Moreover, the application of several mode signatures of the laser beam 335 concentrates more of the writing density in the optically relevant area 510 of the optical element 170, 190 compared to the compensation of just using one mode signature, which is indicated in FIG. 24.

FIG. 28 shows the simulated distribution of the fast axis orientations induced by the writing maps of FIGS. 27b, 27d and 27f. Finally, FIG. 29 presents the residual birefringence distribution of FIG. 22 after the application of the three writing maps of FIG. 27. As can be seen from FIG. 27, the three mode signatures indicated in FIGS. 27a, 27c, and FIG. 27e compensate the birefringence problem of FIG. 22 almost perfectly.

In the discussed example, it is assumed that the introduction of a pixel arrangement in the optically relevant area 510 of the optical element 170, 190 does not induce a phase change of an optical beam passing through the optical element 170, 190. In case that the conservation of the light intensity is critical, it is possible to extend the approach discussed in the previous example to the application of four or more mode signatures for the introduction of the pixel arrangement(s).

The presented examples clearly indicate that a pixel arrangement can be introduced in the optically relevant area of the optical element 170, 190 for the defect compensation without impairing other optical properties of the optical element 170, 190.

In the following, a further example of the application of the inventive principle is discussed. In this example the inventive principle is used in order to compensate a strain induced birefringence of an optical element 190 of the illumination system 160. The illumination system 160 may in the following example be a reticle masking (REMA) objective of the photolithographic projection exposure system 100 of FIG. 1. The optical element 190 comprises a lens and/or a mirror, as for example mirror 164 of FIG. 1.

The correction of a strain induced birefringence in the optical element 190 occurs by applying a strain to the optical element 190 which essentially or at least partially compensates the strain induced birefringence of the optical element 190. As already indicated above, the strain can for example be applied to the optical element 190 by using one or several actuators. Alternatively, and/or additionally a strain distribution can also be applied to the optical element 190 by introducing one or several arrangements of local persistent modifications into the optical element 190.

Similar to the previously discussed example, in the following, arrangements of local persistent modifications are exclusively introduced or written in the area 520 of the optical element which is optically not relevant. For example, this may be the lens mount area, which is typically an area of about 10 mm around the optically relevant area 510 of FIG. 5.

FIG. 30 schematically presents two birefringence configurations of a lens 3000. The lens 3000 comprises a circular optically relevant area 3010 surrounded by an optically not relevant area 3020. The left part of FIG. 30 shows a tangential distribution of a strain induced birefringence in the optically relevant area 3010, wherein the black dashes 3030 indicate the orientation of the fast axis of the strain induced birefringence of the material of the lens 3000.

In order to compensate the strain induced birefringence distribution 3030 in the optical relevant area 3010 of the lens 3000, arrangements of local persistent modifications 3040 are introduced or written in the optically not relevant area 3020 of the lens 3000. The fast axis of the strain induced birefringence indicated by the dashes 3040 is parallel to the black dashes 3040. The local strain induced by writing of the arrangements of local persistent modifications 3040 in the area 3020 of the lens 3000 extends in the optically relevant area 3010 and at least partially compensates the strain induced birefringence 3030 within the optically relevant area 3010 of the lens 3000.

The right lens 3050 schematically shows a tangential radial strain induced birefringence distribution 3030, 3060, 3070 within its optically relevant area 3010. The direction of the black dashes 3030, 3060 and 3070 indicates again the direction of the fast axis of the strain induced birefringence distribution. The black dashes 3040 and 3070 schematically present the fast axis of the arrangements of local persistent modifications which are written in the optically not relevant area 3020 of the lens 3050 to compensate the tangential radial strain induced birefringence distribution 3030, 3060 and 3070 in the optically relevant area 3020.

Furthermore, the tangential radial distribution 3040 and 3070 of the right part of FIG. 30 has also to be used for the compensation of the tangential strain induced birefringence distribution 3030 of the lens 3000 of the left part of FIG. 30 when the lens 3000 is arranged on the opposite site of a mirror, as for example the mirror 164 of the illumination system 160 of FIG. 1. A mirror 164 transforms the tangential radial strain induced birefringence distribution 3030, 3060, 3070 written by the pixel arrangements 3040 and 3070 in the tangential strain induced birefringence distribution 3030. Thus, the tangential radial strain distribution 3040 and 3070 of the lens 3050 compensates of tangential strain induced birefringence distribution 3030 of the lens 3000 when the lenses 3000 and 3050 are arranged on opposite sides of a mirror.

FIG. 31 schematically illustrates the strain induced birefringence compensation process. The lens 3100 comprises again an optically relevant area 3110 and an optically not relevant boundary area 3120. The lens 3100 in FIG. 31 has a radial strain induced birefringence distribution 3130 in the optically relevant area 3110 as is indicated in the left part of FIG. 31. The middle part depicts a partial compensation of the strain induced birefringence distribution 3130 by introducing respective arrangements of local persistent modifications or pixel arrangements 3140 in the optically not relevant area 3120 of the lens 3100. As already mentioned, the strain induced by the pixel arrangements 3140 in the optically not relevant area 3120 reaches for the optically relevant area 3110 of the lens 3100 and compensates the strain induced birefringence distribution 3130 in the optically relevant area 3110.

The right part of FIG. 31 shows the situation after the finalization of the birefringence compensation process. The boundary area 3120 of the lens 3100 contains pixel arrangements 3140 which strain compensates the strain induced birefringence distribution 3130 in the optically relevant area 3110 of the lens 3100 to a large extent. This means the remaining retardation across the optically relevant area 31110 is smaller than 2 nm, or even smaller than 1 nm.

The strain induced birefringence compensation principle discussed above can be applied to each optical element 190 of the illumination system 160. This means that the illumination system 160 comprises exclusively birefringence compensated optical elements 190. Since the optical properties of optical elements 190 which comprise a strain induced birefringence are typically controlled before the optical elements 190 are inserted in the illumination system 160, it can be useful to compensate the strain induced birefringence of each optical element 190 in situ during the determination of the strain induced birefringence.

The strain induced birefringence is often measured with a polarimeter or by using an automation polarimeter. In order to facilitate the determination and the compensation of strain induced birefringence a polarimeter and the laser system applied for the pixel writing process can be integrated in a combined device. This allows a virtually simultaneous determination and compensation of a strain induced birefringence distribution. The integration of a polarimeter and of a light source or of a laser source used for the pixel writing process in a combined device allows an easy set-up of a control loop for the defect compensation process of the individual optical elements 190.

Moreover, the compensation of a strain induced birefringence distribution can be performed at the fabrication site of the illumination system 160, or it can already also be performed at the fabrication site of the optical element 190.

Alternatively, and analog to the compensation of other optical defects of the optical elements 170, 190 of the illumination system 160, the effort of the strain induced birefringence compensation may be reduced by just compensating one or only a few of the optical elements 170, 190 in such a manner that the birefringence distribution of the overall illumination system 160 is minimized.

Moreover, in an alternative approach, the optical elements 170, 190 of the illumination system 160 are not modified. Instead of, one or several optical elements may be inserted in the beam path within the illumination system 160. This or these additional optical elements act as compensation elements for the strain induced birefringence of the optical elements 170, 190 of the illumination system 160. The additional optical element(s) may comprise fused quartz plates. Furthermore, the additional optical element does not have imaging properties.

For the insertion of the additional optical element(s), the illumination system 160 may comprise one or several mounting positions for one or several additional optical elements (not shown in FIG. 1). The insertion of one or several additional optical elements in the beam path of the illumination system 160 does not noticeably disturb the beam path in the illumination system 160 as it occurs at predetermined position(s) of the beam path in the illumination system 160.

In general, an illumination system 160 approximately has a retardation of +10 nm to +12 nm which has to be compensated in order not to impair the IPS numerical value. It is beneficial in this context that the intensity in preferred state (IPS) is a quadratic function of the retardation. This means that halving the retardation reduces the IPS loss to a quarter of its not compensated numerical value. Thus, a complete compensation of the retardation is often not necessary. It is typically sufficient to bring the retardation of the illumination system 160 in the range of 1 nm or 2 nm.

FIG. 32 schematically presents a lens 3200 of a reticle masking (REMA) objective. The REMA objective is an exemplary construction of the illumination system 160 of projection exposure system 100 of FIG. 1. The lens 3200 is arranged close to the field plane 175 of the illumination system 160, which is the plane at which the photolithographic mask 110 is located. The black cycle 3210 indicates the overall aperture of the lens 3200. The elliptical area 3220 indicates the clear aperture 3220 of the lens 3200.

Pixel arrangements have been written in the lens 3200 to compensate a strain induced birefringence distribution of the REMA objective. The black dashes 3230 show the directions or orientations of the fast axes of the strain induced birefringence distribution induced by the pixel writing process in the lens 3200 of FIG. 32. In FIG. 32, the fast axes 3230 show a radial orientation. Alternatively, the fast axes could have a tangential orientation (not shown in FIG. 32).

The sub apertures 3240, 3250 and 3260 depict the variation of the retardation of the birefringence distribution induced by the arrangements of local persistent modifications across the clear aperture 3220 of the lens 3200. The sub aperture 3250 in the center of the lens 3200 shows essentially no retardation variation. The sub aperture 3240 indicates a variation of the retardation from about −6 nm to about 6 nm. A red color area in one of the sub apertures 3240, 3250 and 3260 represents a retardation of the scalar birefringence component Ret45 of approximately +6 nm, a green color area depicts a retardation of about 0 nm, and a blue color area shows a retardation of around −6 nm. As expected from the orientations of the fast axes 3230 the sub aperture 3260 shows the retardation variation of the sub aperture 3240 but reflected at the major axis of the clear aperture ellipse 3220.

The strain induced birefringence distribution of the lens 3200 of FIG. 32 represented by the orientation of the fast axes 3230 allows compensating of a field dependent Zernike Z3 pupil behavior.

The lens 3300 of FIG. 33 is arranged between the pupil plane 168 and to the field plane 175 of the illumination system. Similar to the lens 3200 of FIG. 32, the light grey area 3310 surrounded by a black cycle indicates the optically relevant area of the lens 3300. The white elliptical area 3320 inside the optically relevant area 3310 is the clear aperture 3320 of the lens 3300 of the REMA objective.

Arrangements of local persistent modifications are introduced in the lens 3300 with fast axes indicated by the dashes 3330 and 3340 which have a ±45° orientation with respect to the x- or the horizontal direction. Similar to FIG. 32, the fast axes 3330 and 3340 show a radial orientation. In an alternative example, the fast axes 3330 and 3340 could have a tangential orientation (not indicated in FIG. 33).

Analog to FIG. 32, the sub apertures 3340, 3350, 3360, 3370 and 3380 of FIG. 33 indicate the variation of the retardation of the strain induced birefringence distribution induced by the pixel writing process across the clear aperture 3320 of the lens 3300. Again, the sub aperture 3350 in the center of the lens 3300 shows essentially no retardation variation across the area of the sub aperture 3250. The retardation varies within the sub aperture 3240 from approximately −6 nm to about 0 nm. On the other hand, the retardation changes from almost +6 nm to about 0 nm across the area of the sub aperture 3360. Further, the retardation variation across the sub aperture 3370 is similar to the variation across the sub aperture 3340, and the retardation changes of the sub apertures 3380 and 3360 are also similar.

The birefringence distribution induced by the arrangements of local persistent modifications and indicated by the orientations of the fast axes 3330 and 3340 enables the compensation of a field dependent Zernike Z3 pupil behavior. It has to be stressed that the lens 330o is located in the beam path of the illumination system 160 between the pupil plane 168 and field plane 175. However, lens 3300 also generates a Zernike Z1 contribution which depends on the pupil 168, but which is independent from the field. The Zernike Z1 contribution depends of the ratio of the clear aperture 3320 and the overall aperture or the optically relevant area 3310 of the lens 3300.

The Zernike Z1 contribution may be desired or may be unwanted. When this contribution is detrimental it may be compensated by writing a respective pixel arrangement in the neutral density filter 170 of the illumination system 160 which is arranged very closely to the field plan 175.

FIG. 34 comprises a lens 3400 which has two defect compensation areas 3415 and 3425, which are arranged perpendicular to each other. Similar to the lenses 3200 of FIG. 32 and 3300 of FIG. 33, the lens 3400 has an optically relevant area 3410 surrounded by an optically not relevant area (not indicated in FIG. 34). Within the optically relevant area 3410 of the lens 3400 there is a clear aperture 3420 having a form which is similar to the clear aperture 3220 of FIG. 32. Different to FIG. 32, two different pixel arrangements are written in the lens 3400 to compensate two strain induced birefringence distribution of the illumination system 160 having a different strength of the retardation distribution across the clear aperture 3420. The black dashes 3430 show the directions or orientations of the fast axes of the birefringence induced by a first pixel writing process in the lens 3400 of FIG. 34. The blue dashes 3435 indicate the orientation of the fast axes of the second arrangements of local persistent modifications introduced in the lens 3400. The orientation of the fast axis 3435 of the second pixel arrangements are rotated by 90° with respect to the clear aperture 3420.

The sub apertures 3440, 3450 and 3660 depict the variation of the retardation of the birefringence induced by first the arrangements of local persistent modifications across the clear aperture 3420 of the lens 3400. The sub aperture 3450 in the center of the lens 3400 again shows essentially no retardation variation across the area of the sub aperture 3450. The sub aperture 3440 indicates a variation of the retardation from about −6 nm to about 6 nm as can be taken from the right vertical axis. On the other hand, the retardation across the area of the sub-aperture 3460 changes also from −6 nm to +6 nm. Similar to FIG. 32, the retardation changes in the sub apertures 3440 and 3460 have a different sign.

As already mentioned, the defect compensation area 3425 of the lens 3400 has the same orientations of the fast axes 3430 as the defect compensation area 3415. However, the retardation within the areas of the sub apertures 3470 and 3480 varies only from −3 nm to +3 nm as is indicated by the horizontal dashed axis. The defect compensation areas 3415 and 3425 compensate a similar birefringence distribution of the illumination system 160; however, the amount of defect compensation of the defect compensation area 3425 is only half that of the defect compensation are 3415. By rotation the lens 3400 by 90° around its optical axis the compensation defect area 3415 or the defect compensation area 3425 can be aligned with the clear aperture 3420 of the illumination system 160.

In the defect compensation areas 3415 and 3425 of FIG. 34 an essentially identical strain distribution is introduced in the lens 3400, only the strength or the amount of the introduced strain is different resulting in a different retardation distribution. It is however also possible to introduce a different strain distribution in the second defect compensation area 3425 of the lens 3400. The amount or the strength of the retardation compensation may also be different in the first defect compensation area 3415 and the second defect compensation area 3425. Furthermore, the optically relevant area 3420 of the lens 3400 may be separated in more than two defect compensation areas depending on the area ratio of the clear aperture 3420 and of the optically relevant area 3410 of the lens 3400.

It is here again mentioned that the pixels for the various defect compensation areas 3415 and 3425 are exclusively written in the optically not relevant area of the lens 3400 which is not shown in FIG. 34. As already explained above, it is however also possible to introduce pixel arrangements in the optically relevant area 3410 of the lens 3400 which generate a predetermined strain induced birefringence distribution and which do not induce a variation of the optical transmission across the optically relevant area 3410 of the lens 3400.

The rotation of the lens 3400 may dynamically occur during the operation of the photolithographic projection exposure system 100. This enables to compensate a drift of one or several optical elements 190 of the illumination system 160. Furthermore, a dynamic rotation of the lens 3400 and/or of other optical elements 190 of the illumination system enables in combination with a determination of the compensation effect to set-up a control loop for the defect compensation of an optical system.

In FIGS. 30 to 34 the application of the inventive principle is discussed in the context of the lenses 3000, 3100, 3200, 3300 and 3400. However, it is appreciated that the explained principle may also be applied to one or several additional optical elements which are inserted at the respective position(s) in an illumination system 160.

As already mentioned at the discussion of FIG. 33, the compensation effect of a strain induced birefringence distribution depends on the position of the optical element 190 in the illumination system or the REMA objective 160 of the photolithographic projection exposure system 100.

FIG. 35 schematically presents an additional optical element 3530 in form of a plane parallel quartz plate. The quartz plate 3530 comprises the birefringence distribution 3230 of the lens 3200 of FIG. 32. The quartz plate is shifted from a field plane 3510, which is denoted in FIG. 1 by the dotted line 175, to the pupil plane 3520 (schematically indicated in FIG. 1 by the dotted line 168) within the illumination system 160.

FIG. 36a presents the variation of the sub apertures 3610, 3620, 3630, 3640 and 3650 generated by the quartz plate 3530 in the clear aperture 3230 of FIG. 32 when the quartz plate 3530 is arranged at the position a in FIG. 35. Position a is close to the field plane 3510. The retardation varies within a sub aperture 3610, 3620, 3630 and 3640 from +6 nm (red color) to −6 nm (blue color). The center sub aperture 3650 shows essentially no variation of the retardation across the sub aperture area 3650 and the amount of retardation is essentially zero (green color). Similar to the lens 3200 of FIG. 32, the quartz plate 3530 compensates at a position a in the beam path a Zernike Z6 contribution of a retardation distribution which is rotationally symmetric. Furthermore, the Zernike Z6 contribution is constant across the field plane 3510.

At the position e, i.e. close to the pupil plane 3520, the quartz plate 3530 compensates a field independent Zernike Z3 contribution. FIG. 36c schematically presents the sub apertures 3610 to 3650 for the position e of the quartz plate 3530. As can be seen from FIG. 36c, the retardation changes systematically within each sub aperture 3610 to 3650. On the other hand, the retardation varies essentially uniformly across each of the sub apertures 3610 to 3650.

In a position which is essentially in the middle between the field plane 3510 and the pupil plane 3520, i.e. at position c in FIG. 35, the compensation of both the Zernike Z6 contribution of FIG. 36a and the Zernike Z3 contribution of FIG. 36c is approximately balanced. FIG. 36c schematically depicts this situation.

The Zernike Z6 contribution decreases steadily when shifting the quartz plate 3530 from position a to position f in FIG. 35, whereas the contribution of the Zernike Z3 contribution steadily increases at the same time. It is stressed that in particular the arrangements at a mean position in FIG. 35, i.e. positions b, c, and d, but in particular position c, compensates a superposition of the above mentioned contributions which occurs in existent illumination systems 160.

The exemplary defect compensation discussed in the context of FIGS. 35 and 36 is not limited to the application of a single quartz plate 3530. Rather, two or more quartz plates can also be used. Furthermore, the defect compensation by shifting the quartz plate 3530 between the field plane 3510 and the pupil plane 3520 may also be combined with a rotation of the one or the several quartz plates 3530 as explained at the discussion of FIGS. 30 to 34.

FIG. 37 schematically presents light paths in a thin lens 3700 (a) and in a thick lens 3750 (b). For a thin lens its thickness can effectively be neglected, whereas it cannot be neglected for a thick lens. The thin lens 3700 has an optically relevant area 3710 and a boundary area 3720 which is optically not relevant. Similar, the thick lens 3750 has also an optically relevant area 3760 and a boundary area 3770. FIG. 37a shows a ray 3730 starting from the optical axis 3725 and traversing the lens 3700 as ray 3735 and leaving the lens 3700 as a ray 3740 which is parallel to the optical axis 3725.

In the boundary area 3720 an arrangement of local persistent modifications 3745 is introduced. As can be seen from FIG. 37a strain induced by the pixel arrangement 3745 is in a plane which is essentially perpendicular to the optical axis 3725 as the ray 3735 has a very small angle with respect to the optical axis 3725.

FIG. 37b depicts also a light path 3780 beginning at the optical axis 3775 which traverses the lens 3750 as ray 3785 and which leave the lens 3750 as a ray 3790 which is parallel to the optical axis 3775. Similar to FIG. 37a, a pixel arrangement 3795 is also written in the center of the optically not relevant area 3770 of the lens 3750. However, in contrast to FIG. 37a, the direction of the strain introduced by the pixel arrangement 3795 is not perpendicular to the ray 3785 within the lens 3750 but has a component with is parallel to the direction of the ray 3785.

FIG. 38 presents two different arrangements of local persistent modifications which avoid a component of the strain induced birefringence of the pixel arrangements which is parallel to the ray direction 3785 within the thick lens 3750. In the lens 3800 of FIG. 38a, pixel arrangements 3830 are written in the boundary areas 3820 which have a constant depth to the surface of the lens 3800 in the boundary area 3820 but follow the surface contour of the lens 3800.

The pixel arrangements 3830 generate a strain distribution in the optically relevant area 3810 of the lens 3800 which is approximately perpendicular to the ray 3785, so that the strain distribution does essentially not have a component in the direction of the ray 3785 of FIG. 37.

FIG. 38b shows an alternative approach of solving the problem of lateral strain induced birefringence parallel to the ray direction 3785. In FIG. 38b two different arrangements of local persistent modifications 3860 and 3870 are introduced in the optically not relevant area 3820 of the lens 3850 which essentially avoid a strain component parallel the ray direction 3785 of FIG. 37.

Furthermore, various other pixel arrangements can be applied which effectively prevent a strain component which is parallel to the ray direction 3785 in a thick optical element. Moreover, the approaches of FIG. 38a and FIG. 38b can also be combined.

Finally, it is again stressed that in a further alternative approach pixel arrangements can also be introduced in the optically relevant areas 3810 and 3860 of the lenses 3800 and 3850 of FIGS. 38*a* and 38*b* which generate a predetermined strain distribution without producing a variation of the optical transmission in the optically relevant areas 3810 and 3860 of the thick lenses 3800 and 3850.

The invention claimed is:

1. A method, comprising:
   at least partially compensating for a defect of an optical system by introducing an arrangement of modifications in an optical element of the optical system,
   wherein:
   the optical element does not have pattern elements on one of its optical surfaces;
   the arrangement of modifications is configured to exist in the optical element after:
   a) the optical element has been used in the optical system; and
   b) after a), the optical system is not in use; and
   the method further comprises compensating each optical element of the optical system.

2. The method of claim 1, wherein the defect comprises a member selected from the group consisting of a local polarization variation of the optical element and a local intensity variation of the optical element.

3. The method of claim 1, further comprising one of the following:
   introducing the arrangement of modifications in an optically relevant area of the optical element;
   introducing the arrangement of modifications outside an optically relevant area of the optical element; or
   introducing the arrangement of modifications in an optically relevant area of the optical element and introducing an additional arrangement of modifications outside the optically relevant area of the optical element, the additional arrangement of modifications being configured to exist in the optical element after a) and b).

4. The method of claim 1, further comprising selecting the arrangement of modifications so that a strain induced by the arrangement of modifications at least partially compensates a local polarization variation of the optical system.

5. The method of claim 1, wherein the defect of the optical system comprises a member selected from the group consisting of a defect of the optical element and a defect of a further optical element of the optical system.

6. The method of claim 1, further comprising determining the arrangement of modifications from a measurement selected from the group consisting of an intensity variation measurement of the optical element, a polarization measurement of the optical element, a birefringence measurement the optical element, an intensity variation measurement of the optical system, a polarization measurement of the optical system, and a birefringence measurement of the optical system.

7. The method of claim 1, wherein the optical system comprises a plurality of optical elements, and the method further comprises selecting the optical element to compensate the defect to a maximum extent.

8. The method of claim 1, wherein the optical system is an illumination system of a photolithographic projection exposure system, and one of the following holds:
   the optical element is arranged next to a field plane of the illumination system; or
   the optical element is arranged between a field plane of the illumination system and a pupil plane of the illumination system.

9. The method of claim 1, further comprising inserting an additional optical element into the optical system, wherein the additional optical element comprises an arrangement of modifications positioned to compensate the defect to a maximum extent, and the arrangement of modifications in the additional optical element is configured to exist in the optical element after a) and b).

10. The method of claim 1, wherein the system further comprises a retardation compensation component, and the method further comprises introducing an arrangement of modifications in the retardation compensation component.

11. The method of claim 1, wherein the optical element comprises a neutral density filter used for a nonuniformity compensation of the optical system.

12. The method of claim 1, wherein the arrangement of modifications is not rotationally symmetric in a plane perpendicular to a beam propagation direction within the optical system.

13. The method of claim 1, wherein:
   the optical element comprises a first defection compensation area comprising a first arrangement of modifications in a plane perpendicular to a beam propagation direction of the optical element;
   the optical element comprises a second defection compensation area comprising a second arrangement of modifications in the plane perpendicular to a beam propagation direction of the optical element;
   the second arrangement of modifications is different from the first arrangement of modifications;
   the first arrangement of modifications being configured to exist in the optical element after a) and b; and
   the second arrangement of modifications being configured to exist in the optical element after a) and b.

14. The method of claim 1, wherein the optical system comprises an additional optical element, and the method further comprises shifting the additional optical element along a beam propagation direction in the optical system to compensate the defect to a maximum extent.

15. The method of claim 1, further comprising introducing the arrangement of modifications in a constant depth relative to a surface contour of the optical element.

16. The method of claim 1, further comprising introducing at least two different arrangements of modifications in various depths of the optical element, wherein each of the at least two arrangements of modifications in the additional optical element is configured to exist in the optical element after a) and b.

17. A method, comprising:
   at least partially compensating for a defect of an optical system by introducing an arrangement of modifications in an optical element of the optical system,
   wherein:
   the optical element does not have pattern elements on one of its optical surfaces;
   the arrangement of modifications is configured to exist in the optical element after:
   a) the optical element has been used in the optical system; and
   b) after a), the optical system is not in use;
   the method further comprises inserting an additional optical element into the optical system;
   the additional optical element comprises an arrangement of modifications positioned to compensate the defect to a maximum extent; and
   the arrangement of modifications in the additional optical element is configured to exist in the optical element after a) and b).

18. A method, comprising:

at least partially compensating for a defect of an optical system by introducing an arrangement of modifications in an optical element of the optical system, wherein:

the optical element does not have pattern elements on one of its optical surfaces;

the arrangement of modifications is configured to exist in the optical element after:

a) the optical element has been used in the optical system; and b) after a), the optical system is not in use;

the system further comprises a retardation compensation component; and the method further comprises introducing an arrangement of modifications in the retardation compensation component.

19. A method, comprising:

at least partially compensating for a defect of an optical system by introducing an arrangement of modifications in an optical element of the optical system, wherein:

the optical element does not have pattern elements on one of its optical surfaces;

the arrangement of modifications is configured to exist in the optical element after:

a) the optical element has been used in the optical system; and b) after a), the optical system is not in use; and the optical element comprises a neutral density filter used for a nonuniformity compensation of the optical system.

20. A method, comprising:

at least partially compensating for a defect of an optical system by introducing an arrangement of modifications in an optical element of the optical system, wherein:

the optical element does not have pattern elements on one of its optical surfaces;

the arrangement of modifications is configured to exist in the optical element after:

a) the optical element has been used in the optical system; and b) after a), the optical system is not in use;

the optical system comprises an additional optical element; and the method further comprises shifting the additional optical element along a beam propagation direction in the optical system to compensate the defect to a maximum extent.

* * * * *

UNITED STATES PATENT AND TRADEMARK OFFICE
CERTIFICATE OF CORRECTION

PATENT NO. : 9,798,249 B2
APPLICATION NO. : 14/457712
DATED : October 24, 2017
INVENTOR(S) : Vladimir Dmitriev et al.

It is certified that error appears in the above-identified patent and that said Letters Patent is hereby corrected as shown below:

In the Specification

Column 1, Line 28, delete "micostructured" and insert -- microstructured --.

Column 1, Lines 44-45, delete "semiconducing" and insert -- semiconducting --.

Column 8, Table 4, Line 44, delete "0.o1-0.10" and insert -- 0.01-0.10 --.

Column 8, Line 66, delete "and or" and insert -- and/or --.

Column 13, Line 63, after "modifications", insert -- . --.

Column 16, Line 21, delete "13." and insert -- 13; --.

Column 24, Line 45, delete "0f" and insert -- of --.

Column 32, Line 46, delete "+10" and insert -- ±10 --.

Column 32, Line 46, delete "+12" and insert -- ±12 --.

Column 33, Line 57, delete "330o" and insert -- 3300 --.

Column 35, Line 66, delete "fin" and insert -- f in --.

Signed and Sealed this
Sixth Day of March, 2018

Andrei Iancu
*Director of the United States Patent and Trademark Office*